United States Patent
Satake et al.

(10) Patent No.: US 9,252,819 B2
(45) Date of Patent: Feb. 2, 2016

(54) HIGH FREQUENCY CIRCUIT, HIGH FREQUENCY CIRCUIT COMPONENT, AND COMMUNICATION APPARATUS

(75) Inventors: Hirotaka Satake, Tottori (JP); Keisuke Fukamachi, Tottori (JP); Shigeru Kemmochi, Tottori (JP); Yuta Sugiyama, Tottori (JP)

(73) Assignee: HITACHI METALS, LTD., Tokyo (JP)

( * ) Notice: Subject to any disclaimer, the term of this patent is extended or adjusted under 35 U.S.C. 154(b) by 694 days.

(21) Appl. No.: 13/510,850

(22) PCT Filed: Nov. 19, 2010

(86) PCT No.: PCT/JP2010/006814
§ 371 (c)(1),
(2), (4) Date: Aug. 1, 2012

(87) PCT Pub. No.: WO2011/061946
PCT Pub. Date: May 26, 2011

(65) Prior Publication Data
US 2012/0306716 A1    Dec. 6, 2012

(30) Foreign Application Priority Data

Nov. 20, 2009 (JP) .................................. 2009265587
Aug. 19, 2010 (JP) .................................. 2010183686

(51) Int. Cl.
| | | |
|---|---|---|
| H01Q 3/24 | (2006.01) |
| H01Q 1/52 | (2006.01) |
| H04B 1/00 | (2006.01) |
| H03K 17/693 | (2006.01) |
| H04B 1/44 | (2006.01) |
| H04B 7/06 | (2006.01) |
| H04B 7/08 | (2006.01) |

(52) U.S. Cl.
CPC ............ *H04B 1/0064* (2013.01); *H03K 17/693* (2013.01); *H04B 1/44* (2013.01); *H04B 7/0602* (2013.01); *H04B 7/0837* (2013.01)

(58) Field of Classification Search
CPC ...... H04B 1/0064; H04B 1/44; H04B 7/0602; H04B 7/0837; H03K 17/693
USPC .......................... 333/101, 100, 105, 124, 132
See application file for complete search history.

(56) References Cited

U.S. PATENT DOCUMENTS

| | | |
|---|---|---|
| 2004/0203552 A1 | 10/2004 | Horiuchi et al. |
| 2006/0286942 A1 | 12/2006 | Okuyama |

(Continued)

FOREIGN PATENT DOCUMENTS

| | | |
|---|---|---|
| JP | 06-237101 | 8/1994 |
| JP | 10-150395 | 6/1998 |
| JP | 10-209935 | 8/1998 |

(Continued)

OTHER PUBLICATIONS

International Search Report from the Japanese Patent Office for International Application No. PCT/JP2010/006814, mailing date Dec. 21, 2010.

*Primary Examiner* — Stephen E Jones
*Assistant Examiner* — Scott S Outten
(74) *Attorney, Agent, or Firm* — Sughrue Mion, PLLC

(57) ABSTRACT

The present invention provides a high frequency circuit, a high frequency circuit component, and a communication apparatus that uses the same, the circuit capable of being used for different communication systems, having a high receiving sensitivity and restraining the loss of transmission power. A high frequency circuit of the present invention includes: a first antenna terminal (ANT1) and a second antenna terminal (ANT2); and at least a transmitting terminal (Tx) and a first and a second receiving terminal (Rx1, Rx2) for a first communication system. With each switch, the first and the second receiving terminals (Rx1, Rx2) can be each simultaneously connected to the first and the second antenna terminals (ANT1, ANT2). Also, the transmitting terminal (Tx) is selectively connectable to either of the first and second antenna terminals (ANT1, ANT2).

32 Claims, 27 Drawing Sheets

(56) References Cited

U.S. PATENT DOCUMENTS

2007/0142001 A1    6/2007  Sanders
2010/0157855 A1*   6/2010  Chu et al. .................. 370/277

FOREIGN PATENT DOCUMENTS

| JP | 2002-009679 | 1/2002 |
| JP | 2004-297456 | 10/2004 |
| JP | 2006-352532 | 12/2006 |

* cited by examiner

HIGH FREQUENCY CIRCUIT, HIGH FREQUENCY CIRCUIT COMPONENT, AND COMMUNICATION APPARATUS

TECHNICAL FIELD

The present invention relates to a high frequency circuit, a high frequency circuit component, and a communication apparatus that uses the same. The high frequency circuit uses a switching circuit to switch signal paths for high frequency signals.

BACKGROUND ART

Currently, data communication based on wireless LAN, typified by IEEE 802.11, is generally used. For example, such data communication is adopted as signal transmitting means that replaces wired communication used in a personal computer (PC), PC peripheral devices such as a printer, a hard disk, and a broadband router, electronic appliances such as a FAX, a refrigerator, a standard-definition television (SDTV), a high-definition television (HDTV), a digital camera, a digital video camera, and a mobile phone, an automobile and an aircraft.

IEEE 802.11a, a standard of the wireless LAN, uses the OFDM (Orthogonal Frequency Division Multiplexing) modulation scheme to support high-speed data communication of bandwidth up to 54 Mbps, and uses the frequency band of 5 GHz. IEEE 802.11b adopts the DSSS (Direct Sequence Spread Spectrum) scheme to support high-speed communication of 5.5 Mbps and 11 Mbps and uses the ISM (Industrial Scientific and Medical) band of 2.4 GHz which can be freely used without radio license. IEEE 802.11g uses the OFDM modulation scheme to support high-speed data communication of bandwidth up to 54 Mbps, and similarly to IEEE 802.11b, IEEE 802.11g uses the band of 2.4 GHz. Also, WiMAX (IEEE 802.16-2004, IEEE 802.16e-2005 and the like), which has been proposed as a standard of high-speed wireless communications covering a communication distance of about several kilometers, uses the three frequency bands of 2.5 GHz, 3.5 GHz, and 5 GHz. WiMAX is expected as a technique for covering so-called the last one mile of optical communication.

In recent years, a wireless communications system based on the MIMO (Multiple-Input, Multiple-Output) scheme, which has superior communication characteristics, has received attention. The MIMO scheme needs, for each communication system, a plurality of receiving terminals that can independently carry out simultaneous receiving. Here, it is assumed that the MIMO includes the SIMO (Single-Input, Multiple-Output). In the wireless communications systems based on the MIMO scheme, since circuit configuration including receiving terminals in each communication system is increased, isolation between the communication systems is difficult as well as the circuit configuration is complex. For this reason, it is highly difficult to adopt the MIMO scheme as multiband wireless communications. In particular, in the case of WiMAX, which consumes high transmission power, the isolation between multiple communication systems is critical in order to decrease the loss of the transmission power.

For high frequency components that use a plurality of communication systems such as wireless LAN and WiMAX, it is important how to separately handle transmission/reception signals of these communication systems. For example, transmitting diversity circuits have attracted the attention as wireless communications systems. A transmitting diversity includes a plurality of antennas and can select an optimum antenna therefrom on the basis of radio wave conditions, thereby enabling the transmission power to be reduced and a mobile device to run for a long time.

Patent Literature 1 describes the use of a high frequency switch composed of a FET switch as a diversity circuit. Patent Literature 2 describes a switch circuit composed of a combination of three SPDT switches as a conventional technique. Patent Literature 2 also describes a switch into which FET switches are formed as an integrated circuit on a semiconductor chip. As a transmitting diversity circuit of a TDMA wireless apparatus including a plurality of switch circuits, Patent Literature 3 discloses a wireless apparatus in which a filter circuit is disposed at each path as shown in FIG. 1.

CITATION LIST

Patent Literature

Patent Literature 1: Japanese Patent Laid-Open No. 06-237101
Patent Literature 2: Japanese Patent Laid-Open No. 10-150395
Patent Literature 3: Japanese Patent Laid-Open No. 10-209935

SUMMARY OF INVENTION

Technical Problem

However, such conventional techniques are still not effective for ensuring the isolation between multiple communication systems. In particular, the foregoing documents have not disclosed how to, when a transmitting diversity circuit including a switching circuit is composed of a multi-layered circuit component, restrict interference between signal paths in the laminated body. For Tx diversity circuits, there is a need for circuit components that can receive each signal input from different antennas with substantially the same sensitivity.

Thus, an object of the present invention is to provide a high frequency circuit, a high frequency circuit component, and a communication apparatus that uses the same, the circuit being capable of restraining the loss of transmission power by selecting an optimum antenna in accordance with a radio wave condition at the time of transmission.

Solution to Problem

A first aspect is a high frequency circuit component comprising a high frequency circuit, wherein the high frequency circuit includes a switching circuit, a first and a second antenna terminal, a transmitting terminal and a first and a second receiving terminal for a first communication system, a first filter circuit disposed on a reception path connecting the switching circuit to the first receiving terminal, and a second filter circuit disposed on a reception path connecting the switching circuit to the second receiving terminal, the switching circuit allows the transmitting terminal to be selectively connectable to either of the first and second antenna terminals, allows the first receiving terminal to switch connection and disconnection to and from the first antenna terminal, and allows the second receiving terminal to switch connection and disconnection to and from the second antenna terminal, the high frequency circuit component includes a laminated body of a plurality of layers on which electrode patterns are formed, and in the laminated body, at least a part of electrode patterns of the first and second filter circuits is formed and the first filter circuit and the second filter circuit are formed in different regions as seen in a lamination direction of the laminated body.

A second aspect is a high frequency circuit component according to the first aspect, wherein the high frequency circuit further includes: a third filter circuit disposed at a rear stage with respect to the first filter circuit; and a fourth filter circuit disposed at a rear stage with respect to the second filter circuit, and in the laminated body, at least a part of an electrode pattern of each of the third and fourth filter circuits is formed, and the electrode patterns of the third and fourth filter circuits are formed in different regions as seen in the lamination direction of the laminated body.

A third aspect is a high frequency circuit component according to the second aspect, wherein the electrode patterns of the first and third filter circuits are separated from the electrode patterns of the second and fourth filter circuits.

A fourth aspect is a high frequency circuit component according to the first to third aspects, wherein the regions in which the electrode patterns of the first to fourth filter circuits are formed are sandwiched in the lamination direction between the first and second ground electrodes formed on different layers in the laminated body.

A fifth aspect is a high frequency circuit component comprising a high frequency circuit, wherein the high frequency circuit includes a switching circuit, a first and a second antenna terminal, a transmitting terminal and a first and a second receiving terminal for a first communication system, a first filter circuit disposed on a reception path connecting the switching circuit to the first receiving terminal, a second filter circuit disposed on a reception path connecting the switching circuit to the second receiving terminal, and a sixth filter circuit disposed on a transmission path connecting the switching circuit to the transmitting terminal, the switching circuit allows the transmitting terminal to be selectively connectable to either of the first and second antenna terminals, allows the first receiving terminal to switch connection and disconnection to and from the first antenna terminal, and allows the second receiving terminal to switch connection and disconnection to and from the second antenna terminal, the high frequency circuit component includes a laminated body of a plurality of layers on which electrode patterns are formed, and in the laminated body, at least a part of electrode patterns of the first, second, and the sixth filter circuits is formed and the electrode pattern of the sixth filter circuit is formed in a different region from regions of the electrode patterns of the first and second filter circuits as seen in a lamination direction of the laminated body.

A sixth aspect is a high frequency circuit component according to the fifth aspect, wherein the high frequency circuit further includes: a third filter circuit disposed at a rear stage with respect to the first filter circuit; a fourth filter circuit disposed at a rear stage with respect to the second filter circuit; and a fifth filter circuit disposed at a front stage with respect to the sixth filter circuit, and in the laminated body, at least a part of electrode patterns of the third, fourth, and fifth filter circuits is formed, and the filter circuits are formed in different regions as seen in the lamination direction of the laminated body.

A seventh aspect is a high frequency circuit component according to the sixth aspect, wherein the electrode patterns of the first and third filter circuits are separated from the electrode patterns of the sixth and fifth filter circuits, and at least a part of the electrode patterns of the sixth and fifth filter circuits is separated from at least a part of the electrode patterns of the second and fourth filter circuits.

An eighth aspect is a high frequency circuit component according to the sixth or seventh aspect, wherein the laminated body includes vias for heat dissipation, and at least a part of the electrode patterns of the first and third filter circuits is separated from at least a part of the electrode patterns of the second and fourth filter circuits by the vias for heat dissipation.

A ninth aspect is a high frequency circuit component according to the seventh aspect, wherein the regions in which the electrode patterns of the first to sixth filter circuits are formed are sandwiched in the lamination direction between the first and second ground electrodes formed on different layers in the laminated body.

A tenth aspect is a high frequency circuit component according to the ninth aspect, wherein a shield composed of a plurality of vias is formed in at least one gap between the regions in which the electrode patterns of the filter circuits are formed.

An 11th aspect is a high frequency circuit component according to any of the fifth to seventh aspects, wherein the switching circuit is disposed on the mounting surface so as to overlap at least a part of the electrode pattern of the sixth filter circuit in the laminated body.

A 12th aspect is a high frequency circuit component according to any of the first to the seventh aspects, wherein the switching circuit includes: a first switch that allows the first antenna terminal to be selectively connectable to either of the transmitting terminal and the first receiving terminal; a second switch that allows the second antenna terminal to be selectively connectable to either of the transmitting terminal and the second receiving terminal; and a third switch that allows the transmitting terminal to be selectively connectable to either of the first and the second antenna terminals, and the first to the third switches are set at the mounting surface of the laminated body in order of the first switch, the third switch, and the second switch as seen in a predetermined direction with substantially the same distances between terminals for connecting the first switch to the third switch, and the second switch to the third switch.

A 13th aspect is a high frequency circuit component according to the 12th aspect, wherein the first to third switches are single-pole double-throw switches, the first antenna terminal is connected with a single pole terminal of the first single-pole double-throw switch, one of double-throw terminals of the first single-pole double-throw switch is connected with the first receiving terminal for the first communication system, a single pole terminal of the second single-pole double-throw switch is connected with the second antenna terminal, one of double-throw terminals of the second single-pole double-throw switch is connected with the second receiving terminal for the first communication system, a single pole terminal of the third single-pole double-throw switch is connected with the transmitting terminal for the first communication system, and the other of each of the double-throw terminals of the first and second single-pole double-throw switches is connected with double-throw terminals of the third single-pole double-throw switch.

An 14th aspect is a high frequency circuit component according to any of the first to seventh aspect, wherein the switching circuit includes a plurality of transistor circuits including: a first transistor circuit that switches connection and disconnection between the first antenna terminal and the first receiving terminal; a fifth transistor circuit that switches connection and disconnection between the second antenna terminal and the second receiving terminal; a second transistor circuit that switches connection and disconnection between ground and a node between the first receiving terminal and the first transistor circuit; and a sixth transistor circuit that switches connection and disconnection between ground and a node between the second receiving terminal and the fifth transistor circuit, when the first antenna terminal is connected with the transmitting terminal, the sixth transistor circuit connects ground to the node between the second receiving terminal and the fifth transistor circuit, and when the second antenna terminal is connected with the transmitting terminal, the second transistor circuit connects ground to the node between the first receiving terminal and the first transistor circuit.

A 15th aspect is a high frequency circuit component according to any of the first to the seventh aspects, wherein the switching circuit includes a plurality of transistor circuits including: a first transistor circuit that switches connection and disconnection between the first antenna terminal and the first receiving terminal; a fourth transistor circuit that switches connection and disconnection between the first antenna terminal and the transmitting terminal; a fifth transistor circuit that switches connection and disconnection between the second antenna terminal and the second receiving terminal; an eighth transistor circuit that switches connection and disconnection between the second antenna terminal and the transmitting terminal; a second transistor circuit that switches connection and disconnection between ground and a node between the first receiving terminal and the first transistor circuit; and a sixth transistor circuit that switches connection and disconnection between ground and a node between the second receiving terminal and the fifth transistor circuit, when the first antenna terminal is connected with the transmitting terminal, the sixth transistor circuit connects ground to the node between the second receiving terminal and the fifth transistor circuit, and when the second antenna terminal is connected with the transmitting terminal, the second transistor circuit connects ground to the node between the first receiving terminal and the first transistor circuit.

A 16th aspect is a high frequency circuit component according to the 15th aspect, wherein the high frequency circuit comprises: a third transistor circuit that switches connection and disconnection between the first antenna terminal and the fourth transistor circuit; and a seventh transistor circuit that switches connection and disconnection between the second antenna terminal and the eighth transistor circuit, wherein the second and third transistor circuits are connected with a same power supply terminal, and wherein the sixth and seventh transistor circuits are connected with a same power supply terminal.

A 17th aspect is a high frequency circuit component according to the 16th aspect, comprising: a ninth transistor circuit that switches connection and disconnection between ground and a node between the third transistor circuit and the fourth transistor circuit; and a tenth transistor circuit that switches connection and disconnection between ground and a node between the seventh transistor circuit and the eighth transistor circuit, wherein the fourth transistor circuit and the tenth transistor circuit are connected with a same power supply terminal, and the eighth transistor circuit and the ninth transistor circuit are connected with a same power supply terminal.

A 18th aspect is a high frequency circuit component according to any of the first to the seventh aspects, wherein the switching circuit includes a plurality of transistor circuits of: a first transistor circuit that switches connection and disconnection between the first antenna terminal and the first receiving terminal; a third and a fourth transistor circuit that switch connection and disconnection between the first antenna terminal and the transmitting terminal; a fifth transistor circuit that switches connection and disconnection between the second antenna terminal and the second receiving terminal; a seventh and an eighth transistor circuit that switch connection and disconnection between the second antenna terminal and the transmitting terminal; a ninth transistor circuit that switches connection and disconnection between ground and a node between the third transistor circuit and the fourth transistor circuit; and a tenth transistor circuit that switches connection and disconnection between ground and a node between the seventh transistor circuit and the eighth transistor circuit, the fourth transistor circuit and the tenth transistor circuit are connected with a same power supply terminal, and the eighth transistor circuit and the ninth transistor circuit are connected with a same power supply terminal.

A 19th aspect is a high frequency circuit component according to the 14th aspect, wherein one of a source and a drain of each of the second and the sixth transistor circuits is grounded, the other of the source and the drain is connected with a node on a signal path, and a resistance is connected between the source and the drain.

A 20th aspect is a high frequency circuit component according to the 15th aspect, wherein at least one of transistor elements used in the second and the sixth transistor circuits is lower in dielectric withstanding voltage than transistor elements used in the first, fifth, fourth and eighth transistor circuits.

A 21th aspect is a high frequency circuit component according to the 16th or 17th aspect, wherein at least one of transistor elements used in the third and the seventh transistor circuits is lower in dielectric withstanding voltage than transistor elements used in the fourth and the eighth transistor circuits.

A 22nd aspect is a high frequency circuit component according to the 14th aspect, wherein the switching circuit is obtained by using each transistor element being disposed on an integrated semiconductor substrate.

A 23rd aspect is a high frequency circuit component according to the 22nd aspect, wherein the semiconductor substrate is rectangular; electrodes connected with the first and second antenna terminals, electrodes connected with the first and second receiving terminals, and an electrode connected with a transmitting terminal are formed on the semiconductor substrate, and the electrodes connected with the first and second antenna terminals are disposed at adjacent corners, and the electrodes connected with the first and the second receiving terminals are disposed at the other two corners.

A 24th aspect is a high frequency circuit component according to the 22nd aspect, wherein an electrode connected with the transmitting terminal is disposed at a middle point between the electrodes connected with the first and second receiving terminals, and ground electrodes are formed between the electrode connected with the transmitting terminal and the electrode connected with the first receiving terminal and between the electrode connected with the transmitting terminal and the electrode connected with the second receiving terminal.

A 25th aspect is a high frequency circuit component according to the 22nd aspect, wherein a power supply line connected with each transistor element formed the semiconductor substrate is drawn around closer to a peripheral side of the semiconductor substrate than at least one of the electrodes connected with the first and second antenna terminals, the electrodes connected with the first and second receiving terminals, and the electrode connected with the transmitting terminal.

A 26th aspect is a high frequency circuit component according to the 25th aspect, wherein on the semiconductor substrate, a power supply line connected with a power supply terminal is formed along at least a side of the substrate.

A 27th aspect is a high frequency circuit component according to any of the first to third and seventh aspects, wherein the high frequency circuit component comprises a transmitting terminal for a second communication system, and the transmitting terminals for the first and second communication systems are connected with the switching circuit via a fourth switch.

A 28th aspect is a high frequency circuit component according to the 27th aspect, wherein high frequency amplifier circuits are each disposed between the fourth switch and the transmitting terminal for the first communication system and between the fourth switch and the transmitting terminal for the second communication system, and at least one of the high frequency amplifier circuits and the fourth switch are connected with a same power supply terminal.

A 29th aspect is a high frequency circuit component according to any of the first to third and seventh aspects, wherein the high frequency circuit component comprises a first and a second receiving terminal for a second communication system and a transmitting terminal for the second communication system, the first receiving terminal for the first communication system and the first receiving terminal for the second communication system are connected with the switching circuit via a fifth switching circuit or a first diplexer circuit, and the second receiving terminal for the first communication system and the second receiving terminal for the second communication system are connected with the switching circuit via a sixth switch circuit or a second diplexer circuit.

A 30th aspect is a high frequency circuit, comprising a switching circuit, a first and a second antenna terminal, a first and a second transmitting terminal and a first and a second receiving terminal for a communication system, wherein in the switching circuit, the first antenna terminal is connected with a single pole terminal of a seventh single-pole triple-throw switch, one of triple-throw terminals of the seventh switch is connected with the first receiving terminal, the second antenna terminal is connected with a single pole terminal of an eighth single-pole triple-throw switch, one of triple-throw terminals of the eighth switch is connected with the second receiving terminal, the first transmitting terminal is connected with a single pole terminal of a ninth single-pole double-throw switch, each of double-throw terminals of the ninth switch is connected with one of the triple-throw terminals of each of the seventh and eighth switches, the second transmitting terminal is connected with a single pole terminal of a tenth single-pole double-throw switch, each of double-throw terminals of the tenth switch is connected with one of the triple-throw terminals of each of the seventh and eighth switches, and the switching circuit allows any one of the first and second transmitting terminals to be selectively connectable to either of the first and second antenna terminals, the first receiving terminal to switch connection and disconnection to and from the first antenna terminal, and the second receiving terminal to switch connection and disconnection to and from the second antenna terminal.

A 31st aspect is a high frequency circuit, comprising a switching circuit, a first and a second antenna terminal, a first and second transmitting terminal and a first and a second receiving terminal for a communication system, wherein in the switching circuit, the first antenna terminal is connected with a single pole terminal of an 11th single-pole double-throw switch, one of double-throw terminals of the 11th switch is connected with the first receiving terminal, the second antenna terminal is connected with a single pole terminal of a 12th single-pole double-throw switch, one of double-throw terminals of the 12th switch is connected with the second receiving terminal, the first and second transmitting terminals are connected with one of double-pole terminals of a 13th double-pole double-throw switch, one of the double-throw terminals of each of the 11th and 12th switches is connected with the other of double-throw terminals of the 13th switch, and the switching circuit allows any one of the first and second transmitting terminals to be selectively connectable to either of the first and second antenna terminals, the first receiving terminal to switch connection and disconnection to and from the first antenna terminal, and the second receiving terminal to switch connection and disconnection to and from the second antenna terminal.

Advantageous Effect of Invention

According to the present invention, there is provided a high frequency circuit that can select an optimum antenna in accordance with radio wave conditions at the time of transmission to control loss of transmission power and can ensure isolation between signal paths.

DESCRIPTION OF EMBODIMENTS

[1] High Frequency Circuit

Figure 1:
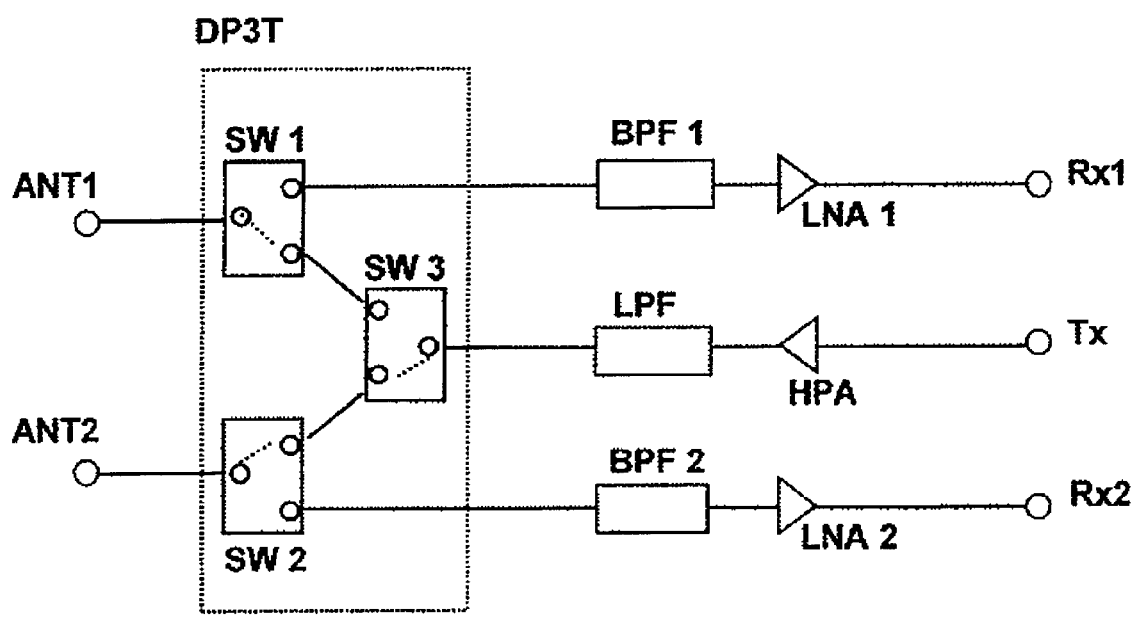
FIG. 1 is a diagram illustrating an example of a transmitting diversity circuit.

A high frequency circuit of the present invention includes at least a first and a second antenna terminal as well as a transmitting terminal and a first and a second receiving terminal for a first communication system. The high frequency circuit also includes a switching circuit that selects and connects one of the first and the second antenna terminals to the transmitting terminal. This configuration allows reducing loss of transmission signals. The switching circuit allows the transmitting terminal to be selectively connectable to either of the first and the second antenna terminals, allows the first receiving terminal to switch connection and disconnection to and from the first antenna terminal, and allows the second receiving terminal to switch connection and disconnection to and from the second antenna terminal. A specific configuration of the high frequency circuit of the present invention will be described in detail, but the present invention is not limited to such an embodiment. The same reference characters are assigned to components having the same functions in the drawings.

(1) First Embodiment

Figure 2:
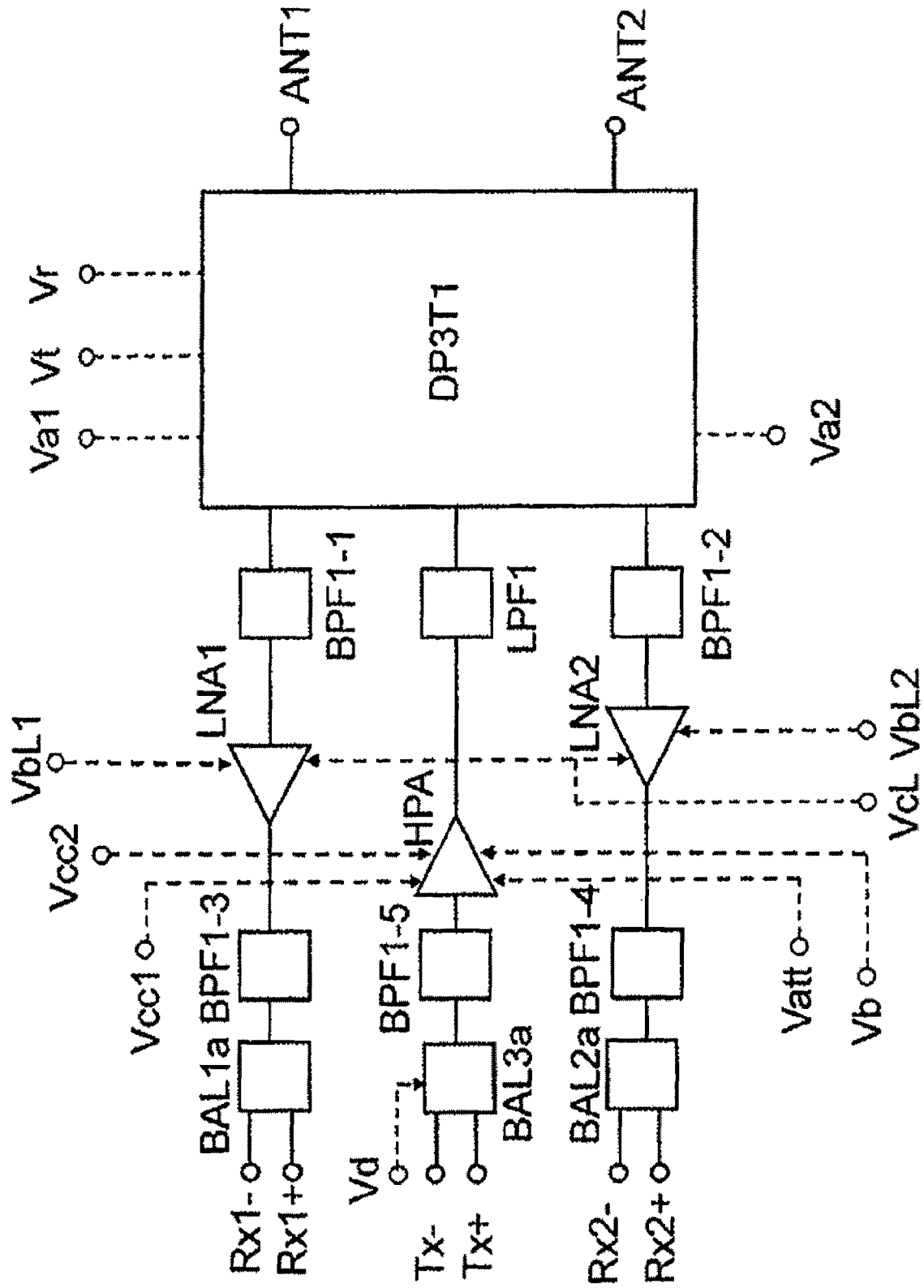
FIG. 2 is a block diagram of a high frequency circuit according to an embodiment.

FIG. 2 is an example of a Tx diversity circuit being high frequency circuit according to the present embodiment. This high frequency circuit includes a first antenna terminal ANT1 and a second antenna terminal ANT2 as well as a transmitting terminal Tx and a first receiving terminal Rx1 and a second receiving terminal Rx2 for a first communication system. The high frequency circuit also includes a switching circuit DP3T1. For example, the transmitting terminal Tx, and the receiving terminals Rx1 and Rx2 are connected to an RFIC circuit for WiMAX of the 2.5 GHz band. The switching circuit DP3T1 has switch terminals, each of which is connected to each of the two antenna terminals ANT1 and ANT2, the transmitting terminal Tx, the first receiving terminal Rx1, and the second receiving terminal Rx2. The switching circuit DP3T1 switches so that a signal from the transmitting terminal Tx is selectively output to the two antenna terminals ANT1 and ANT2. Also, the switching circuit DP3T switches so that reception signals received at each of the two antenna terminals ANT1 and ANT2 are simultaneously output to the different receiving terminals Rx1 and Rx2. Details of the switching circuit will be described later.

As illustrated in FIG. 2, it is preferable that a low-noise amplifier circuit LNA1 for amplifying a reception signal be connected between the first antenna terminal ANT1 and the first receiving terminal Rx1. Also, it is preferable that a filter circuit be provided in at least one of a front stage (antenna terminal side) and a rear stage (receiving terminal side) with respect to the low-noise amplifier circuit LNA1. The filter circuit can restrain unnecessary signals including a signal from another communication system from being input to the low-noise amplifier circuit LNA1 and the receiving terminal Rx1. In the present embodiment, as filter circuits, a band-pass filter circuit BPF1-1 is disposed at a front stage and a band-pass filter circuit BPF1-3 is disposed at a rear stage with respect to the low-noise amplifier circuit. A balanced/unbalanced converting circuit BAL1a is disposed between the first receiving terminal Rx1 and the band-pass filter circuit BPF1-3, at the rear stage. It is preferable that a low-noise amplifier circuit LNA2 for amplifying a reception signal be connected between the second antenna terminal ANT2 and the second receiving terminal Rx2. Also, it is preferable that a filter circuit be disposed at at least one of a front stage and a rear stage with respect to the low-noise amplifier circuit LNA2. The filter circuit can restrain unnecessary signals including a signal from another communication system from being input to the low-noise amplifier circuit LNA2 and the receiving terminal Rx2. In the present embodiment, as filter circuits, a band-pass filter circuit BPF1-2 is disposed at a front stage and a band-pass filter circuit BPF1-4 is disposed at a rear stage with respect to the low-noise amplifier circuit LNA2. A balanced/unbalanced converting circuit BAL2a is disposed between the second receiving terminal Rx2 and the band-pass filter circuit BPF1-4, at the rear stage.

As illustrated in FIG. 2, it is preferable that a high frequency amplifier circuit HPA be disposed between a switching circuit DP3T1 and the transmitting terminal Tx. Using the high frequency amplifier circuit HPA, a high degree of integration of the high frequency circuit can be achieved. It is preferable that a filter circuit be disposed between the switching circuit DP3T1 and the high frequency amplifier circuit HPA. In this embodiment, a low-pass filter circuit LPF1 is disposed at a rear stage (in a transmission path, an antenna terminal side) with respect to the high frequency amplifier circuit HPA. The low-pass filter circuit LPF1 can restrain harmonics generated at the high frequency amplifier circuit HPA from being input to the antenna terminal Tx. It is preferable that a filter circuit be disposed at a front stage (in the transmission path, a transmitting terminal side) with respect to the high frequency amplifier circuit HPA. In this embodiment, a band-pass filter circuit BPF1-5 is disposed. The band-pass filter circuit BPF1-5 can prevent noise of an unnecessary band, not transmission signals, from being input to the high frequency amplifier circuit HPA. A balanced/unbalanced converting circuit BAL3a is disposed between the transmitting terminal Tx and the band-pass filter circuit BPF1-5.

[2] Equivalent Circuit 1

FIGS. 3 to 6 illustrate equivalent circuits of the block circuit in FIG. 2.

Figure 3:
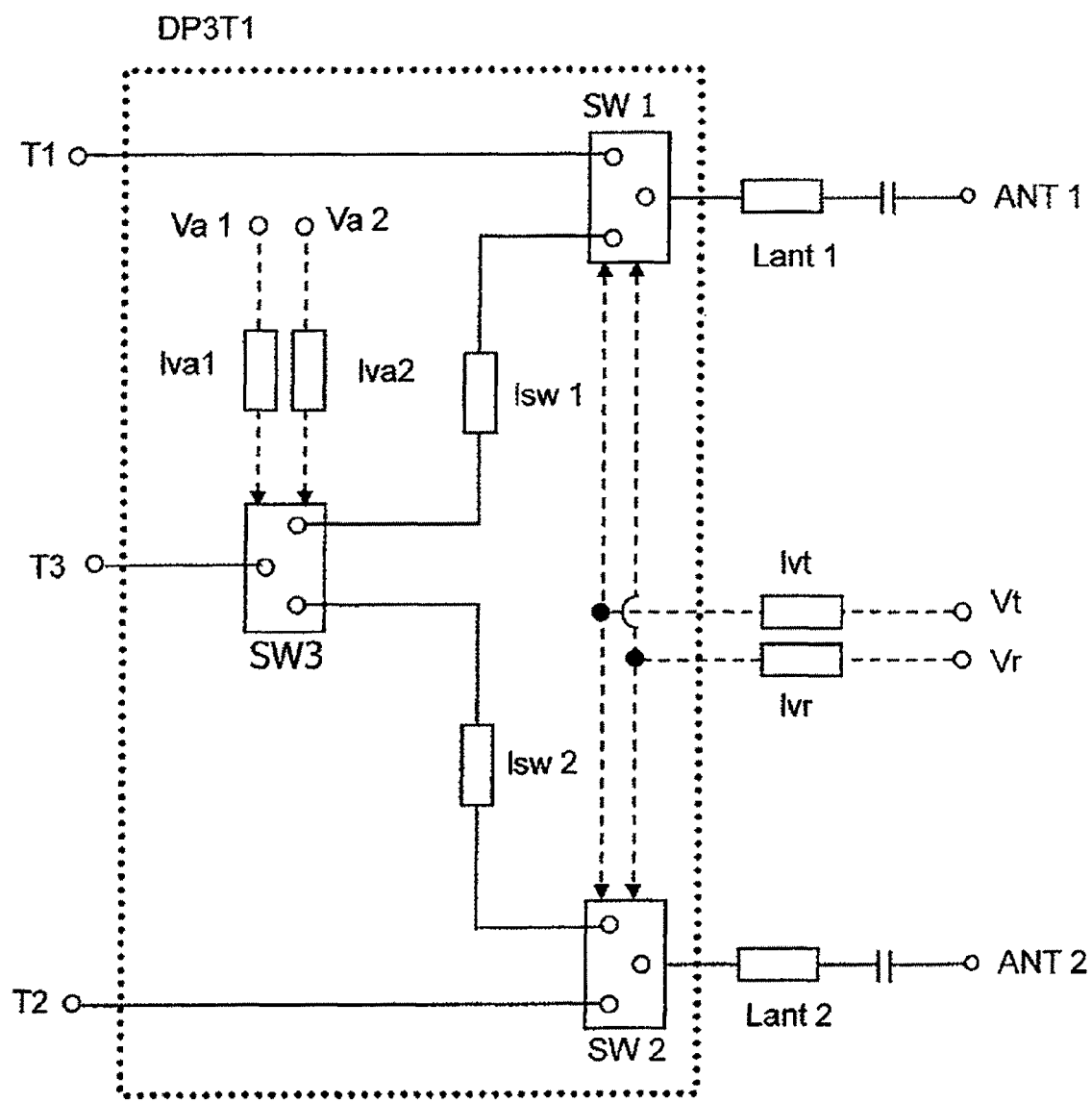
FIG. 3 is an equivalent circuit shown in the block diagram of FIG. 2.

FIG. 3 is a diagram illustrating an equivalent circuit substantially from the switching circuit DP3T1 to the first and the second antenna terminals. T1 and T2 in FIG. 3 are linked to T1 and T2 in FIG. 4 described later, and T3 is linked to T3 in FIG. 6 described later. As described later, the switching circuit DP3T1 is composed of a combination of single-pole double-throw switches SW1 to SW3.

The first switch SW1 and the second switch SW2 are controlled through common power supply lines linked to control terminals Vt and Vr. When the first switch SW1 connects the first receiving terminal Rx1 to the first antenna terminal ANT1, the second switch SW2 switches so as to connect the second receiving terminal Rx2 to the second antenna terminal ANT2 in synchronization therewith, and reception signals can be simultaneously received from the two antenna terminals. Signals from the transmitting terminal Tx can be switched by the third switch SW3.

Connection/disconnection of each signal path is switched by power supply terminals va1, va2, Va, Vt, and Vr connected to the switching circuits. The switching circuits switch on/off power supply terminals Vcc1, Vcc2, Vb, and Vatt connected with the high frequency amplifier circuit HPA, VbL1 connected with the low-noise amplifier circuit LNA1, VbL2 connected with LNA2, and a power supply terminal VcL shared by both the low-noise amplifier circuits LNA1 and LNA2.

For example, when each antenna terminal is connected to the transmitting terminals and the receiving terminals, voltage of each control terminal is controlled as shown in the following table. The unit of the figures in the table is volt (V).

TABLE 1

| Mode | Vt | Vr | Va1 | Va2 | Vatt | Vb | VbL1 | VbL2 | Vcc1 | Vcc2 | VcL | Vd |
|---|---|---|---|---|---|---|---|---|---|---|---|---|
| Tx1 | 3.0 | 0.0 | 3.0 | 0.0 | 0.0 | 3.0 | 0.0 | 0.0 | 3.5 | 3.5 | 3.0 | 0.0 |
| Tx2 | 3.0 | 0.0 | 0.0 | 3.0 | 0.0 | 3.0 | 0.0 | 0.0 | 3.5 | 3.5 | 3.0 | 0.0 |
| Rx | 0.0 | 3.0 | 0.0 | 0.0 | 0.0 | 0.0 | 3.0 | 3.0 | 3.5 | 3.5 | 3.0 | 0.0 |

Mode Tx1 in the table indicates the state where the transmitting terminal Tx is connected to the first antenna terminal ANT1. Mode Tx2 indicates the state where the transmitting terminal Tx is connected to the second antenna terminal ANT2. Mode Rx indicates the state where the first antenna terminal is connected to the first receiving terminal Rx1, and the second antenna terminal ANT2 is connected to the second receiving terminal Rx2.

The Mode Tx1 and the Mode Tx2 will be described. When the voltage value 3.0 V is applied from the power supply terminal Vt and the voltage value 0.0 V is applied from the power supply terminal Vr, the first switch SW1 connected to the shared power supply terminals Vt and Vr connects the first antenna terminal ANT1 to the terminal of the third switch SW3, and the second switch SW2 connects the second antenna terminal ANT2 to the terminal of the third switch SW3. Connection/disconnection of the transmitting terminal Tx to/from the terminal of the first switch SW1 and the terminal of the second switch SW2 is switched by the third switch SW3. The third switch is switched by power supply terminals Va1 and Va2, and levels of the voltage from the other power supply terminals are the same. Also, the power supply terminal Vb connected to the high frequency amplifier circuit has a higher voltage value and amplifies a transmission signal in any case of Mode Tx1 and Mode Tx2.

Mode Rx will be described.

When the voltage value 0.0 V is applied from the power supply terminal Vt and the voltage value 3.0 V is applied from the power supply terminal Vr, the first switch SW1 connected to the shared power supply terminals Vt and Vr connects the first antenna terminal ANT1 to a first receiving terminal RX, and the second switch SW2 connects the second antenna terminal ANT2 to the second receiving terminal Rx2. The third switch is switched by the power supply terminals Va1 and Va2, but levels of voltage may be any combination. Also, the low-noise amplifier circuits LNA1 and LNA2 are driven by the voltage applied from the power supply terminals Vbl and Vbl2 to amplify a reception signal.

Figure 4:
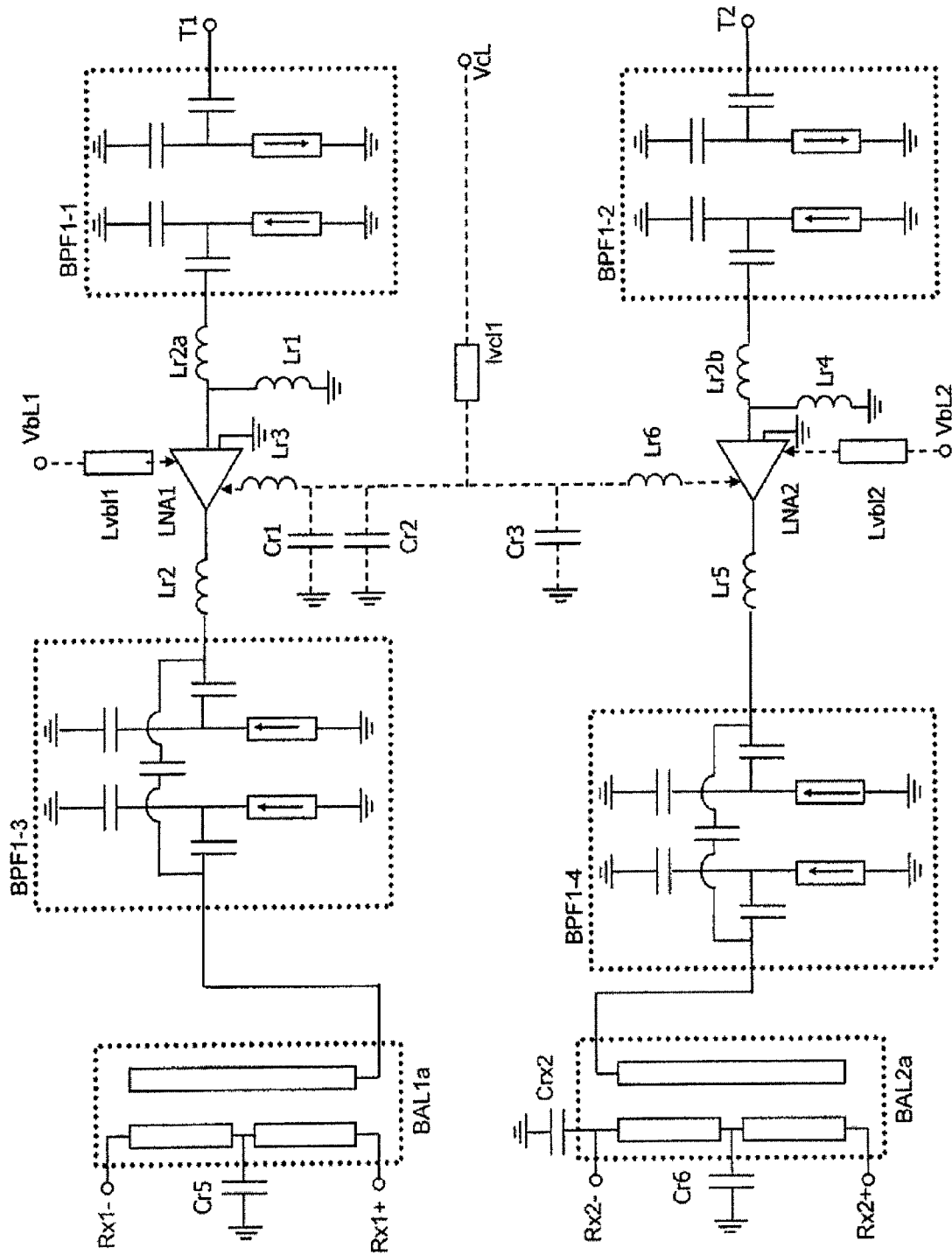
FIG. 4 is another portion of the equivalent circuit shown in the block diagram of FIG. 2.

FIG. 4 is a diagram illustrating an equivalent circuit from the rear stage of the switching circuit DP3T1 to the first and second receiving terminals.

The band-pass filter circuits BPF1-1 and 1-2 are two-stage band-pass filters in which two resonance lines are electromagnetically coupled to each other. One end of the resonance line is connected with a grounded capacitor, and the other end of the resonance line is connected to GND. Also, a DC cutting capacitor is connected to an input/output side. Chip inductors Lr2a and Lr1, Lr2b and Lr4 mounted on a top surface of the laminated body are connected between a DC cuffing capacitor at a rear stage and the low-noise amplifiers LNA1 and LNA2 in order to achieve input matching. By changing constants of the chip inductors, the input matching can be easily provided.

The on/off-states of the low-noise amplifiers LNA1 and LNA2 are switched using the control voltages VbL1 and VbL2. Normally, a VcL (drain voltage) of 3.0 to 4.0 V is applied to the low-noise amplifier. When a reception signal needs to be amplified, a voltage of about 2.0 to 3.0 V is applied to the control voltages VbL1 and VbL2 to shift the low-noise amplifier to the on-mode.

When VbL1 and VbL2 are in the off-mode, the low-noise amplifier is in a bypass mode. The bypass mode is used to prevent saturation of a low-noise amplifier when high-power signals are input from an antenna, but a low-noise amplifier LNA without the bypass mode may be used as needed. Also, choke coils Lr3 and Lr6, and noise cutting capacitors Cr1, Cr2, and Cr3 are connected to the VcL terminal.

Signals amplified by the low-noise amplifiers LNA1 and LNA2 are, through inductors Lr2 and Lr5 that provide matching at the outputting side, input to the band-pass filter circuits BPF1-3 and 1-4 at a rear stage. The band-pass filter circuits BPF1-3 and 1-4 at the rear stage are two-stage band-pass filters in which two transmission lines formed in the laminated body are electromagnetically coupled to each other. One end of the resonance line is connected with a grounded capacitor, and the other end of the resonance line is connected to GND. Also, a DC cutting capacitor is connected to an input/output side. Further, in order to strengthen the coupling between the resonators, capacitors are connected. Thereby, attenuation in bands other than a passing band is allowed to be great. Attenuation in bands other than a passing band may be great by using three resonators of the transmission lines.

The signals that have passed through the band-pass filter circuits BPF1-3 and 1-4 at the rear stage are converted into balanced signals by balanced/unbalanced converting circuits BAL1a and BAL2a. The balanced/unbalanced converting circuits are configured using transmission lines formed in the laminated body. The balanced/unbalanced converting circuits BAL1a and BAL2a may include transmission lines that achieve matching between the band-pass filter circuits at the rear stage and the balanced/unbalanced converting circuits.

Also, the transmission lines in the balanced/unbalanced converting circuits are connected with capacitors Cr5 and Cr6 mounted on a top surface of the laminated body. The capacitors Cr5 and Cr6 can adjust a phase difference of reception signals output to receiving terminals Rx1– and Rx1+. The receiving terminals Rx1– and Rx1+ are connected to an RFIC circuit portion. Because the balanced input/output has higher noise resistance than that provided by the unbalanced input/output, often balanced input and balanced output are adopted in the RFIC circuit portion. On the other hand, because a switching circuit and a low-noise amplifier circuit are unbalanced devices, a balanced/unbalanced converting circuit is often provided as an interface between such a circuit and an RFIC circuit portion. Designing a balanced/unbalanced converting circuit inside the laminated body allows downsizing a high frequency component, thereby achieving a downsized communications device.

Figure 5:
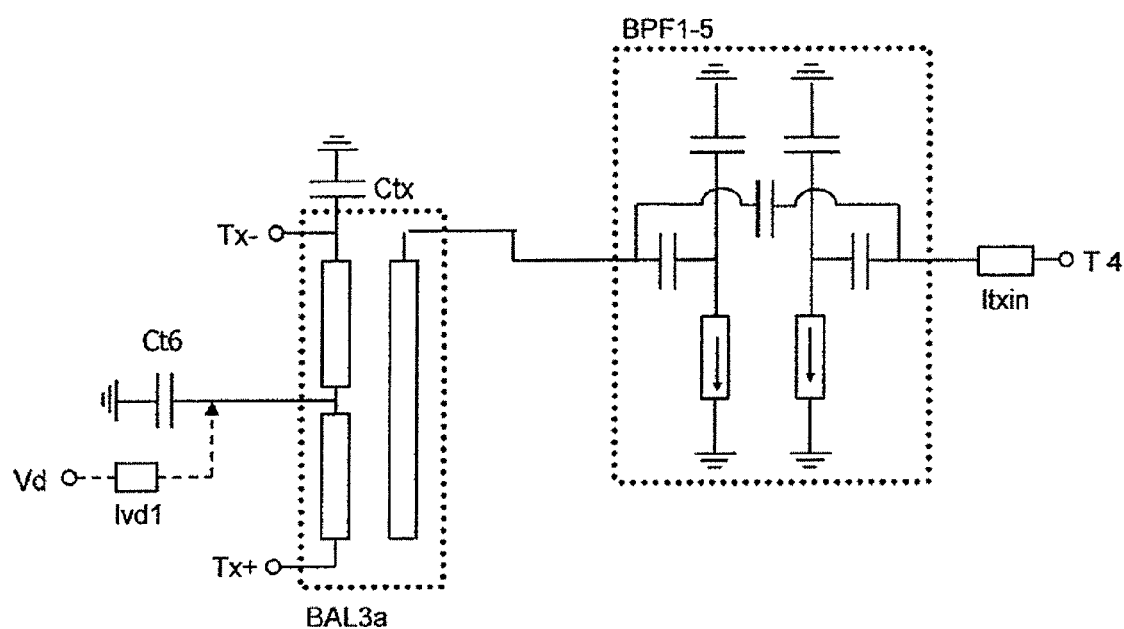
FIG. 5 is yet another portion of the equivalent circuit shown in the block diagram of FIG. 2.

FIG. 5 is a diagram illustrating an equivalent circuit from the transmitting terminal Tx to the front stage of the high frequency amplifier circuit. Transmission signals from the RFIC circuit portion are, through the balanced/unbalanced converting circuit BAL3a, input to the band-pass filter circuit BPF1-5. T4 in FIG. 5 is linked to T4 in FIG. 6.

The balanced/unbalanced converting circuit BAL3a is configured by using transmission lines formed in the laminated body. Also, a DC feeding voltage terminal Vd is connected between the transmission lines and a specification of the used RFIC circuit can simultaneously apply direct current voltage to a Tx– terminal and a Tx+ terminal. A grounded capacitor Ct6 mounted on a mounting surface of the laminated body is connected between the DC feeding voltage terminal Vd and the BAL3a. In this embodiment, a grounded capacitor Ctx is connected to the balanced/unbalanced converting circuit BAL3a, and a phase and amplitude can be easily adjusted.

The band-pass filter circuit 1-5 is, similarly to the aforementioned band-pass filter circuits BPF1-3 and BPF1-4, a two-stage band-pass filter having two resonance lines. It should be noted that a high frequency circuit without the band-pass filter circuit may also function as a Tx diversity high frequency circuit.

Figure 6:
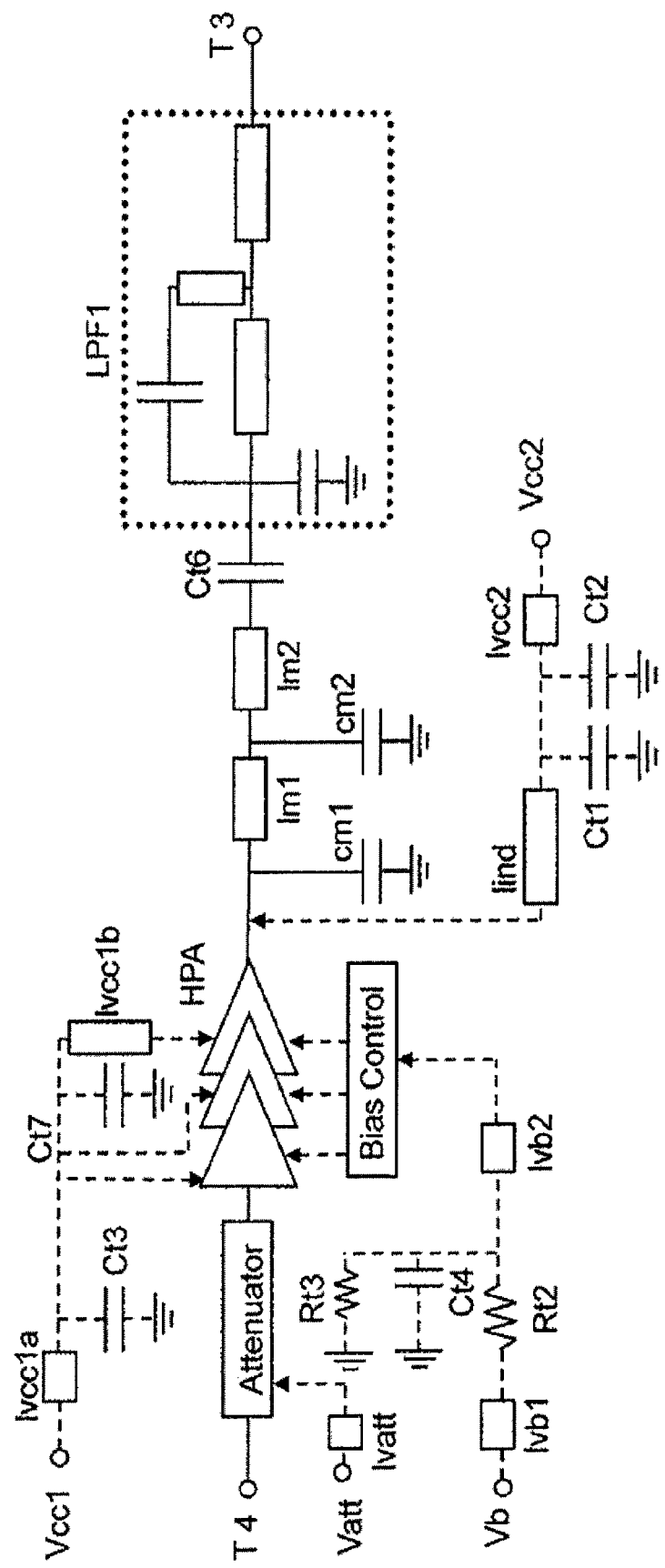
FIG. 6 is yet another portion of the equivalent circuit shown in the block diagram of FIG. 2.

FIG. 6 is a diagram illustrating an equivalent circuit from a front stage with respect to the high frequency amplifier circuit to a front stage with respect to the switching circuit DP3T1. Signals from the transmitting terminal are input to the high frequency amplifier circuit HPA through an attenuator. If required, the attenuator is controlled by a control voltage Vatt. A transmission line lvatt being a part of the power supply line is formed as an electrode pattern in the laminated body.

The high frequency amplifier circuit HPA is driven by the voltage from the driving voltages Vcc1 and Vcc2. The voltage from the driving power supplies Vcc1 and Vcc2 is, through a constant voltage supplying circuit, input to the high frequency amplifier circuit HPA. The constant voltage supplying circuit is formed of: electrode patterns Ivcc1a and Ivcc1b formed in the laminated body; grounded capacitors Ct3 and Ct7 and electrode patterns lind and Ivcc2 mounted on the top surface of the laminated body; and grounded capacities Ct1 and Ct2 mounted on the top surface of the laminated body. Also, the high frequency amplifier circuit HPA is controlled by the voltage from a bias voltage Vb. The bias voltage Vb is, through a control voltage circuit for controlling output power, input to the high frequency circuit HPA. The control voltage circuit is formed of electrode patterns Ivb1 and Ibv2 formed in the laminated body and a grounded capacitor Ct4, a resistance Rt2, and a grounding resistance Rt3 mounted on the top surface of the laminated body.

Signals amplified by the high frequency amplifier circuit HPA are provided to the low-pass filter circuit LPF1 through an output matching circuit and the DC cutting capacitor Ct6. The output matching circuit is formed of electrode patterns Im1 and Im2 in the laminated body and grounded capacities cm1 and cm2.

The low-pass filter circuit LPF1 is actually a Pi low-pass filter because a parasitic capacitance is generated. A parallel resonance circuit is formed between input/output terminals. Also, a grounded capacitor is connected to the input terminal side of the parallel resonance circuit. Also, transmission lines connected in series are connected to a front stage with respect to the parallel resonance circuit.

These electrode patterns are formed in the laminated body including an insulator layer and a conductor pattern. The insulator layer may be composed of dielectric ceramics, resin, or a composite material of resin and ceramics. To form a laminate, known processes are used. For example, if dielectric ceramics is used, an LTCC (Low Temperature Co-fired Ceramics) technique or an HTCC (High Temperature Co-fired Ceramics) technique is adopted, and if resin is used, a build-up technique is adopted.

In the LTCC technique, for example, the laminated body can be formed by laminating and integrally sintering a plurality of ceramic green sheets having a thickness of 10 to 200 μm as insulator layers. The ceramic green sheets are composed of ceramic dielectrics capable of low-temperature sintering at 1000° C. or less and have a predetermined conductor pattern formed by printing conductive paste such as Ag and Cu. Examples of the ceramic dielectrics capable of low-temperature sintering include ceramics having Al, Si and Sr as chief ingredients, and Ti, Bi, Cu, Mn, Na, K, and the like as accessory ingredients, ceramics including Al, Mg, Si and Gd, and ceramics including Al, Si, Zr and Mg.

[3] Laminated Body 1

Figure 7A:
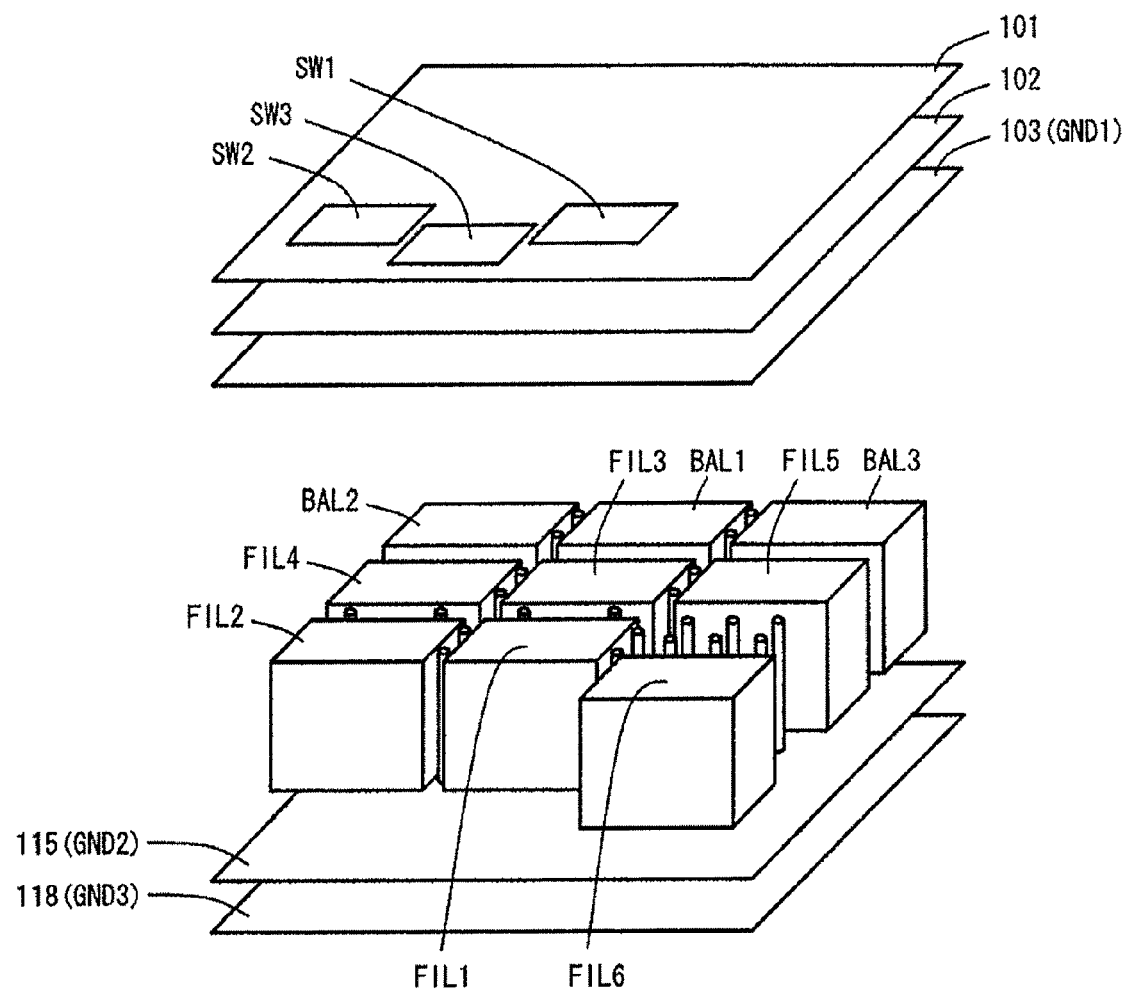
FIG. 7A is an explanatory diagram of a region on which filter circuits are formed in a laminated body according to the embodiment.
Figure 7B:
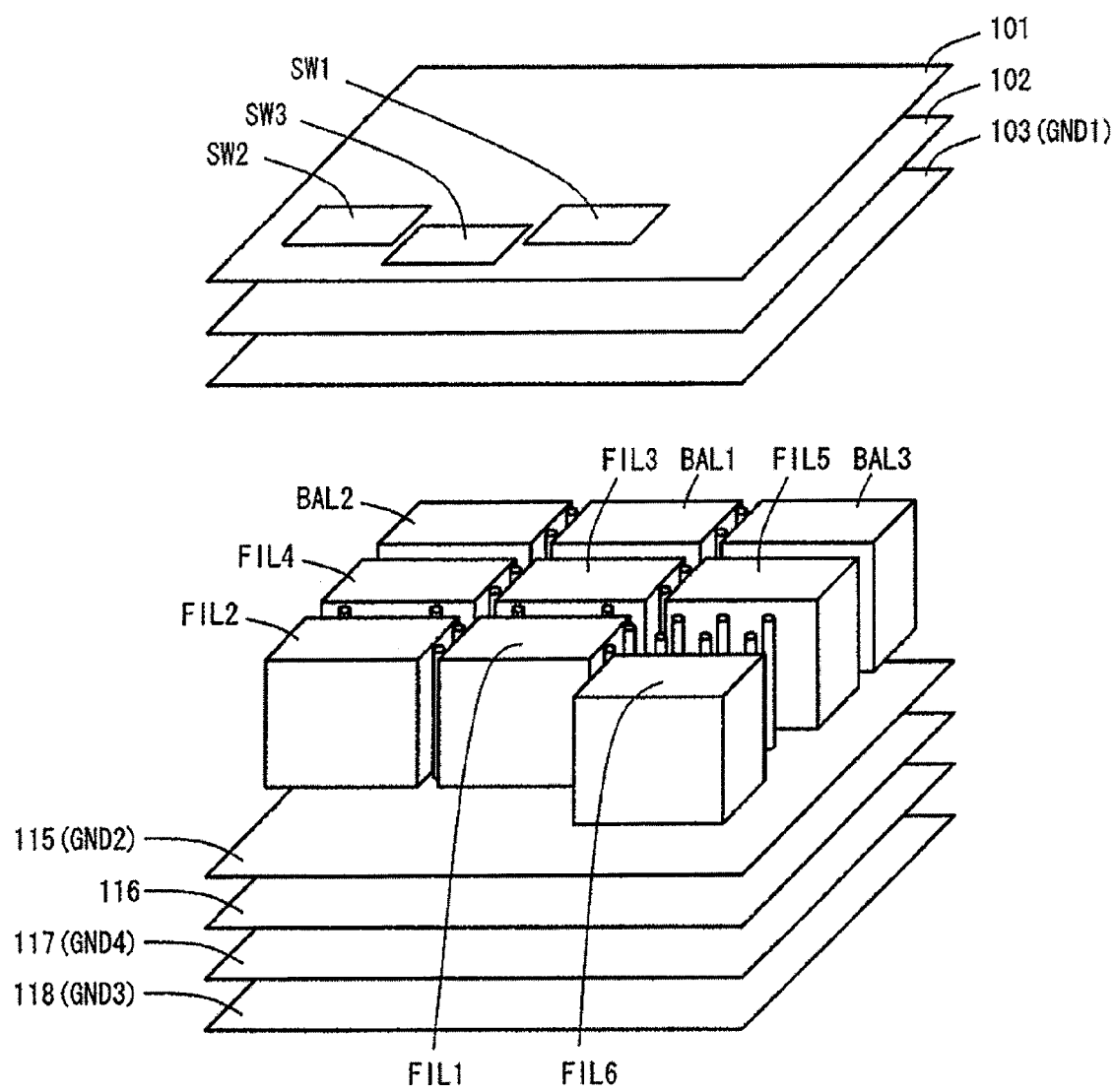
FIG. 7B is an explanatory diagram of the region on which the filter circuits are formed in the laminated body according to the embodiment.

FIGS. 7A and 7B are simplified perspective views showing, as an example of the laminated body in the embodiment, the region on which each filter circuit and each balanced/unbalanced converting circuit are formed.

Figure 8A:
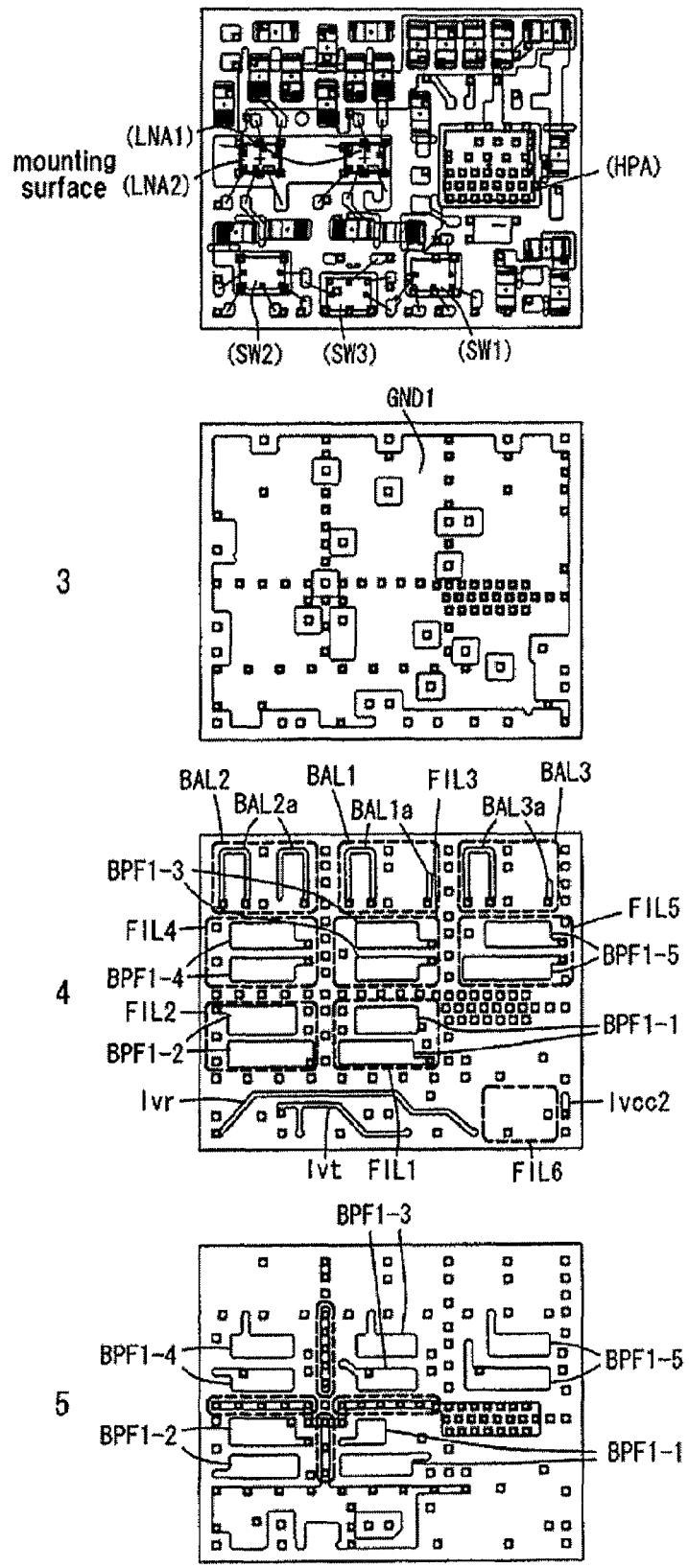
FIG. 8A is a laminate diagram illustrating layers of the laminated body according to the embodiment.
Figure 8B:
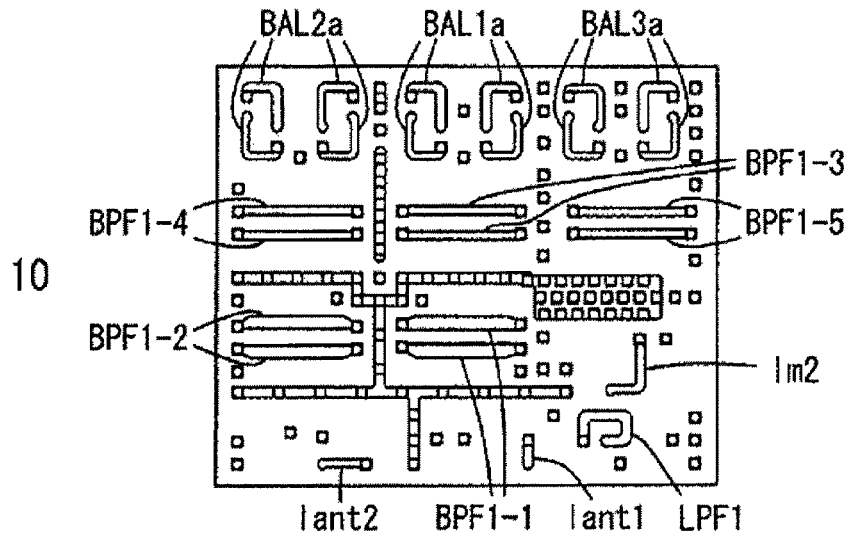
FIG. 8B is a laminate diagram illustrating layers of the laminated body according to the embodiment.
Figure 8B:
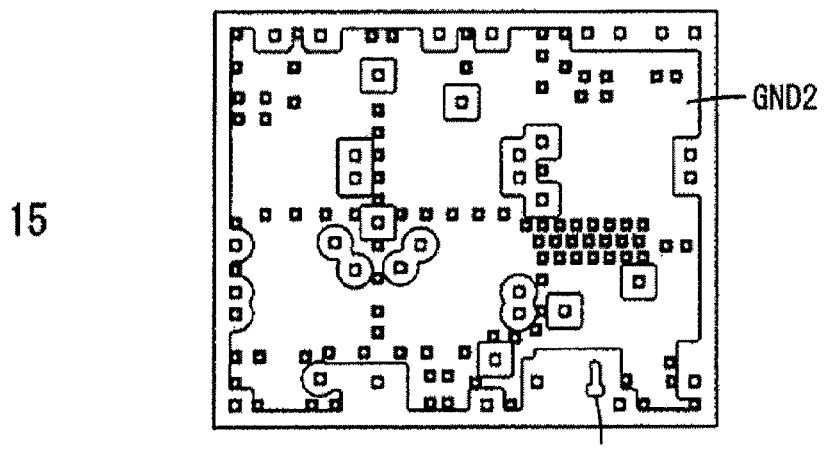
Figure 8B:
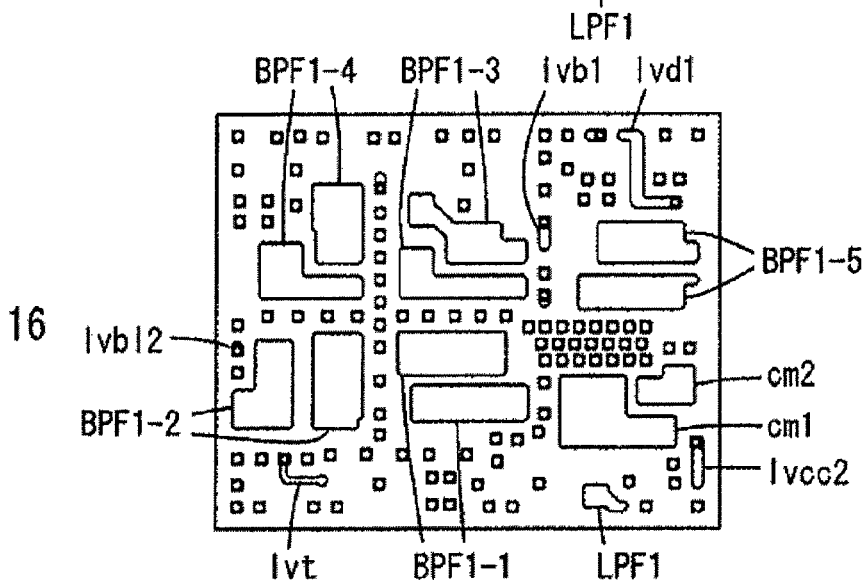

FIGS. 8A and 8B are diagrams of layers of the laminate illustrating an example of the embodiment in FIGS. 7A and 7B.

As can be seen from FIGS. 7A and 7B, the laminated body includes a layer 103 on which a first ground electrode is formed inside at an upper layer side (a side of the mounting surface compared with the center of the laminate), and a layer 115 in which a second ground electrode is formed inside at a lower layer side (the opposite side to the mounting surface) without another ground electrode being between the second ground electrode and the first ground electrode as seen in the lamination direction. The laminated body includes, between the first ground electrode and the second ground electrode, the regions FIL1 to 6 in each of which an electrode pattern of at least a part of each filter circuit is formed. The first ground electrode and the second ground electrode cover each region as seen in the lamination direction. It is preferable that the first ground electrode and the second ground electrode be formed so as to cover almost the entire layer of the laminated body. The regions FIL1 and FIL2, and the regions FIL3 and FIL4 are separated by shields (columnar portions in the figure) composed of a plurality of vias. The vias extend in substantially the lamination direction, and the same plane including the vias can be regarded as a shield. If required, a shield composed of a plurality of vias is formed. If required, a shield may be formed between other filter circuit regions. The shields are connected to the first and the second ground electrodes. The regions are electromagnetically partitioned by the shields and the ground electrodes. Thereby, interference of the circuit substrate, mounted components, and a power supply line formed in a layer outside the first and the second ground electrodes is restrained.

The laminated body in this embodiment includes between the first ground electrode layer 103 and the second ground electrode layer 115: the region FIL1 forming at least a part of the front-stage band-pass filter circuit BPF1-1 formed between the switching circuit and the low-noise amplifier LNA1; the region FIL3 forming at least a part of the rear-stage band-pass filter circuit BPF1-3 formed between the low-noise amplifier LNA1 and the first receiving terminal; and a region BAL1 forming at least a part of the balanced/unbalanced converting circuit BAL1a formed between the rear-stage band-pass filter circuit BPF1-3 and the first receiving terminal. These regions are formed so as not to overlap each other as seen from the lamination direction. These regions are arranged in this order, and the region BAL1, which is the balanced/unbalanced converting circuit, is disposed along a side of the laminated body. Shields composed of a plurality of vias are formed between the regions of the front stage and the rear-stage band-pass filter circuits.

Also, the laminated body of this embodiment includes between the first ground electrode layer 103 and the second ground electrode layer 115: the region FIL2 forming at least a part of a front-stage band-pass filter circuit BPF1-2 formed between the switching circuit and the low-noise amplifier LNA2; the region FIL4 forming at least a part of the rear-stage band-pass filter circuit BPF1-4 formed between the low-noise amplifier LNA1 and the second receiving terminal; and the region BAL2 forming at least a part of the balanced/unbalanced converting circuit BAL2a formed between the rear-stage band-pass filter circuit BPF1-4 and the second receiving terminal. These regions are formed so as not to overlap each other as seen from the lamination direction. These regions are arranged in this order, and the region BAL2, which is the balanced/unbalanced converting circuit, is disposed at a side of the laminated body. Shields composed of a plurality of vias are formed between the regions of the front-stage and rear-stage band-pass filter circuits.

Also, the laminated body of this embodiment includes between the first ground electrode layer 103 and the second ground electrode layer 115: the region FILE forming at least a part of the low-pass filter circuit LPF1 formed between the switching circuit and the high frequency amplifier HPA; the region FIL5 forming at least a part of the band-pass filter circuit BPF1-5 formed between the high frequency amplifier HPA and the transmitting terminal Tx; and a region BAL3 forming at least a part of the balanced/unbalanced converting circuit BAL3 formed between the band-pass filter circuit BPF1-5 and the transmitting terminal Tx. These regions are formed so as not to overlap each other as seen from the lamination direction. These regions are arranged in this order, and the region BAL3, which is the balanced/unbalanced converting circuit BAL3a, is disposed at a side of the laminated body. The shield composed of a plurality of vias is formed between the region FIL6 of the low-pass filter circuit LPF1 and the region FIL5 of the band-pass filter circuit BPF1-5. The shield is formed of a plurality of thermal vias.

FIL1 and FIL2, the regions of the front-stage band-pass filter circuits, do not overlap each other in the lamination direction and are adjacent to each other with the shield therebetween. Similarly, FIL3 and FIL4, the regions of the rear-stage band-pass filter circuits, do not overlap each other in the lamination direction and are adjacent to each other with the shield therebetween. Similarly, BAL1 and BAL2, the regions of the balanced/unbalanced converting circuits, do not overlap each other in the lamination direction and are adjacent to each other with the shield composed of a plurality of vias therebetween. The shields can ensure the isolation between each filter circuit and between the reception paths. If the band-pass filter circuit disposed on the transmission path is unnecessary, an electrode pattern for the filter circuit may not be formed in the region of FIL5. Similarly, if another filter circuit is unnecessary, the corresponding electrode pattern may not be formed.

Also, FIL6, the region of the low-pass filter circuit disposed on the transmission path, is formed so as not to overlap FIL1 and FIL2, the regions of the front-stage band-pass filter circuits in the lamination direction. Further, it is preferable that the regions of FIL1 and FIL6 be adjacent to each other with the shield composed of a plurality of vias therebetween. FIL5, the region of the band-pass filter circuit disposed on the transmission path, does not overlap the region of FIL3 in the lamination direction and FIL5 and FIL3 are adjacent to each other with the shield composed of a plurality of vias therebetween. BAL3, the region of the balanced/unbalanced converting circuit, does not overlap the region of BAL2 in the lamination direction and BAL3 and BAL2 are adjacent to each other with the shield composed of a plurality of vias therebetween. The shields can ensure the isolation between each filter circuit, and between the transmission path and the reception paths.

As an example is shown in FIG. 7B, a layer 116 forming a part of the electrode pattern of the filter circuit may be disposed above the first ground electrode layer 103 or below the second ground electrode layer 115. In such a case, the electrode pattern between the ground electrodes and the electrode pattern of a layer outside the ground electrodes are allowed to partially overlap each other in the lamination direction. Also, in a lower surface layer 118, a third ground electrode, of the laminated body, a conductor pattern covering a considerable part of a region including the center can be provided. Further, as a fourth ground electrode, a conductor pattern covering a considerable part of a region formed between the second ground electrode and the third ground electrode can be provided.

Next, the electrode patterns in relation to the above-described equivalent circuits in the laminated body will be described with reference to the laminate diagrams in FIGS. 8A and 8B.

A layer with the words "mounting surface" on an upper left in FIG. 8A is a simplified diagram in which the switching circuits SW1 to SW3, the high frequency amplifier HPA, the low-noise amplifiers LNA1 and LNA2, and each chip inductor, and each chip capacitor is arranged on the outermost layer (mounting surface) of the laminated body.

For the switching circuits on the mounting surface, the switch SW3 connected to the transmitting terminal is disposed between the switch SW1 connected to the first receiving terminal and the switch SW3 connected to the second receiving terminal, and the switches are arranged in the order of the first switch, the third switch, and the second switch in a predetermined direction, for example, along a side of the laminated body. It is preferable that a distance between the switch SW3 and the switch SW1 be equal to a distance between the switch SW3 and the switch SW2. Such arrangement easily allows connection portions formed of a connection wire on the mounting surface or an electrode pattern on the mounting surface to have substantially the same length, and a difference of insertion loss between both the reception paths can be reduced.

Also, the switch SW1 and the switch SW2 are arranged in parallel to a direction in which the region FIL1 and the region FIL2 in the laminated body are arranged. Further, it is preferable that the switches be arranged in this order. Such arrangement can reduce a length of a transmission line in the laminated body for connecting the switch SW1 to the filter circuit in the region FIL1 and a length of a transmission line in the laminated body for connecting the switch SW2 to the filter circuit in the region FIL2. Thereby, insertion loss can be reduced and in addition, interference of other circuit elements can be restrained. Also, a difference between insertion loss in the state where the transmitting terminal is connected to the first antenna terminal and insertion loss in the state where the transmitting terminal is connected to the second antenna terminal can be reduced.

A numeral on the left hand of each layer is sequentially assigned in accordance with the number of a particular layer in the laminate, with a first layer assigned to the mounting surface. In the figure, for the electrode pattern forming each filter circuit, names of the filter circuits (BPF1-1 to BPF1-5, LPF1, and BAL1a to BAL3a) are used.

Transmission lines for connecting wires of the switches to each other can be formed on the first layer.

On a second layer, being immediately below the mounting surface, a high frequency amplifier, a low-noise amplifier, and electrode patterns, which are power supply lines for driving or controlling the switches, are formed. Because these power supply lines are electromagnetically separated from filter circuits of layers under the third layer through the first ground electrode formed on a third layer, a cable can be relatively freely drawn around with isolation from the filter circuit ensured. Also, interference between the electrodes in the laminated body and active elements mounted on the top surface of the laminated body can be prevented.

On an upper left side of fourth to 14th layers, the region BAL2 is provided in which the electrode patterns of the balanced/unbalanced converting circuits BAL2a are formed. Although the region is represented with dashed lines only in the fourth layer shown in FIG. 8A, in the present embodiment, the same areas of the fourth to the 14th layers are also within the same region as seen in the lamination direction. The same holds true for other regions. Under the BAL2 in the figure, the region FIL4 is provided in which the electrode patterns of the band-pass filter circuits BPF1-4 are formed. Under the region FIL4 in the figure, the region FIL2 is provided in which the electrode patterns of the band-pass filter circuits BPF1-2 are formed.

Also, on the fourth to the 14th layers, on the right hand of the region BAL2 in the figures, the region BAL1 for the balanced/unbalanced converting circuits BAL1a is provided. Under the region BAL1 in the figure, the region FIL3 is provided in which the electrode patterns of the band-pass filter circuits BPF1-3 are formed. Under the region FIL3 in the figure, the region FIL1 is provided in which the electrode patterns of the band-pass filter circuits BPF1-1 are formed.

Also, on the fourth to the 14th layers, on the right hand of the region BAL1a in the figures, the region BAL3 for the balanced/unbalanced converting circuits BAL3a is provided. Under the region BAL3 in the figure, the region FIL5 is provided in which the electrode patterns of the band-pass filter circuits BPF1-5 are formed. Under the region FIL5 in the figure, a plurality of thermal vias for thermal radiation are provided on a setting area for the high frequency amplifier circuit on the mounting surface. The thermal vias may also be used as a shield. Under the thermal vias in the figure, the region FILE is provided in which the electrode patterns of the low-pass filter circuits LPF1 are formed. The electrode patterns of the low-pass filter circuits are formed on the ninth layer, the tenth layer, and the 11th layer, and not formed on the fourth layer, but for explanation, in the fourth layer, a position of a region on which these transmission lines are formed is indicated in the lamination direction.

In the laminate diagram of the fifth layer, the shields composed of a plurality of vias are enclosed by dotted lines. The shields are ground electrodes including a plurality of vias formed at positions being boundaries between the regions FIL1 and FIL2 and between the regions FIL3 and FIL4. The vias lead to both the first ground electrode GND1 and the second ground electrode GND2 of the third layer, and are formed of vias that are substantially linear in the lamination direction. Even if the vias are tilted a little, when the upper layer vias and the lower layer vias partially overlap each other as seen from the laminate direction, the vias sufficiently function as the shields. Also, on the fifth layer and the tenth layer, electrode patterns that connect the vias of these layers to each other are formed, and thereby shields extending in the in-plane direction as well as in the lamination direction are formed. It is preferable that the shields between FIL1 and FIL2, and between FIL3 and FIL4 be formed in parallel or on substantially the same plane. The regions FIL1 and FIL3 are formed in the same direction with the shield therebetween, and the regions FIL2 and FIL4 are also formed in the same direction with the shield therebetween.

The shields maintain isolation between the reception paths. Further, the shields are formed between the upper and lower, the first and the second ground electrodes GND1 and GND2, and thereby isolation from other circuits is maintained, and in particular, signal interference to the surface mount circuit components, a power supply terminal formed on the back of the laminated body, and the power supply line connected thereto can be restrained. For this reason, even in a complex circuit configuration, a circuit with less noise can be configured.

The region FIL3 and the region FIL5 are also separated by the shield.

The configurations of the band-pass filter circuit BPF1-1 and the band-pass filter circuit BPF1-2 in the laminated body will be described.

Capacities of the band-pass filter circuits BPF1-1 are formed on the fourth and fifth layers as DC cutting capacitors on the input/output terminal side of the band-pass filter circuits. The DC cutting capacitors are connected to resonance lines of the tenth to the 12th layers through the vias of the sixth to the ninth layers.

The resonance lines of the tenth layer are formed of an electrode pattern, both ends of which are connected to each other via through holes, across the three layers. Since the parallel lines are across multiple layers, insertion loss of the band-pass filter circuits can be improved. The resonance line of each band-pass filter is formed on a same dielectric layer, so that characteristics of the band-pass filter of two reception paths can be easily matched. Also, in order to provide matching of the transmission lines, a gap between the transmission lines, widths of the transmission lines, and lengths of the transmission lines may be adjusted.

Each of the resonance lines is substantially linear. Further, a plurality of resonance lines of the band-pass filter circuits BPF1-1 and a plurality of resonance lines of the band-pass filter circuits BPF1-2 are formed on substantially the same line. Such arrangement allows the band-pass filters to be closely disposed. It should be noted that in all the band-pass filters, the resonance lines, including other band-pass filter circuits described later, are similar in a longitudinal direction, and even in a high frequency component including five or more band-pass filters, band-pass filters can be closely disposed, which contributes to downsizing high frequency components. Also, because the band-pass filters are similar in the longitudinal direction, when the electrodes are formed by printing, advantageously, fluctuations in characteristics due to unevenness of shapes of the electrodes are restrained.

On a 16th layer, electrode patterns of grounded capacities are formed. Depending on the grounded capacities to the ground electrode, these grounded capacities may also be formed on a layer above the second ground electrode GND2. These grounded capacities may partially overlap electrode patterns of other filter circuits and balanced/unbalanced converting circuits.

If the lengths of drawn transmission lines for the reception path of the first receiving terminal and the second reception path are similar, the difference of insertion losses between both the reception paths can be reduced.

Thicknesses and a gap of the resonance lines of the band-pass filter circuits may be different because of different coupling amounts or the like.

A part of the transmission lines of the low-pass filter circuits is formed into a spiral shape in the laminated body.

The balanced/unbalanced converting circuits are connected with the first receiving terminals Rx1+ and Rx1− formed at the back of the bottom layer. The configuration of the balanced/unbalanced converting circuit BAL3a is substantially the same as those of the BAL1a and BAL2a, but the balanced/unbalanced converting circuit BAL3a is formed so that direct-current voltage can be simultaneously applied to a Tx− terminal and a Tx+ terminal by the DC feeding voltage.

A substantial entirety of the 15th layer is the second ground electrode GND2. Thereby, interference from the grounded capacitor formed on the 16th layer can be prevented. On the 16th layer, an electrode being a grounded capacitor of the band-pass filter is disposed. Similarly to the 15th layer, a fourth ground electrode GND4 is formed on an entirety of the 17th layer. The three layers can form a most part of the grounded capacitor of the band-pass filter circuit. Also, it is better for a sheet thickness of the laminated body of the three layers to be thinner than the other layers. The use of a thin sheet allows for having a small electrode area with a large capacitor, thereby enabling a high frequency component to be downsized.

It is preferable that a ground electrode covering a large area of the laminated body not be formed between the first and the second ground electrodes. The number of layers can be reduced and a profile can also be reduced. If a part of the electrode patterns of the filter circuits and the balanced/unbalanced converting circuits is formed on an outer side compared with the first and the second ground electrodes, the part may partially overlap the inner filter circuit as seen in the lamination direction via the ground electrode. Since the ground electrode can ensure isolation, partial overlapping is allowed.

Although a part of the electrode provided in the laminated body has been hereinbefore described, in the present embodiment, electrodes forming circuits from the antenna terminal ANT2 to the second receiving terminal Rx2 and electrodes forming circuits from the antenna terminal ANT1 to the transmitting terminal Tx are also disposed in the laminated body. Also in these circuits, a part of an inductance element and a capacitance element that form the band-pass filter circuits and the matching circuits are composed of electrodes in the laminated body. Also, active elements such as a switching circuit and a power amplifier are mounted on the top surface of the laminated body.

The transmission line on the second layer connected to a single pole terminal of the third switch SW3 is connected to the electrode pattern of the low-pass filter inside the laminated body through the first ground electrode on the third layer, and then connected to the surface mount high frequency amplifier again through the ground layer on the third layer and the first layer. A signal line is drawn inside the first ground electrode without the transmission path, most susceptible to other circuits, being formed on the second layer, which is substantially below the mounted plane. Thereby, isolation from other circuits is maintained, and in particular, signal interference to the surface mount circuit components and the control terminals can be restrained. For this reason, even in a complex circuit configuration, a circuit with less noise can be configured. Also, the transmission line on the second layer is formed so as to overlap a relatively large electrode pattern on the mounting surface on which the switch SW1 is mounted. Because the electrode pattern can restrain interference from a wire connecting the switches SW1 and SW3 to each other and a transmission line on the mounting surface, insertion loss in the transmission path between the switching circuit and the first antenna terminal can be reduced. Also, a difference between the insertion losses of transmission paths between the switching circuit, and the first and the second antenna terminals can be reduced.

The electrode pattern forming the transmission path led into the laminated body is disposed so as not to, as seen in the lamination direction, overlap the reception paths in the laminated body, including the low-pass filter circuit LPF1, in particular, a front-stage filter circuit disposed on the reception paths.

Such a configuration of each circuit can restrain interference between a transmission path and reception paths.

[4] Equivalent Circuit 2

(2) Second Embodiment

Figure 9:
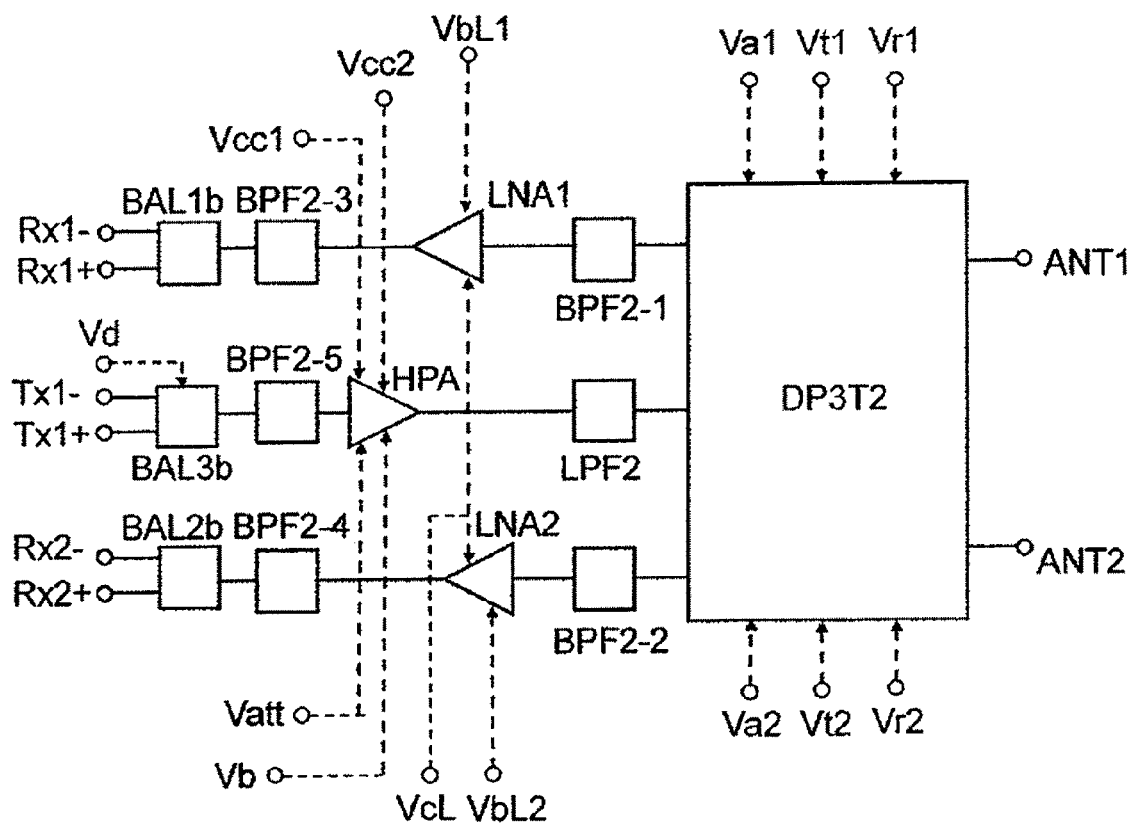
FIG. 9 is a block diagram of a high frequency circuit according to another embodiment.

FIG. 9 is a circuit block diagram according to another embodiment. FIG. 9 is substantially the same as the block diagram in FIG. 2, but unlike FIG. 2, a switching circuit DP3T2 is a chip switch integrated on a semiconductor substrate including a plurality of transistor circuits. As in FIG. 2, between the switching circuit DP3T2 and a first receiving terminal Rx1, filter circuits BPF2-1 and BPF2-3 are disposed at a front stage and a rear stage of a low frequency amplifier circuit LNA1. Similarly, filter circuits BPF2-2 and BPF2-4 are disposed between the switching circuit DP3T2 and a second receiving terminal Rx2. Also, filter circuits LPF2 and BPF2-5 are disposed between the switching circuit DP3T2 and a transmitting terminal Tx.

FIG. 9 shows the band-pass filter BPF2-5 between a high frequency amplifier circuit HPA and the transmitting terminal Tx for explanation, but FIGS. 10 to 13 show an embodiment without the band-pass filter BPF2-5.

Figure 10:
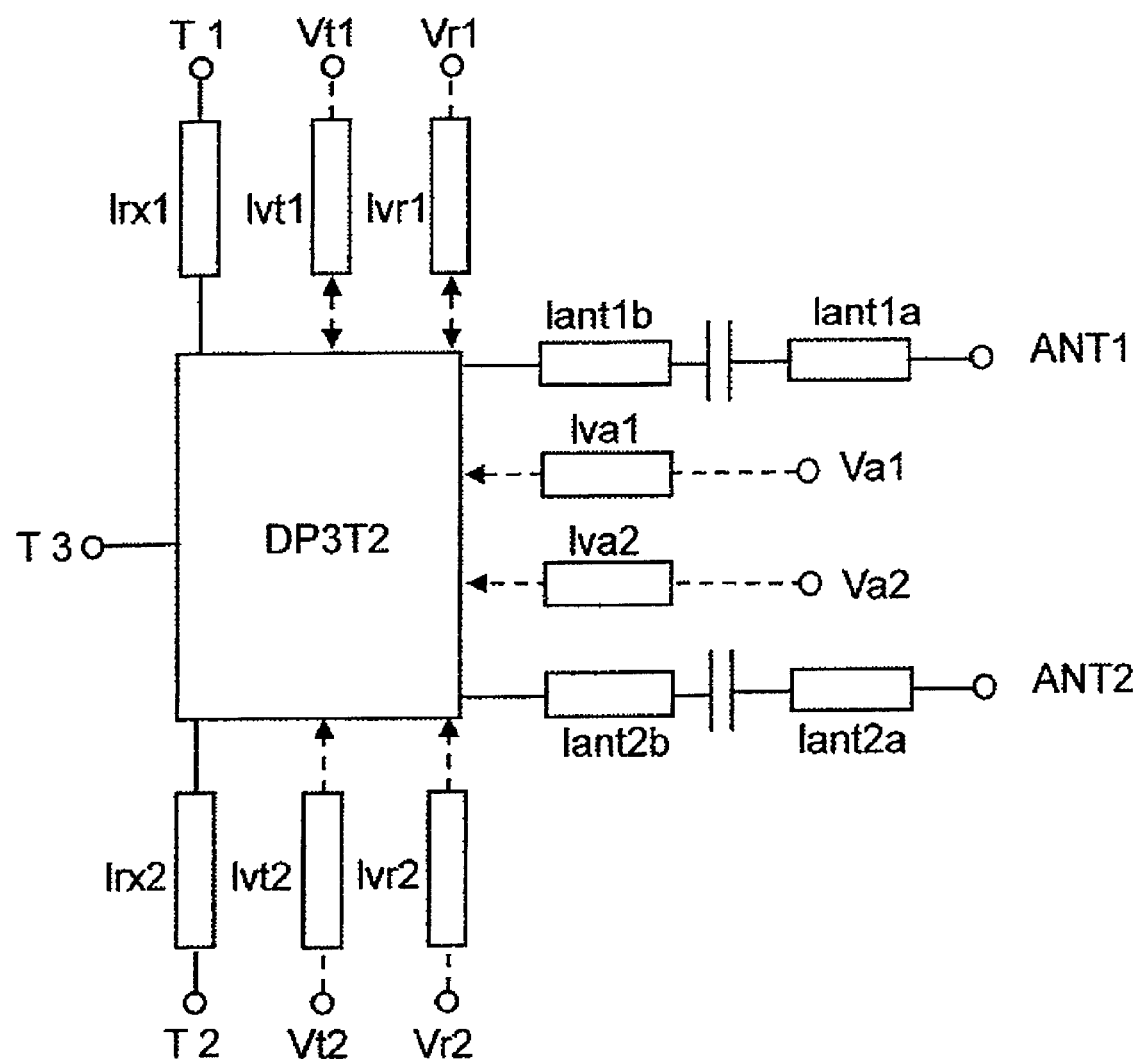
FIG. 10 is an equivalent circuit shown in the block diagram of FIG. 9.
Figure 11:
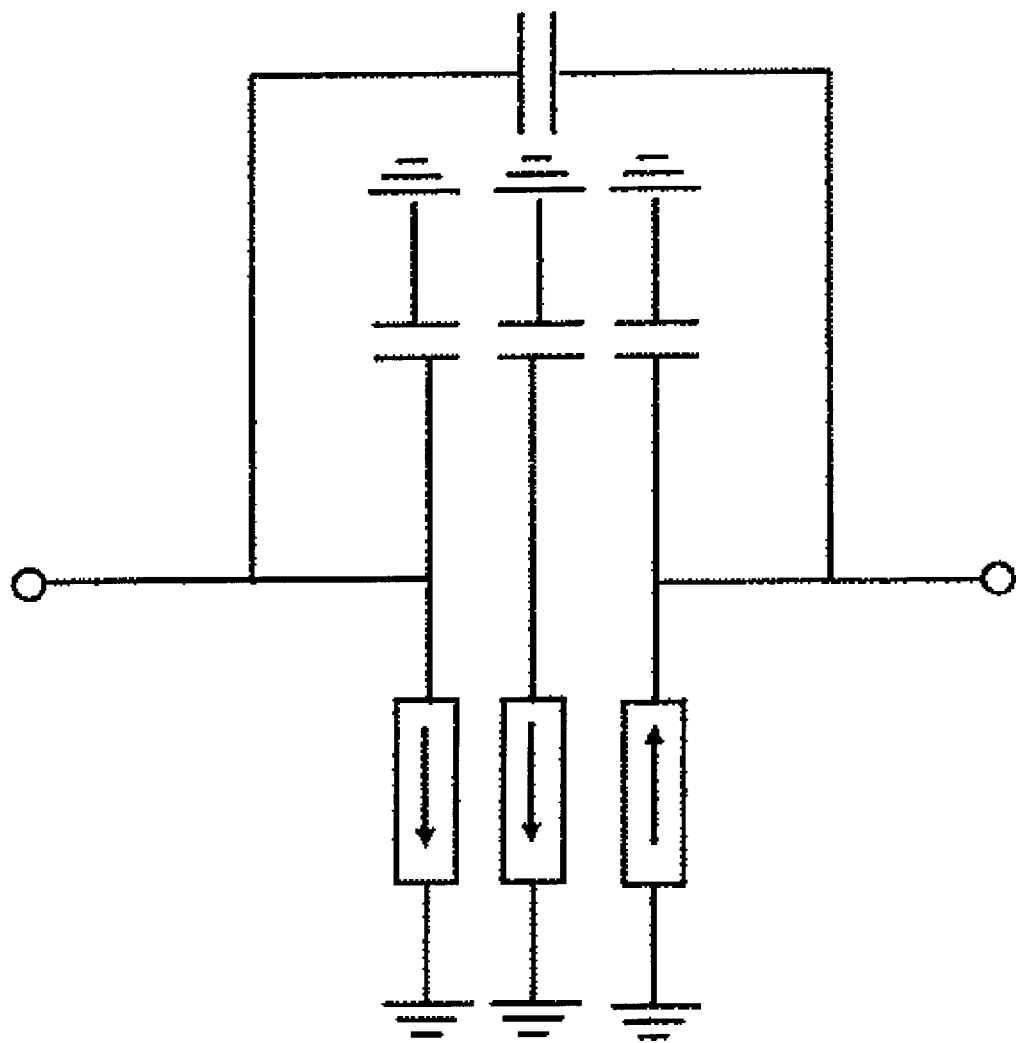
FIG. 11 is another portion of the equivalent circuit shown in the block diagram of FIG. 9.
Figure 12:
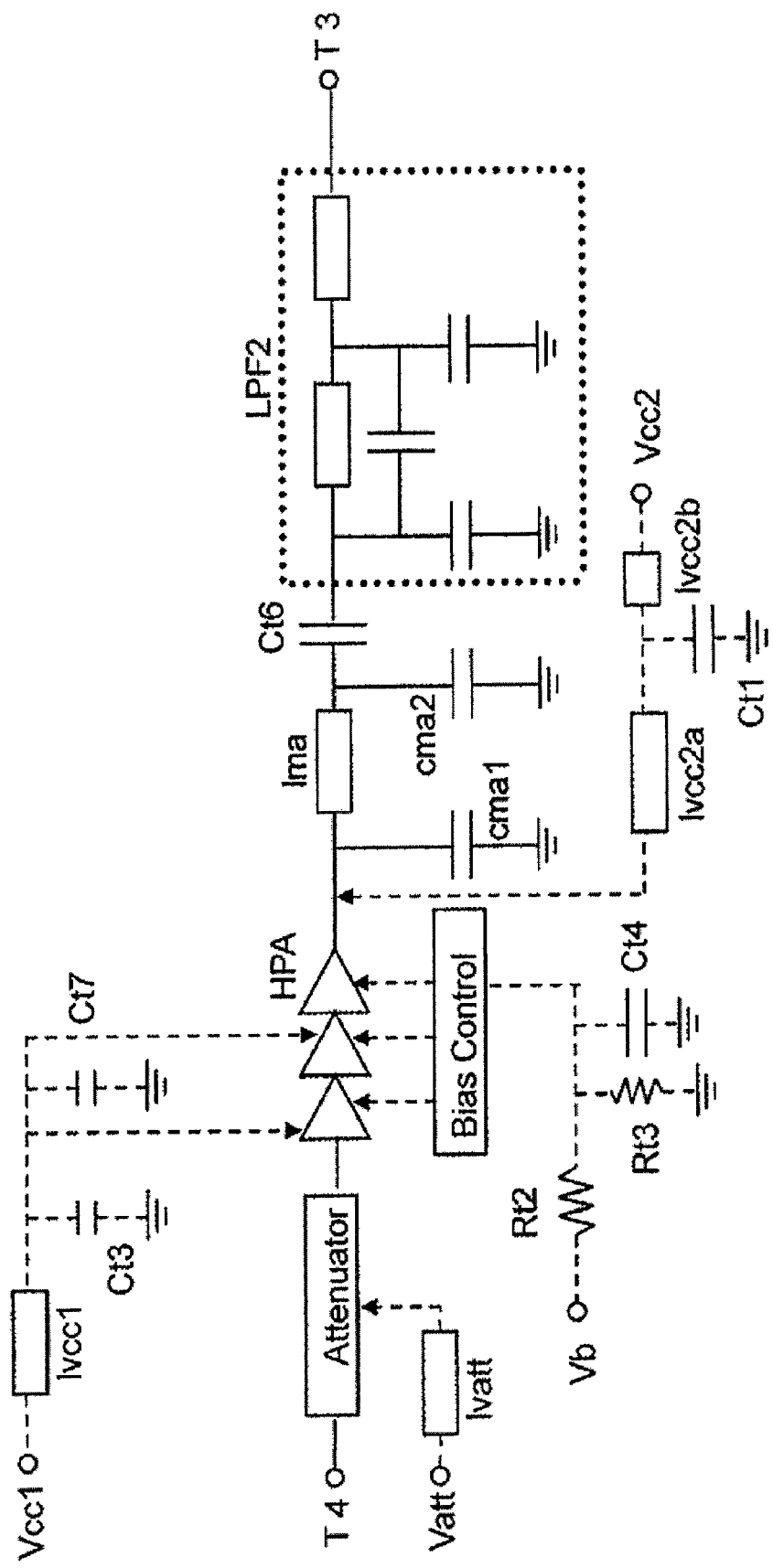
FIG. 12 is yet another portion of the equivalent circuit shown in the block diagram of FIG. 9.

FIGS. 10 to 12 illustrate equivalent circuits of the circuit block diagram in FIG. 9.

FIG. 10 is a diagram illustrating an equivalent circuit from the switching circuit DP3T2 to antenna terminals. Direct current cutting capacitors are disposed between the antenna terminals and the switching circuit, and matching circuits lant1a and lant2a are formed between the direct current cutting capacitors and the antenna terminals. Also, transmission lines lant1b and lant2b are an electrode pattern on a mounting surface, and connect a chip capacitor to the switching circuit DP3T2 on the mounting surface. The switching circuit DP3T2 will be described later.

FIG. 11 is an equivalent circuit for explaining the band-pass filter circuit BPF2-1. Unlike the equivalent circuit shown in FIG. 4, the equivalent circuit shown in FIG. 11 has a three-stage resonance line, but the others are the same as those of the band-pass filter circuit BPF1-1 shown in FIG. 4. Also, because configurations of the band-pass filter circuits BPF2-2, 2-3, and 2-4 are the same as the band-pass filter circuit BPF2-1, descriptions of the band-pass filter circuits BPF2-2, 2-3, and 2-4 will be omitted. The equivalent circuit from a rear stage of the switching circuit DP3T2 to the first and the second receiving terminals is similar to the equivalent circuit shown in FIG. 4, except for the configuration of this band-pass filter circuit.

The equivalent circuit from the transmitting terminal to a front stage of the high frequency amplifier circuit HPA is substantially the same as that of the balanced/unbalanced converting circuit BAL3$a$ in FIG. 5, so that a description thereof will be omitted. The equivalent circuit shown in FIG. 11 is different from that in FIG. 5 in that the equivalent circuit in FIG. 11 does not include a band-pass filter circuit.

FIG. 12 is a diagram illustrating an equivalent circuit from the transmitting terminal of the switching circuit DP3T2 to the high frequency amplifier circuit. Signals from the transmitting terminal are input into the high frequency amplifier circuit HPA through an attenuator. If required, the attenuator is controlled by a control voltage Vatt, and a transmission line Iva % a part of a power supply line, is formed as an electrode pattern in the laminated body.

The high frequency amplifier circuit HPA is driven by the voltage from the driving voltages Vcc1 and Vcc2. The voltage from the driving voltages Vcc1 and Vcc2 is, through a constant voltage supplying circuit, input to the high frequency amplifier circuit HPA. The constant voltage supplying circuit is formed of: an electrode pattern Ivcc1 formed in the laminated body and grounded capacities Ct3 and Ct7 mounted on the top surface of the laminated body; and electrode patterns Ivcc2$a$ and Ivcc2$b$ and a grounded capacitor Ct1 mounted on the top surface of the laminated body. Also, the high frequency amplifier circuit HPA is controlled by the voltage from a bias voltage Vb. The bias voltage Vb is, through a control voltage circuit for controlling output power, input to the high frequency circuit HPA. The control voltage circuit is formed of a grounded capacitor Ct4, a resistance Rt2, and a grounding resistance Rt3 mounted on the top surface of the laminated body.

The signals amplified by the high frequency amplifier circuit HPA are connected to a low-pass filter circuit LPF via an output matching circuit and a DC cutting capacitor Ct6. The output matching circuit is formed of an electrode pattern Ima, and grounded capacities cma1 and cma2 in the laminated body.

Laminated Body 2

The laminated body includes, similarly to FIGS. 7A and 7B, a layer on which a first ground electrode is formed inside at an upper layer side and a layer on which a second ground electrode is formed inside at a lower layer side, and the laminated body includes, between the first ground electrode and the second ground electrode, regions FIL1 to FIL6 in each of which an electrode pattern of at least a part of each filter circuit is formed.

However, in the laminated body, unlike the laminated body shown in FIG. 7A, FIG. 7B, FIG. 8A, and FIG. 8B, the regions FIL1, FIL3 and the regions FIL2, FIL4 are disposed along two opposing sides in the laminated body. In the regions FIL1 and FIL3, the filter circuits BPF 2-1 and 2-3, disposed on a reception path from the switching circuit to the first receiving terminal Rx1, are formed, and in the regions FIL2 and FIL4, the filter circuits BPF2-2 and 2-4, disposed on a reception path from the switching circuit to the second receiving terminal Rx2, are formed. Also, between the regions, the regions FIL6 and FIL5 are disposed in which the filter circuits LPF2-1 and BPF2-5, disposed on a transmission path from the switching circuit to the transmitting terminal Tx, are formed. As described above, the filter circuit BPF2-5 is not necessary for implementation. Also, another filter circuit may be removed. Details will be described in FIGS. 13A and 13B, the laminate diagrams.

Figure 13A:
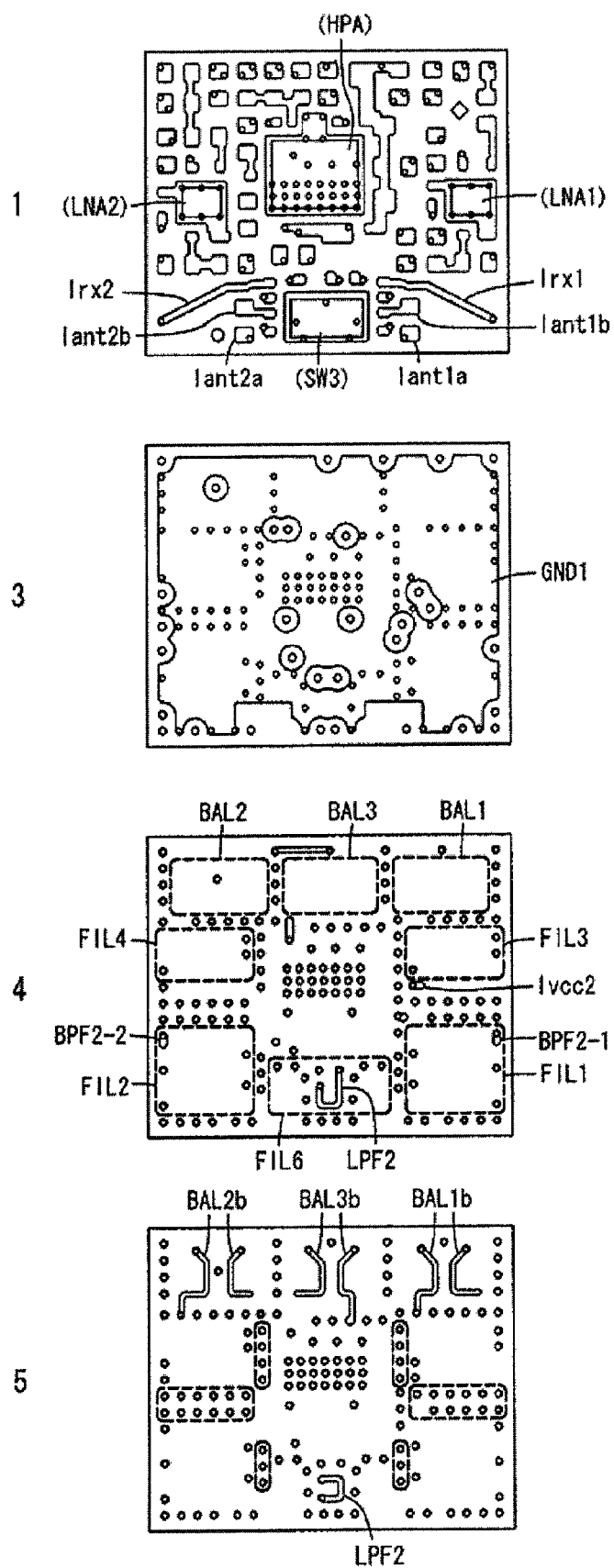
FIG. 13A is a laminate diagram illustrating layers of the laminated body according to the other embodiment.
Figure 13B:
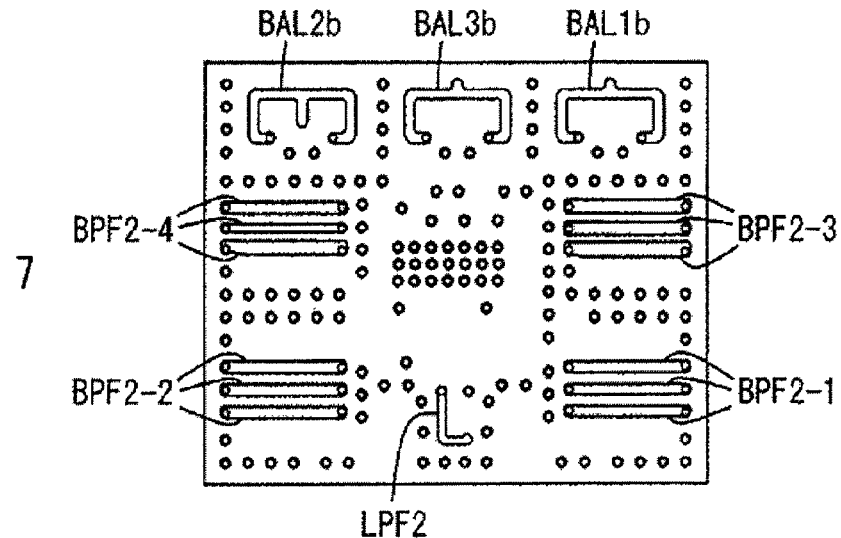
FIG. 13B is a laminate diagram illustrating layers of the laminated body according to the other embodiment.
Figure 13B:
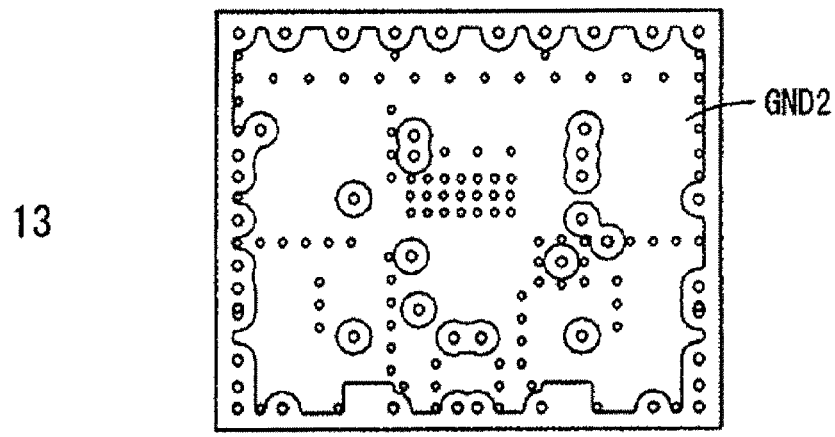
Figure 13B:
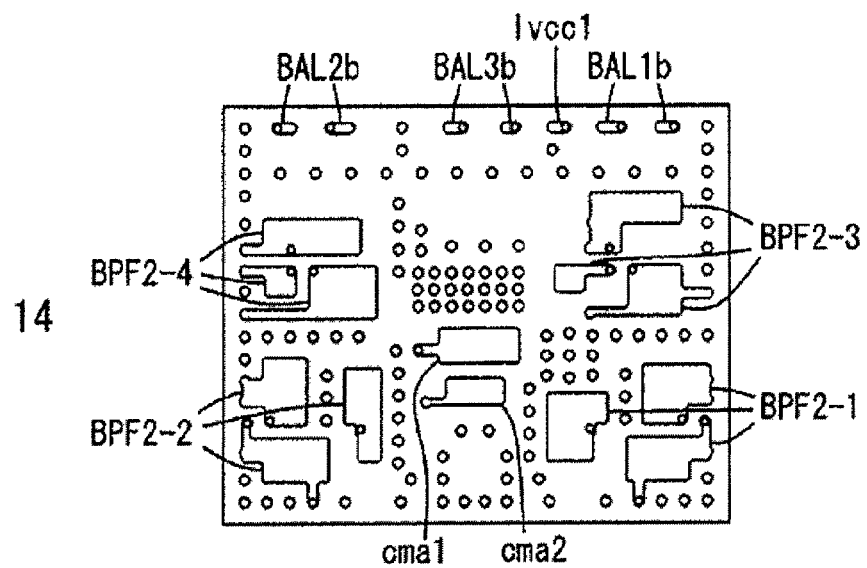

Next, with reference to FIGS. 13A and 13B, the electrode patterns in the laminated body will be indicated, and the electrodes relating to the equivalent circuits will be described. For the electrode pattern forming each filter circuit, names of the filter circuits (BPF2-1 to BPF2-4, LPF2, and BAL1$b$ to BAL3$b$) are used.

The first layer is a mounting surface of the high frequency circuit component. The switching circuit, a high frequency amplifier, a low-noise amplifier, and a plurality of chip inductors, and a chip capacitor are disposed on the mounting surface. For explanation, places on which the switching circuit DP3T2, the high frequency amplifier HPA, the low-noise amplifiers LNA1 and LNA2 are mounted are shown.

The switching circuit DP3T2 is disposed along a side of the mounting surface and around the middle point of the side. The electrode patterns lant1$a$ and lant2$a$, and lant1$b$ and lant2$b$, which are the reception paths, are symmetrically disposed from the switching circuit DP3T2. Also, the signal lines Irx1 and Irx2, which are the reception path between the first antenna terminal and the first receiving terminal and the reception path between the second antenna terminal and the second receiving terminal, are symmetrically disposed from the switching circuit. The signal lines are connected to vias formed at two opposing sides and connected with each filter circuit in the laminated body.

The switching circuit is disposed at a middle of one of the sides of the laminated body, and the reception path between the first antenna terminal ANT1 and the first receiving terminal Rx1, and the reception path between the second antenna terminal ANT2 and the second receiving terminal Rx2 are substantially symmetrically formed about the switching circuit in the laminated body, so that difference of insertion losses in both the reception paths can be reduced.

Also, if the reception paths are separately disposed right and left in the laminated body, the transmission path is necessarily formed at a center, and thereby an isolation between the reception paths is readily provided and difference between insertion losses can be reduced.

The low-noise amplifiers LNA1 and LAN2 are also substantially symmetrically disposed about the switching circuit SW3.

The high frequency amplifier HPA is disposed at substantially the center of the first layer. A plurality of vias are formed at the position where the high frequency amplifier circuit is disposed. The vias are used as thermal vias for thermal radiation and can be used as a part of a shield. It is preferable that the thermal vias connect the first ground electrode to the second ground electrode. It is expected that heat dissipation is improved using the ground electrodes. Also, because a plurality of vias are disposed between both the reception paths, the isolation between the reception paths can also be improved.

On the second layer, power supply lines for controlling the switching circuit are formed. These power supply lines are also symmetrically formed about the switching circuit as seen in the lamination direction. The power supply lines are symmetrically formed, so that difference of insertion losses of both the reception paths can be reduced. Because these power supply lines are electromagnetically separated from the filter circuits on the fourth and lower layers by the first ground electrode GND1 formed on the third layer, wires can be relatively freely drawn around with isolation from the filter circuits being ensured. In addition, interference between the electrodes in the laminated body and active elements or the like mounted on the top surface of the laminated body can be prevented.

Also, the low-pass filter circuit LPF2 is connected with the surface mount high frequency amplifier HPA through the ground layer on the third layer.

A signal line is drawn inside the first ground electrode with the transmission path, most susceptible to other circuits, being not substantially formed on the second layer, which is substantially below the mounting surface, and thereby isolation from other circuits is maintained, and in particular, signal interference to the surface mount circuit components and the control terminals can be restrained. For this reason, even in a complex circuit configuration, a circuit with less noise can be configured.

On an upper left side of the fourth to the 12th layers, the region BAL2 is provided on which the electrode patterns of the balanced/unbalanced converting circuit BAL2*b* are formed. Although the region is represented with dashed lines only in the fourth layer, in the present embodiment, the same areas of the fourth to the 13th layers are also within the same region as seen in the lamination direction. The same holds true for other regions.

Under the BAL2 in the figure, the region FIL4 is provided in which the electrode patterns of the band-pass filter circuits BPF2-4 are formed. Under the region FIL4 in the figure, the region FIL2 is provided in which the electrode patterns of the band-pass filter circuits BPF2-2 are formed.

Also, in the fourth to the 12th layers, on an upper right side of the figure, the region BAL1 is provided in which the electrode patterns of the balanced/unbalanced converting circuit BAL1*b* are formed. Under the region BAL1 in the figure, the region FIL3 is provided in which the electrode patterns of the band-pass filter circuits BPF2-3 are formed. Under the region FIL3 in the figure, the region FIL1 is provided in which the electrode patterns of the band-pass filter circuits BPF2-1 are formed.

Also, in the fourth to the 12th layers, between the region BAL1 and the region BAL2, the region BAL3 for the balanced/unbalanced converting circuit BAL3*b* of the transmission path is provided. Under the region BAL3 in the figure, a region is provided in which a plurality of thermal vias are formed. The thermal vias lead from a grounded surface of the high frequency amplifier circuit on the mounting surface via a region with less electrode patterns. Further, under the region in the figure, the region FIL6 is provided in which the electrode pattern of the low-pass filter circuit LPF1 is formed.

Between the region BAL3 and the region FIL6, the region FIL5 may also be provided in which the electrode pattern of the band-pass filter circuit BPF2-5 is formed between the transmitting terminal Tx and the high frequency amplifier circuit.

In the laminate diagram of the fifth layer, the shields composed of a plurality of vias are indicated with dotted lines. The regions FIL1 and FIL3 are separated, and the regions FIL2 and FIL4 are separated by the shields of the vias. Also, shields are formed on the left hand of the regions FIL1 and FIL3 and on the right hand of the regions FIL2 and FIL4. The region FIL6 for the low-pass filter circuit and the region FIL1 for the band-pass filter circuit BPF2-1 are separated and the region FIL6 for the low-pass filter circuit and the region FIL2 for the band-pass filter circuit BPF2-2 are separated by a part of the shields. The vias lead to both the first ground electrode and the second ground electrode. The shields maintain isolation between the reception paths. Further, the shields are formed between the upper and lower ground electrodes, and thereby isolation from other circuits is maintained, and in particular, signal interference to the surface mount circuit components and the control terminals can be restrained. For this reason, even in a complex circuit configuration, a circuit with less noise can be configured.

The shield between the regions FIL1 and FIL3, and the shield between the regions FIL2 and FIL4 can prevent interference between the filter circuits at the front stage and the rear stage and allow passing of signals only within a desired frequency band, thereby contributing to the improvement of the communication characteristics.

The electrode pattern forming the transmission path including the low-pass filter circuit LPF1 led into the laminated body is disposed so as not to, as seen in the lamination direction, overlap the reception paths in the laminated body, in particular, a front-stage filter circuit disposed on the reception paths. Difference of insertion losses in both the reception paths can be reduced.

A part of the transmission lines of the low-pass filter circuit is formed into a spiral shape in the laminated body. The switching circuit DP3T2 is disposed on the mounting surface so as to overlap a region in which the electrode pattern of the low-pass filter circuit LPF2 in the laminated body is formed. Because the switching circuit DP3T2 is close to the low-pass filter circuit LPF2, the transmission line of the transmission path can be shortened, and thereby reduction of insertion loss can be controlled.

The balanced/unbalanced converting circuits are connected with the first receiving terminals Rx1+, Rx1−, Rx2+, and Rx2− formed on the back of the bottom layer. The configuration of the balanced/unbalanced converting circuit BAL3*a* is substantially the same as those of the BAL1*b* and BAL2*b*, but a transmission line of the second layer drawn from the mounting surface is connected with the unbalanced-side line.

The 13th and 14th layers will be described. The second ground electrode GND2 is formed on a substantial entirety of the 13th layer. Thereby, interference from the grounded capacities formed on the 14th layer can be prevented. Also, a fifth ground electrode GND5 is formed on a substantially entirety of the 15th layer. Similarly, the fourth ground electrode GND4 is formed on an entirety of the 17th layer. The five layers may form the grounded capacitor of the band-pass filter circuit.

[6] Switching Circuit

The switching circuit DP3T1 in FIG. 2 will be described below. The switching circuit DP3T1 includes terminals connected to the first and the second antenna terminals ANT1 and ANT2 (hereinafter, for simplicity in descriptions of the switching circuits, referred to as the antenna terminals ANT1 and ANT2, the same names) and terminals connected to the transmitting terminal Tx1 and the first and the second receiving terminals Rx1 and Rx2 for a first communication system (hereinafter, simply referred to as the transmitting terminal Tx, the first receiving terminal Rx1, and the second receiving terminal Rx2).

The first to the third switches SW1, SW2, and SW3 can be used for the switching circuit DP3T1 in FIG. 2. Three switches used in this embodiment are all the single-pole double-throw switches SW1, SW2, and SW3.

As shown in the mounting surface in FIGS. 8A to 8B, these switches SW1, SW2, and SW3 are disposed on the mounting surface of the laminated body, and terminals of each switch are connected with each other using wires, transmission lines on the mounting surface, or the like.

In the switching circuit DP3T1 shown in FIG. 2, for the switch SW1, a single pole terminal is connected with the first antenna terminal ANT1, one of double-throw terminals is connected with the first receiving terminal Rx1, and the other is connected with one of double-throw terminals of the switch SW3 described later. For the switch SW2, a single pole terminal is connected with the second antenna terminal ANT2, one of double-throw terminals is connected with the second receiving terminal Rx2, and the other is connected with the other of the double-throw terminals of the switch SW3. For the switch SW3, a single pole terminal is connected with the transmitting terminal Tx, and the two of the double-throw terminals are connected to the double-throw terminals of the switches SW1 and SW2 as described above. The switch SW3 can switch the connection to the switch SW1 or the switch SW2. It is preferable that the switches SW1 and SW2 be connected with a same control terminal. The number of terminals can be decreased, and thus a size and the number of power supply lines can be reduced, and thereby interference to other circuit elements in the high frequency circuit component can be reduced.

If such a configuration is adopted for the switching circuit, it is preferable that a capacitor not be disposed on the paths for connecting the switch SW1 with the switch SW3 and the switch SW2 with the switch SW3. The number of components can be reduced and insertion loss may also be reduced. Further, if the switches are mounted on the surface of the laminated body, the switching circuit can be downsized by the reduction of the number of components. Since it is not necessary to dispose a capacitor between the switches, a mount area of the switching circuit can be reduced. In particular, it is preferable that such a capacitor not be disposed at a side where double-pole terminals of a switch are connected each other.

FET elements may be used as the foregoing switches, but other transistor elements may also be used. As a FET element, a p-HEMT (pseudomorphic high electron mobility transistor) was used. In this embodiment, even if a drain electrode and a source electrode in the FET element are reversed, the high frequency circuit can have the same function.

Figure 14:
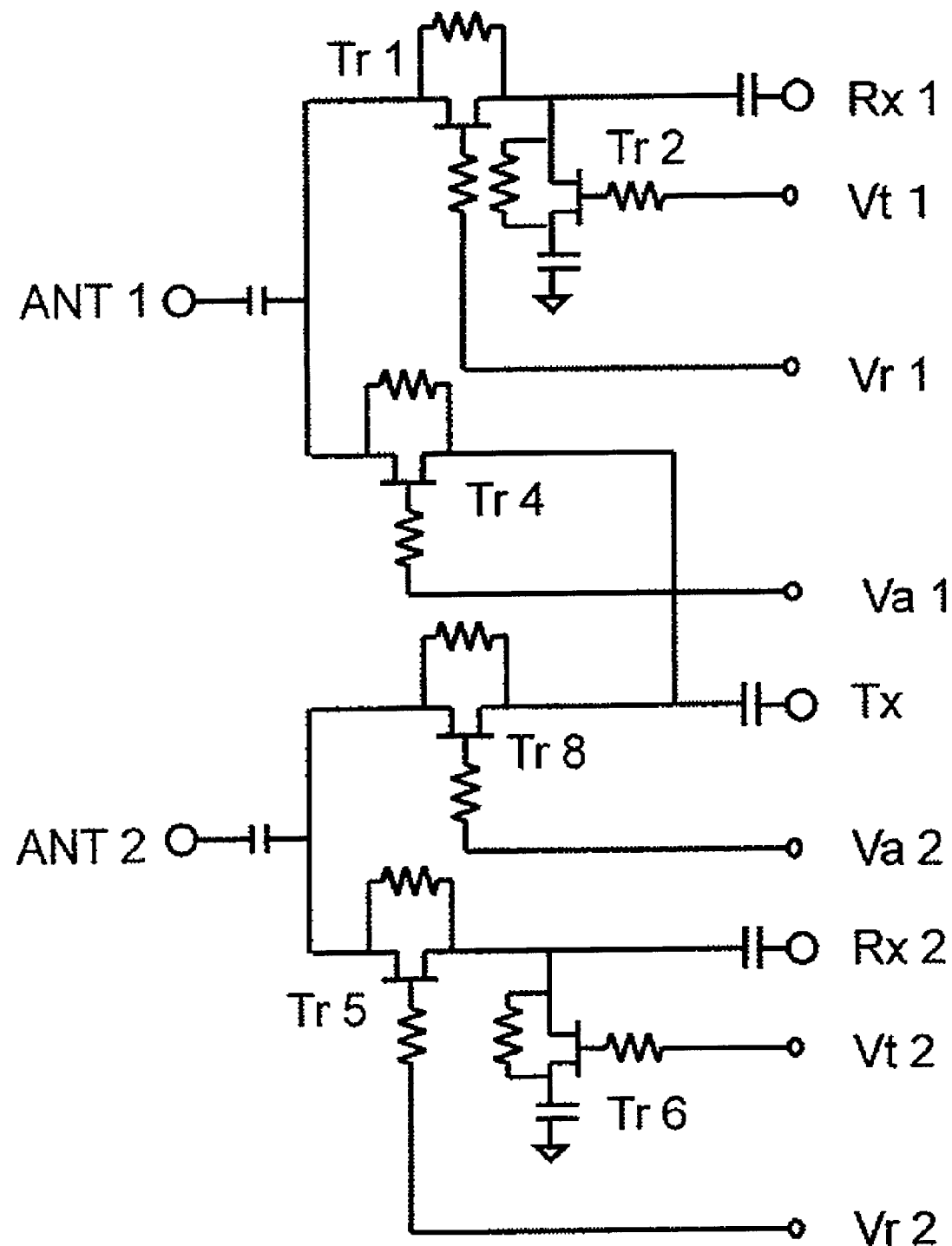
FIG. 14 is an explanatory diagram of a switching circuit used in the embodiment.

FIG. 14 illustrates an example of an equivalent circuit diagram of the switching circuit DP3T2 that can be used in the embodiment shown in FIG. 9. Although the switching circuit DP3T1 uses a plurality of switches, the switching circuit DP3T2 in FIG. 14 uses a combination of six or more transistor elements on an integrated semiconductor substrate. The switching circuit DP3T2 can perform substantially the same switching operation as that of the switching circuit DP3T1 shown in FIG. 2. Also, since all the transistors can be disposed on one semiconductor substrate, the switching circuit can be downsized.

The switching circuit in FIG. 14 is composed of a first, a second, a fourth, a fifth, a sixth, and an eighth transistor. FET elements were used as the transistors. Hereinafter, the transistors are called the FET elements.

One of a drain electrode and a source electrode of a first FET element Tr1 is connected with the first antenna terminal ANT1, and the other is connected with the first receiving terminal Rx1. Also, the gate electrode of the first FET element Tr1 is connected with a power supply line of a control terminal Vr1.

One of a drain electrode and a source electrode of a fourth FET element Tr4 is connected with the first antenna terminal, and the other is connected with the transmitting terminal Tx. The gate electrode of the fourth FET element Tr4 is connected with a power supply line of a control terminal Va1.

One of a drain electrode and a source electrode of a fifth FET element Tr5 is connected with the second antenna terminal ANT2, and the other is connected with the second receiving terminal Rx2. Also, the gate electrode of the fifth FET element Tr5 is connected with a power supply line of a control terminal Vr2.

One of a drain electrode and a source electrode of an eighth FET element Tr8 is connected with the second antenna terminal, and the other is connected with the transmitting terminal Tx. The gate electrode of the eighth FET element Tr8 is connected with a power supply line of a control terminal Va2.

One of a drain electrode and a source electrode of a second FET element Tr2 is connected with a node between the first FET element Tr1 and the first receiving terminal, and the other is grounded. The gate electrode of the second FET element Tr2 is connected with a power supply line of a control terminal Vt1.

One of a drain electrode and a source electrode of a sixth FET element Tr6 is connected with a node between the fifth FET element Tr5 and the second receiving terminal, and the other is grounded. The gate electrode of the sixth FET element Tr6 is connected with a power supply line of a control terminal Vt2.

DC cutting capacitors for cutting direct-current power supply can be disposed at the first and the second antenna terminals ANT1 and ANT2, the first and the second receiving terminals Rx1 and Rx2, and the transmitting terminal Tx. DC cutting capacitors can also be disposed between the second FET element Tr2 and ground, and between the sixth FET element Tr6 and ground.

If diplexer circuits are connected to the first and the second receiving terminals Rx1 and Rx2, and the transmitting terminal Tx to branch signals within a frequency band of a first communication system and signals within a frequency band of a second communication system, the high frequency circuit can be applicable to the two different communication systems.

For example, in order to connect each of the antenna terminals ANT1 and ANT2 with the transmitting terminal Tx and each of the receiving terminals Rx1 and Rx2, voltage of each control terminal may be controlled as in the following table. Modes Tx1, Tx2, and Rx and connections of the terminals are the same as in the description in relation to Table 1.

TABLE 2

| Mode | Vt1 | Vt2 | Vr1 | Vr2 | Va1 | Va2 | Vatt | Vb | VbL1 | VbL2 | Vcc1 | Vcc2 | VcL | Vd |
|---|---|---|---|---|---|---|---|---|---|---|---|---|---|---|
| Tx1 | 3.0 | 3.0 | 0.0 | 0.0 | 3.0 | 0.0 | 0.0 | 3.0 | 0.0 | 0.0 | 3.5 | 3.5 | 3.0 | 0.0 |
| Tx2 | 3.0 | 3.0 | 0.0 | 0.0 | 0.0 | 3.0 | 0.0 | 3.0 | 0.0 | 0.0 | 3.5 | 3.5 | 3.0 | 0.0 |
| Rx | 0.0 | 0.0 | 3.0 | 3.0 | 0.0 | 0.0 | 0.0 | 0.0 | 3.0 | 3.0 | 3.5 | 3.5 | 3.0 | 0.0 |

Because the control terminals Vt1 and Vt2 always apply voltage of the same level (connection/disconnection), the control terminals may be common. Also, with the signal path between the first antenna terminal ANT1 and the transmitting terminal Tx being connected, the control terminals Vt1 and Vt2 apply high voltage to the FET elements Tr2 and Tr6, and since the drain electrode and the source electrode of the FET switch is connected with each other, a shunt circuit grounded from a node between the first receiving terminal Rx1 and the first FET element Tr1 and a shunt circuit grounded from a node between the second receiving terminal Rx2 and the fifth FET element Tr5 are formed, so that isolation between the transmission path and the reception paths can be ensured.

Because the switching circuit in this embodiment has such a configuration, the second and the sixth transistor elements Tr2 and Tr6 may have a smaller number of gates and lower dielectric withstanding voltage than those of the first, the fourth, the fifth, the eighth FET elements Tr1, Tr3 to Tr5. FET elements with a small number of gates are advantageous because the size, the cost and the loss are low. The level of the dielectric withstanding voltage can be judged with reference to a value of power durability for keeping electric power from leaking toward the source terminal when a high frequency power is applied from a drain terminal to a FET element in which the gate and the source are unconnected.

A reason for the above will be described in detail below. If the signal path from the transmitting terminal Tx to the first antenna terminal ANT1 is connected, since the second antenna terminal ANT2 is disconnected from the transmission path in terms of high frequency, the eighth FET element Tr8 is switched off. Also, the first FET element Tr1 is also unconnected so as to prevent signals from leaking toward the first receiving terminal. Thus, to the second FET element Tr2 connected to the transmitting terminal Tx via the first FET element Tr1a high voltage is not directly applied, so that the second FET element Tr2 may have low dielectric withstanding voltage.

Also, the first antenna terminal ANT1 is connected with the first receiving terminal Rx1 to receive signals. At this time, an on-state arises in which the drain and the source of the first FET element Tr1 is connected with each other, and the second and the fourth FET elements Tr2 and Tr4 are unconnected. Because the power of reception signals is much lower than the signal power on a transmission path, the second FET element may have low dielectric withstanding voltage.

The dielectric withstanding voltage of the sixth FET element Tr6 may also be low for the same reason.

While the drain and the source of a FET element are being unconnected, if high frequency signals with substantially high power are applied, the voltage between the gate and the source exceeds a threshold, and then the drain-source of the FET element can no longer be in the off-state. As a result, distortion of harmonics and intermodulation is generated. For this reason, it is preferable that the transistor circuit have sufficiently high dielectric withstanding voltage to prevent such distortion from occurring.

Figure 15:
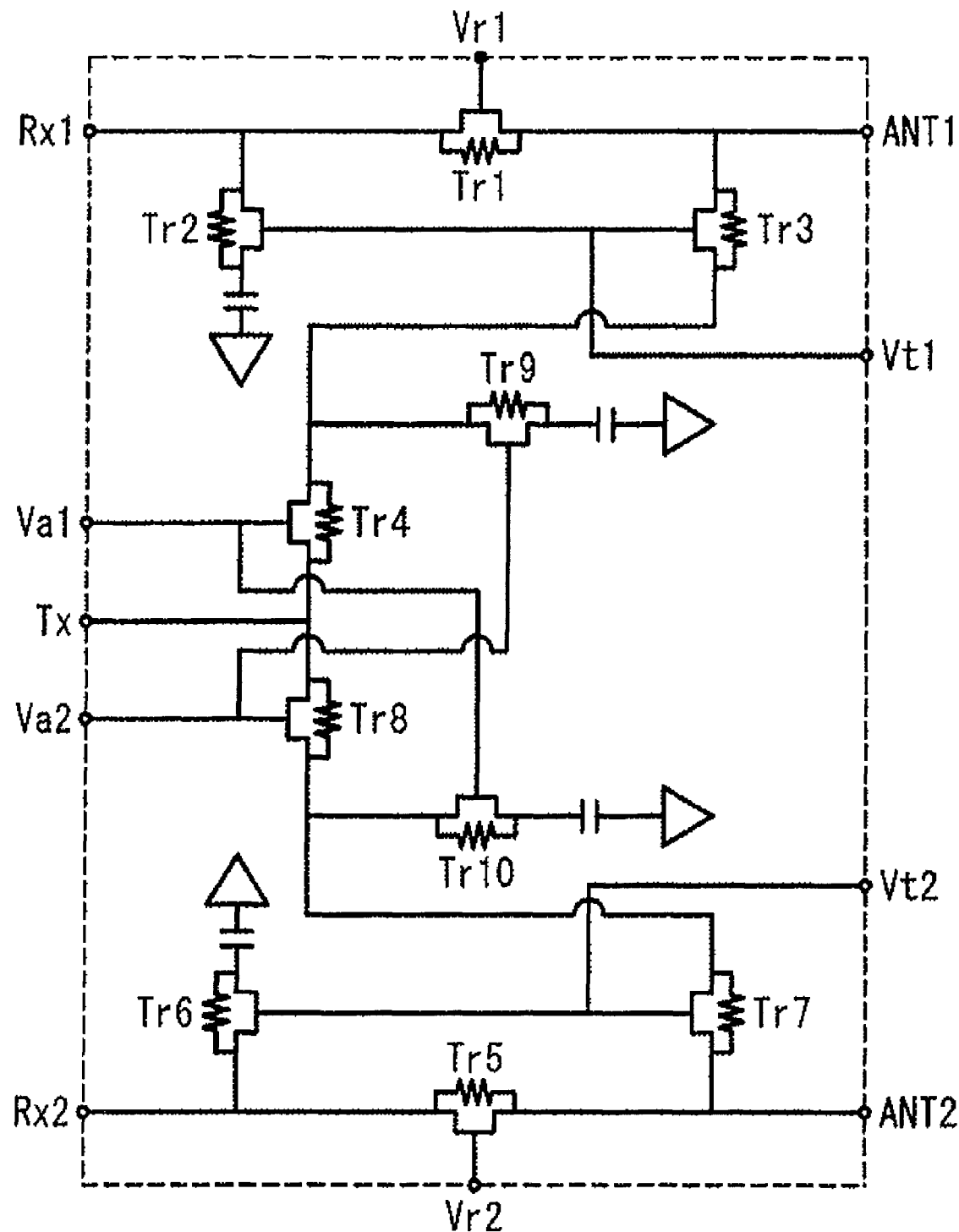
FIG. 15 is an explanatory diagram of another switching circuit used in the embodiment.

FIG. 15 is a diagram illustrating another embodiment of the switching circuit DP3T2. The same FET elements as those in FIG. 14 will not be redundantly described.

The third FET element Tr3 and the fourth FET element Tr4 are disposed on a signal path from the first antenna terminal ANT1 to the transmitting terminal Tx. One of the drain electrode and the source electrode of the third FET element Tr3 is connected with the first antenna terminal ANT1, and the other is connected with the fourth FET element Tr4. One of the drain electrode and the source electrode of the fourth FET element Tr4 is connected with the third FET element Tr3, and the other is connected with the transmitting terminal Tx. The gate electrode of the third FET element Tr3 is connected with the power supply line of the control terminal Vt1, and the gate electrode of the fourth FET element Tr4 is connected with the power supply line of the control terminal Va1.

The seventh FET element Tr4 and the eighth FET element Tr8 are disposed on a signal path from the second antenna terminal ANT2 to the transmitting terminal Tx. One of the drain electrode and the source electrode of the seventh FET element Tr7 is connected with the second antenna terminal ANT2, and the other is connected with the eighth FET element Tr8. One of the drain electrode and the source electrode of the eighth FET element Tr8 is connected with the seventh FET element Tr7, and the other is connected with the transmitting terminal Tx. The gate electrode of the seventh FET element Tr7 is connected with the power supply line of the control terminal Vt2, and the gate electrode of the eighth FET element Tr8 is connected with the power supply line of the control terminal Va2.

One of the drain electrode and the source electrode of the ninth FET element Tr9 is connected with a node between the third FET element Tr3 and the fourth FET element Tr4, and the other is grounded. A capacitor may be disposed on a signal path between the ninth FET element Tr9 and ground. Also, the gate electrode of the ninth FET element Tr9 is connected to the power supply line of the control terminal Va2, the line being shared by the eighth FET element Tr8.

One of the drain electrode and the source electrode of the tenth FET element Tr10 is connected with a node between the seventh FET element Tr7 and the eighth FET element Tr8, and the other is grounded. The capacitor may be disposed on the signal path between the tenth FET element Tr10 and ground. Also, the gate electrode of the tenth FET element Tr10 is connected to the power supply line of the control terminal Va1, the line being shared by the fourth FET element.

Since the eighth and the ninth FET elements Tr8 and Tr9, and the fourth and the tenth FET elements Tr4 and Tr10 share the power supply line, the same on/off state of each set of FET elements can be achieved. Thus, for example, when signals flow on a path from the first transmitting terminal Tx to the first antenna terminal, effects of leakage signals that leak toward the second antenna terminal via the eighth FET element Tr8 can be reduced. Also, sharing a power supply terminal can reduce the number of power supply terminals and power supply lines, thereby facilitating the simplification and downsizing of a circuit component.

Also, one of the drain electrode and the source electrode of the second FET element Tr2 is connected with a node between the first FET element and the first receiving terminal Rx1, and the other is grounded. In this case, the gate electrode of the second FET element Tr2 may be connected to the power supply line of the control terminal Vt1, the line being shared by the third FET element Tr3. A capacitor may be disposed between the second FET element Tr2 and ground.

Similarly, one of the drain electrode and the source electrode of the sixth FET element Tr6 is connected to a node between the fifth FET element and the second receiving terminal Rx2, the other is grounded. In this case, the gate electrode of the sixth FET element Tr6 is connected to the power supply line of the control terminal Vt2, the line being shared by the seventh FET element Tr7. A capacitor may be disposed between the sixth FET element Tr6 and ground.

For the high frequency circuit used in this embodiment, sharing a power supply terminal as described above can reduce the number of power supply terminals and power supply lines, thereby facilitating the simplification and downsizing of a circuit component.

When the first receiving terminal is connected to the first antenna terminal, if the second receiving terminal is simultaneously connected to the second antenna terminal by switching, the control terminals Vr1 and Vr2, and Vt1 and Vt2 may also be common.

It should be noted that if the third FET element Tr3 and the seventh FET element Tr7 are not included, the switching circuit may be used as the high frequency circuit component of the embodiment, but using the switching circuit including the seventh FET element Tr7 and the sixth FET element Tr6, the isolation between a transmission path and a reception path can be easily ensured.

In the switching circuit in FIG. 15, if the second and the sixth transistor circuits Tr2 and Tr6 are used, it is preferable that at least one of the second and sixth transistor circuits Tr2 and Tr6 be lower than the fourth and eighth transistor circuits Tr4 and Tr8 in dielectric withstanding voltage. It is more preferable that both the second and the sixth transistor circuits Tr2 and Tr6 be lower than the fourth and the eighth transistor circuits in dielectric withstanding voltage.

Also, it is preferable that at least one of the third and the seventh transistor circuits Tr3 and Tr7 be lower in dielectric withstanding voltage than the fourth and the eighth transistor circuits Tr4 and Tr8. It is more preferable that both the third and the seventh transistor circuits Tr3 and Tr7 be lower in dielectric withstanding voltage than the fourth and the eighth transistor circuits Tr4 and Tr8. If FET element members are connected with each other in series, the voltage generated by high frequency signals is separated, so that potential fluctuations at the source of each FET element member are small, and the FET element can withstand a large voltage compared with a single FET element member. Since the FET element Tr3 and the FET element Tr4 are disposed, each of the FET elements may have low dielectric withstanding voltage as compared with the case of a single FET element. When the source electrode is connected with the drain electrode, because a large voltage is not applied between the source electrodes and the drain electrodes of the FET elements Tr3 and Tr4, low dielectric withstanding voltage does not cause any problems.

The reason why at least one of the second and the sixth transistor circuits Tr2 and Tr6 may be lower in dielectric withstanding voltage than the fourth and the eighth transistor circuits is the same as described in relation to the switching circuit shown in FIG. 14.

The reason why the dielectric withstanding voltage of the third and the seventh transistor circuits Tr3 and Tr7 may be low will be described.

If the signal path from the transmitting terminal Tx to the first antenna terminal ANT1 is connected, since the second antenna terminal ANT2 is disconnected from the transmission path in terms of high frequency, the eighth transistor circuit Tr8 is switched off. At this time, although the seventh transistor circuit Tr7 is also in the off-state, since transmission signals are interrupted at the eighth transistor circuit, a high voltage is not applied to the seventh transistor circuit Tr7. For this reason, the seventh transistor circuit Tr7 may be a transistor circuit with low dielectric withstanding voltage and a small number of gates. A transistor circuit with a small number of gates is advantageous because of a small size, inexpensiveness, and lowered loss.

If the signal path between the transmitting terminal Tx and the second antenna terminal ANT2 is connected, since the fourth and the third transistor circuits Tr3 and Tr4 are switched off, similarly, the third transistor element Tr3 with a small number of gates and low dielectric withstanding voltage may be used at the side of the first antenna terminal ANT1.

Also, in the case of reception, the first antenna terminal ANT1 is connected with the first receiving terminal Rx1, and the second antenna terminal ANT2 is connected with the second receiving terminal Rx2. At this time, the first and the fifth transistor circuits Tr1 and Try are switched on, and the second, the third, the sixth and the seventh transistor circuits Tr2, Tr3, Tr6, and Tr7 are switched off. Because the power of reception signals is much lower than the power of transmission signals, the dielectric withstanding voltage required for these transistor circuits being in the off-state is low, so that an inexpensive transistor element with a small number of gates can be used.

When each antenna terminal is connected with a transmitting terminal and each receiving terminal, the same control logic as that in Table 2 described above may be used.

Mode Tx1, in which the signal path between the first antenna terminal ANT1 and the transmitting terminal Tx is connected, will be described.

High voltage (3.0 V) is applied from the control terminals Va1 and Vt1, and the fourth transistor circuit connected with the control terminal Va1 and the third transistor circuit Tr3 connected with the control terminal Vt1 are switched on. The signal path between the first antenna terminal ANT1 and the transmitting terminal Tx is connected.

Also, in this state, Low voltage (0.0 V) is applied to the control terminal Va2, the eighth transistor circuit connected with the control terminal Va2 is in the off-state. Thereby, signals that flow on the signal path between the second antenna ANT2 and the transmitting terminal Tx are interrupted.

The control terminal Va1 is also connected with a tenth transistor circuit Tr10, and the tenth transistor circuit Tr10 is switched on, so that a path grounded from a node between the eighth transistor circuit Tr8 and the seventh transistor circuit Tr7 acts as a shunt circuit. Thus, because signals leaked from the transistor circuit Tr8 flow to the shunt circuit, an amount of signals that flow from the transmitting terminal Tx to the second antenna terminal ANT2 is further decreased. Accordingly, the isolation of the transmission paths between the antenna terminals and the isolation of the path from the transmitting terminal to the first receiving terminal can be ensured, and a preferable transmission-state can be maintained as a Tx diversity circuit.

Either High or Low voltage applied to the control terminal Vt2 enables the switching circuit to be operated. However, if High voltage (3.0 V) is applied from the control terminal Vt2, the sixth and the seventh transistor circuits Tr6 and Tr7 connected with the control terminal Vt2 are switched on, and the signal path grounded from the path between the fifth transistor circuit Tr5 and the second receiving terminal Rx2 acts as a shunt circuit. Thus, even if a signal leaks from the fifth transistor circuit Tr5 to the second receiving terminal Tr2, since the signal is not transferred to the second receiving terminal Rx2, isolation between the transmission path and the reception path can be ensured.

In the case of Mode Tx2, similarly to the foregoing, the connection and disconnection of a transistor circuit linked with each signal path is switched. A description thereof will be omitted.

The case of Mode Rx will be described.

High voltage (3.0 V) is applied from the control terminals Vr1 and Vr2, and the first transistor circuit Tr1 connected with the control terminal Vr1 and the fifth transistor circuit Tr5 connected with the control terminal Vr2 are switched on.

Thereby, the signal path between the first antenna terminal ANT1 and the first receiving terminal Rx1 is connected, and the signal path between the second antenna terminal ANT2 and the second receiving terminal Rx2 is connected.

In this state, Low voltage (0.0 V) is applied from the control terminals Vt1 and Vt2; the second and the third transistor circuits Tr2, Tr3 connected with the control terminal Vt1 and the sixth and the seventh transistor circuits Tr6 and Tr7 connected with the control terminal Vt2 are in the off-state. Thereby, a signal is restrained from leaking to another path from the signal path between the first antenna terminal ANT1 and the first receiving terminal Rx1 and from the signal path between the second antenna terminal ANT2 and the second receiving terminal Rx2.

In this state, either High or Low voltage applied to the control terminals Va1 and Va2 enables the switching circuit to be operated. When High voltage is applied to the control terminals Va1 and Va2, since the ninth and the tenth transistor circuits Tr9 and Tr10 are in the on-state and act as shunt circuits, even if signals leak from the third and the seventh transistor circuits Tr3 and Tr7 to the transmitting terminal Tx, the signals flow to the shunt circuits. Thus, preferably, isolation between the transmission path and the reception path can be ensured.

Figure 16:
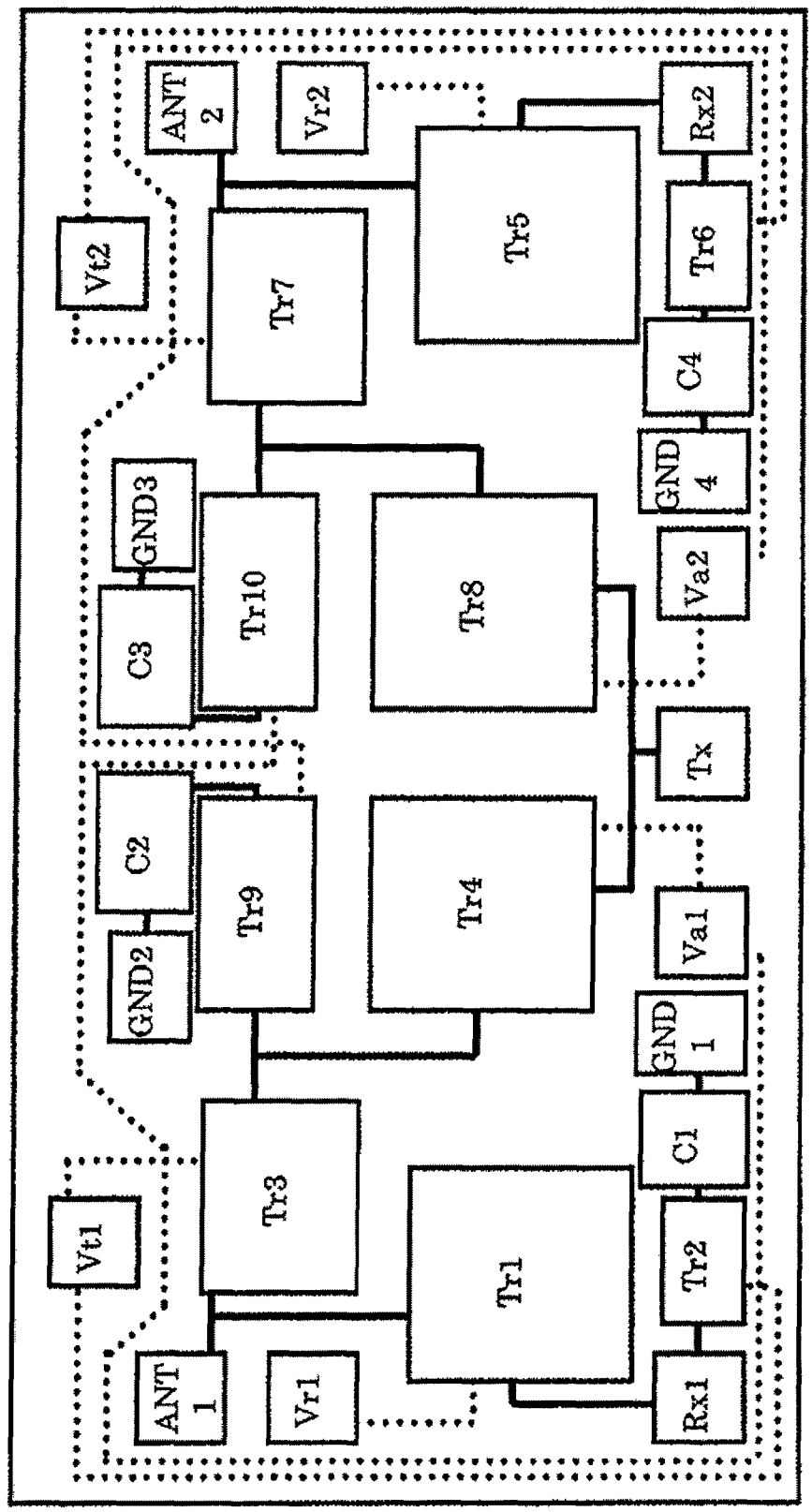
FIG. 16 illustrates a substrate surface of the switching circuit in FIG. 15, formed as an integrated semiconductor substrate.

FIG. 16 is a schematic diagram illustrating a layout on a substrate surface of a switching circuit in which transistor elements are arranged on one semiconductor substrate. Signal paths are indicated with solid lines and power supply lines are indicated with dashed lines.

A terminal connected with the transmitting terminal Tx (hereinafter, for simplicity, simply referred to as the transmitting terminal Tx), and terminals connected with a first and a second receiving terminal (hereinafter, simply referred to as the first receiving terminal Rx1 and the second receiving terminal Rx2) are formed on a substrate surface of a single semiconductor silicon substrate.

The first receiving terminal Rx1 and the second receiving terminal Rx2 are disposed at adjacent corners. Since the receiving terminals are disposed at corners, a circuit in which the receiving terminals are separated from other terminals can be designed, and isolation from the other signal paths can be ensured. As compared with the receiving terminals, transistor elements are disposed inside, apart from the corners.

The transmitting terminal Tx is disposed at a middle point between the receiving terminals Rx1 and Rx2 and along a side between the corners at which the receiving terminals Rx1 and Rx2 are disposed. Since the transmitting terminal Tx is disposed at the middle point between the receiving terminals Rx1 and Rx2, circuit elements such as the transistor elements can be arranged so as to be linearly symmetrical about the transmitting terminal Tx, and isolation between the transmitting terminal Tx and the receiving terminals Rx1 and Rx2 can be ensured with substantially the same degree. Also, because other elements such as capacitors can be disposed between the transmitting terminal Tx and the receiving terminals Rx1 and Rx2, circuit designing is easy. Further, a ground electrode can be formed to ensure isolation between a transmission path and a reception path.

Also, unlike a switching circuit in which switches are combined with each other, because a part of the transmission lines can be shared, the switching circuit can be downsized and layout designing of the mounting surface on the high frequency circuit component is easy. Furthermore, since a transmission line is shared, the line may be shortened to reduce loss.

Also, because a bilaterally symmetrical circuit is more easily formed than a switching circuit in which switches are combined with each other, when reception paths or transmission paths are switched, return loss and insertion loss are changed in the same manner. Accordingly, output voltage from each antenna can be constant.

An electrode connected with the first antenna terminal ANT1 and an electrode connected with the second antenna terminal ANT2 (hereinafter, simply referred to as the antenna terminals ANT1 and ANT2) are disposed at the remaining two corners. Since the antenna terminals ANT1 and ANT2 are disposed at corners, a circuit in which the antenna terminals are separated from other terminals can be designed, and isolation from the other signal paths can be ensured. As compared with the antenna terminals, transistor elements are disposed inside the mounting surface. If a power supply line is led near a corner side (peripheral side) compared with at least one of the antenna terminals ANT1 and ANT2, receiving terminals Rx1 and Rx2, and the transmitting terminal Tx, interference from other transistor elements is reduced, so that isolation of each signal path can be ensured. It is preferable that a power supply line be formed along at least one side of the semiconductor substrate.

In this terminal disposition, the fourth transistor circuit Tr4 and the eighth transistor element Tr8 are at equal distances from and closer to the transmitting terminal Tx than other transistor elements.

The ninth transistor element Tr9 is disposed and connected via the fourth transistor element Tr4 apart from the transmitting terminal Tx. Also, the tenth transistor element Tr10 is disposed and connected via the eighth transistor element Tr8 apart from the transmitting terminal Tx.

The third transistor element Tr3 is disposed between the ninth transistor element Tr9 and the first antenna terminal ANT1. Also, the seventh transistor element Tr7 is disposed between the tenth transistor element Tr10 and the second antenna terminal ANT2.

The first transistor element Tr1 is disposed between the ninth transistor element Tr9 and the first receiving terminal Rx1. Because the first transistor element Tr1 is an element for opening/closing the reception path between the first antenna terminal ANT1 and the first receiving terminal Rx1, it is preferable that isolation from a transmission path be ensured. To this end, the first transistor element Tr1 is disposed so as to be closer to the first receiving terminal Rx1 than to the transistor elements Tr3, Tr9, and Tr4 disposed on transmission paths.

The fifth transistor element Tr5 is disposed between the tenth transistor element Tr10 and the second receiving terminal Rx2. For the same reason as that in relation to the first transistor, the fifth transistor element Tr5 is disposed so as to be closer to the second receiving terminal Rx2 than to the transistor elements Tr7, Tr10, and Tr8 disposed on transmission paths.

The second transistor element Tr2 is disposed between the first receiving terminal Rx1 and the transmitting terminal and along a side of the semiconductor substrate with a first capacitor C1, connected with the second transistor element Tr2, and the first ground terminal electrode GND1. Also, the sixth transistor element Tr6 is disposed between the second receiving terminal electrode Rx2 and the transmitting terminal electrode Tx and along a side of the semiconductor substrate with a fourth capacitor C4, connected with the sixth transistor element Tr6, and the fourth ground terminal GND4.

According to such element arrangement, a Tx diversity circuit with superior isolation characteristics can be provided.

(3) Third Embodiment

Figure 17:
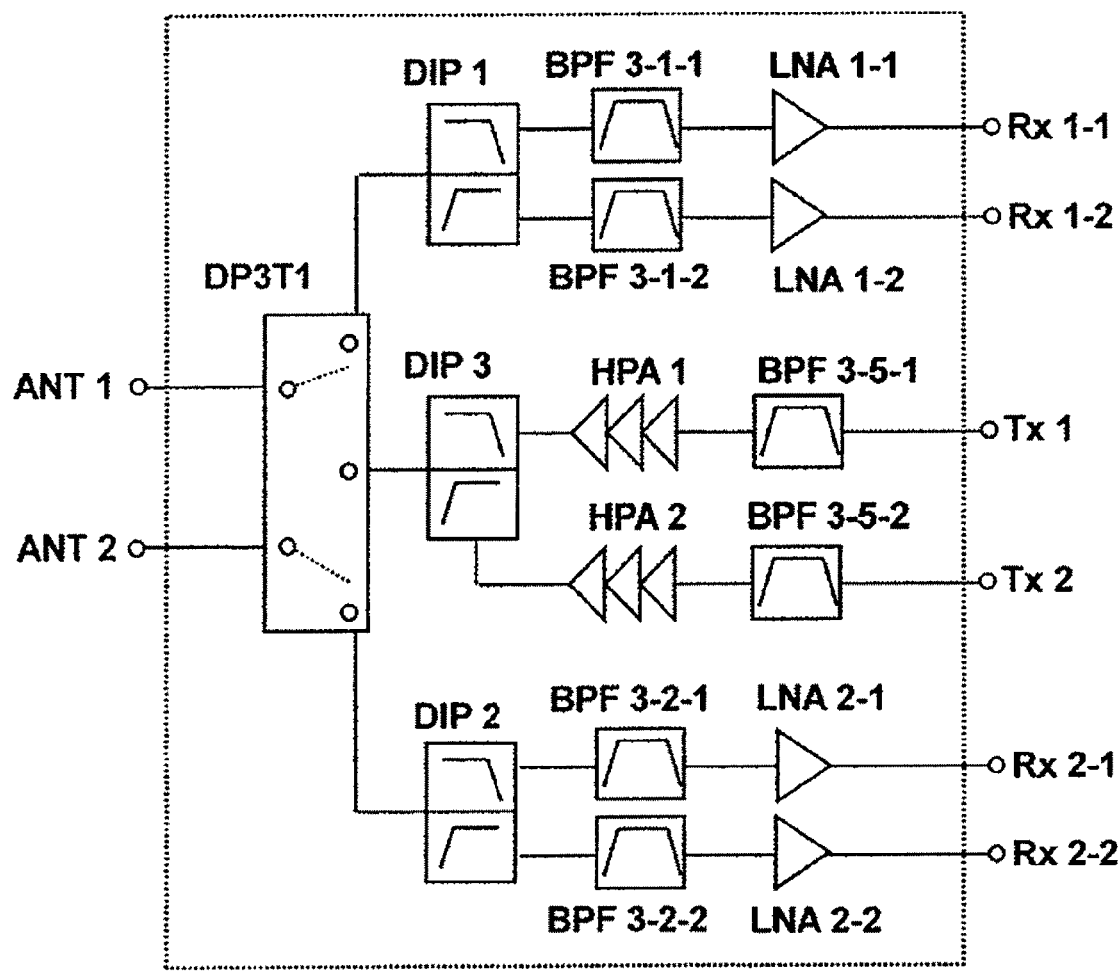
FIG. 17 is a block diagram of a high frequency circuit according to yet another embodiment.

FIG. 17 is a block diagram illustrating another embodiment.

Each of a first diplexer circuit DIP1 and a second diplexer circuit DIP2 is a diplexer including: a low-pass filter portion having a passing band of a frequency band of a first communication system and a blocking band of a frequency band of a second communication system; and a high-pass filter portion having a blocking band of the frequency band of the first communication system and a passing band of the frequency band of the second communication system. Between the low-pass filter portion of the first diplexer circuit DIP1 and the first receiving terminal Rx1-1 for the first communication system, a band-pass filter circuit BPF3-1-1, and a low-noise amplifier circuit LNA1-1 that amplifies a reception signal of the first communication system are connected in this order from the DIP1. The band-pass filter circuit BPF3-1-1 prevents unnecessary signals including signals of the second communication system from being input to the low-noise amplifier circuit LNA1-1.

Also, between the high-pass filter portion of the first diplexer circuit DIP1 and the first receiving terminal Rx1-2 for the second communication system, a band-pass filter circuit BPF3-1-2, and a low-noise amplifier circuit LNA1-2 that amplifies a reception signal of the second communication system are connected in this order from the DIP1. The band-pass filter circuit BPF3-1-2 prevents unnecessary signals including signals of the first communication system from being input to the low-noise amplifier circuit LNA1-2.

Also, between the low-pass filter portion of the second diplexer circuit DIP2 and the second receiving terminal Rx2-1 for the first communication system, a band-pass filter circuit BPF3-2-1 and a low-noise amplifier circuit LNA2-1 are connected in this order from the DIP2, and between the high-pass filter portion of the second diplexer circuit DIP2 and the second receiving terminal Rx2-2 for the second communication system, a band-pass filter circuit BPF3-2-2 and a low-noise amplifier circuit LNA2-2 are connected in this order from the DIP2. Because the dispositions and functions of these circuits are the same as those of the circuits between the first diplexer circuit DIP1, and the first receiving terminal Rx1-1 for the first communication system and the first receiving terminal Rx1-2 for the second communication system, a description thereof will be omitted.

With the low-noise amplifier circuits LNA1-1, LNA1-2, LNA2-1, and LNA2-2 illustrated in FIG. 17, a high degree of integration of the high frequency circuit can be achieved. However, the components between the diplexer circuits and the receiving terminals may be removed in accordance with required characteristics, or a filter circuit may be further added.

A diplexer circuit DIP3 is, similarly to the first and the second diplexer circuits DIP1 and DIP2, a diplexer including: a low-pass filter portion having a passing band of the frequency band of the first communication system and a blocking band of the frequency band of the second communication system; and a high-pass filter portion having a blocking band of the frequency band of the first communication system and a passing band of the frequency band of the second communication system.

Between the low-pass filter portion of the diplexer circuit DIP3 and the transmitting terminal Tx1 for the first communication system, a high frequency amplifier circuit HPA1 that amplifies a transmission signal, and a band-pass filter circuit BPF3-5-1 are connected in this order from the DIP3. The band-pass filter circuit BPF3-5-1 prevents noise of an unnecessary band, not transmission signals, from being input to the high frequency amplifier circuit HPA1. The low-pass filter portion can also restrain harmonics generated at the high frequency amplifier circuit HPA1.

Between the high-pass filter portion of the diplexer circuit DIP3 and the transmitting terminal Tx2 for the second communication system, a high frequency amplifier circuit HPA2 that amplifies a transmission signal, and a band-pass filter circuit BPF3-5-2 are connected in this order from the DIP3. The band-pass filter circuit BPF3-5-2 prevents noise of an unnecessary band, not transmission signals, from being input to the high frequency amplifier circuit HPA2.

With the high frequency amplifier circuits HPA1 and HPA2 illustrated in FIG. 17, a high degree of integration of the high frequency circuit can be achieved. The components between the diplexer circuit DIP3 and the transmitting terminal Tx1 for the first communication system, and the components between the diplexer circuit DIP3 and the transmitting terminal Tx2 for the second communication system may be removed in accordance with required characteristics, or a filter circuit may be further added.

Instead of the first and the second diplexer circuits DIP1 and DIP2, single-pole double-throw switch circuits may be provided.

In the embodiment shown in FIG. 17, since the first receiving terminal Rx1-1 for the first communication system and the second receiving terminal Rx2-1 for the first communication system are independently connected with separate antennas, without switching the antennas, reception signals from the first communication system can be simultaneously output to the plurality of receiving terminals. Similarly, reception signals from the second communication system can be simultaneously output to the plurality of receiving terminals. Using such a multi-input type high frequency circuit, a receiving sensitivity is improved.

Also in this embodiment, filter circuits disposed on reception paths in the laminated body do not overlap each other as seen in the lamination direction, and shields of vias are disposed between reception paths and between the transmission path and the reception paths.

(4) Fourth Embodiment

Figure 18:
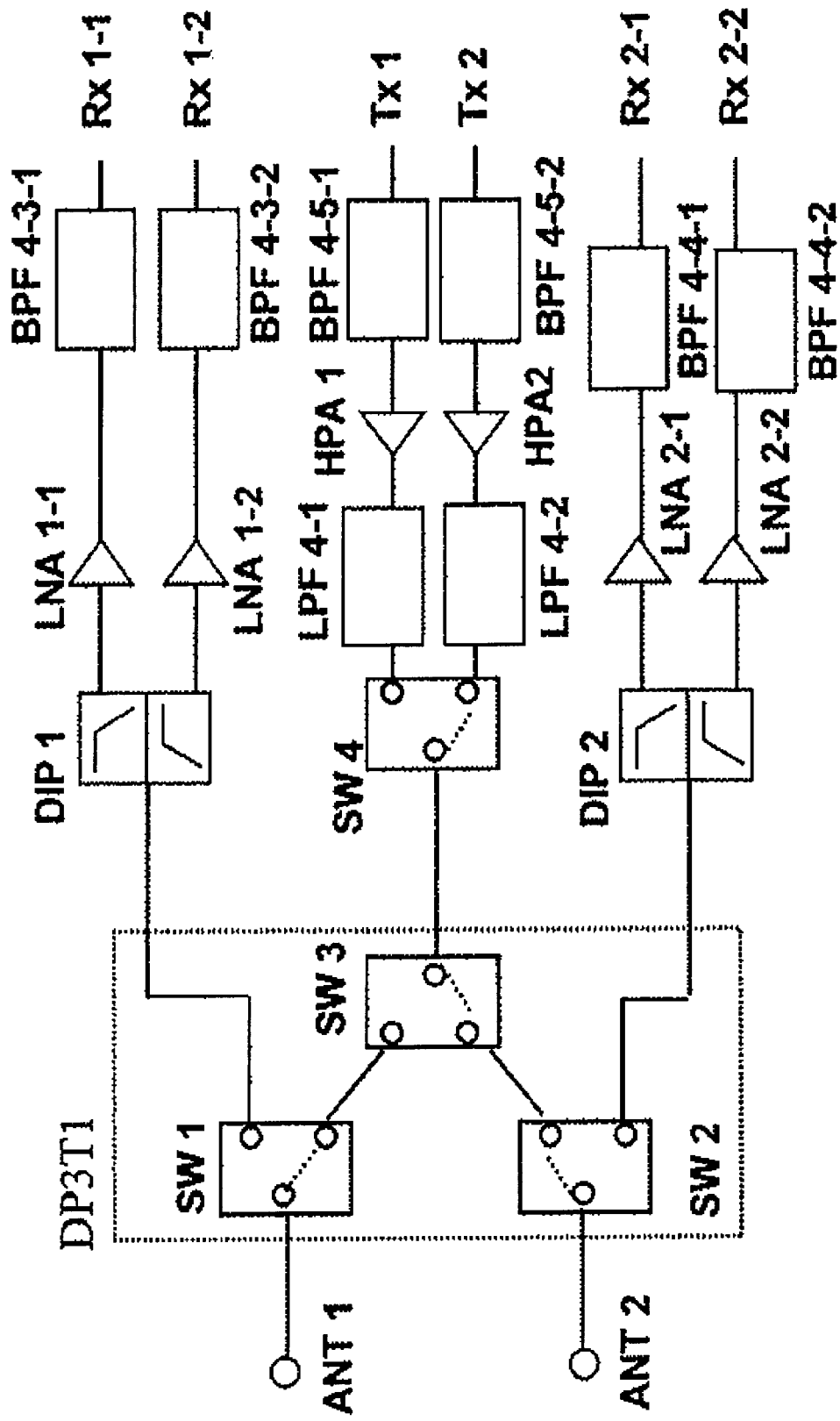
FIG. 18 is a block diagram of the high frequency circuit according to the other embodiment.

FIG. 18 is an example of another Tx diversity circuit. For example, the high frequency circuit in FIG. 18 may be used as a front-end module for a wireless communication device in which a first communication system is a WiMAX with a band of 2.5 GHz and a second communication system is a WiMAX with a band of 3.5 GHz, being a higher frequency band than the band of the first communication system. Also, the configuration of the embodiment may be used in another combination such as wireless LANs with bands of 2.4 GHz and 5 GHz, and a combination of a WiMAX and a wireless LAN.

This high frequency circuit includes a first and a second antenna terminal ANT1 and ANT2, a first receiving terminal Rx1-1 for a first communication system, a first receiving terminal Rx1-2 for a second communication system, a transmitting terminal Tx1 for the first communication system, a transmitting terminal Tx2 for the second communication system, a second receiving terminal Rx2-1 for the first communication system, a second receiving terminal Rx2-2 for the second communication system, and a switching circuit DP3T1. The switching circuit DP3T1 may be the switching circuit described above.

A single-pole double-throw fourth switch SW4 is disposed for the switching circuit DP3T1. A single pole terminal of the fourth switch SW4 is connected with the switching circuit DP3T1, and each of double-throw terminals is connected with the transmitting terminal Tx1 for the first communication system and the transmitting terminal Tx2 for the second communication system. The fourth switch SW4 switches transmission paths, as needed, concurrently with the switching circuit DP3T1 to transmit signals from each transmitting terminal to the first antenna terminal ANT1 or the second antenna terminal ANT2. In this manner, the fourth switch SW4 is provided, and thereby a Tx diversity circuit for communication systems with a plurality of frequency bands can be realized. Because the fourth switch SW4 is used, as compared with a circuit in which a diplexer circuit is disposed at the same position, even if frequency bands of a first and a second communication system are close to each other, signals from both transmitting terminals can be reliably transmitted to each antenna terminal, and also transmission loss can be prevented.

It is preferable that a high frequency amplifier circuit HPA1 be disposed between the fourth switch SW4 and the transmitting terminal Tx1 and a high frequency amplifier circuit HPA2 be disposed between the fourth switch SW4 and the transmitting terminal Tx2. The high frequency amplifier circuits HPA1 and HPA2 may be integrated on the same chip to achieve a high degree of integration.

The fourth switch SW4 may be a known single-pole double-throw switch. It is preferable that a control terminal of the high frequency amplifier circuit HPA1 or HPA2 and a control terminal of a transistor element between a single pole terminal and double-throw terminals connected with high frequency amplifier circuits HPA1 and HPA2 be connected with a common terminal. In this manner, the number of control terminals of an entire circuit can be decreased.

It is preferable that a band-pass filter circuit BPF4-5-1 be disposed between the high frequency amplifier circuits HPA1 and the transmitting terminal Tx1, and a band-pass filter circuit BPF4-5-2 be disposed between the high frequency amplifier circuits HPA2 and the transmitting terminal Tx2. The band-pass filter circuits BPF4-5-1 and BPF4-5-2 can prevent noise of an unnecessary band, not transmission signals, from being input to the high frequency amplifier circuits HPA1 and HPA2.

Also, it is preferable that a low-pass filter circuit LPF4-1 be disposed between the fourth switch SW4 and the high frequency amplifier circuit HPA1, and a low-pass filter circuit LPF4-2 be disposed between the fourth switch SW4 and the high frequency amplifier circuit HPA2. The low-pass filter circuits LPF4-1 and LPF4-2 can restrain harmonics generated at the high frequency amplifier circuits HPA1 and HPA2.

The first receiving terminal Rx1-1 of the first communication system and the first receiving terminal Rx1-2 of the second communication system are connected with a first receiving terminal Rx1 of the switching circuit DP3T1 via the first diplexer circuit DIP1.

Similarly, the second receiving terminal Rx2-1 of the first communication system and the second receiving terminal Rx2-2 of the second communication system are connected with a second receiving terminal Rx2 of the switching circuit DP3T1 via the second diplexer circuit DIP2.

FIG. 18 illustrates an example in which the diplexer circuits DIP1 and DIP2 are used, but as described above, the diplexer circuits may be switch circuits.

It is preferable that low-noise amplifier circuits LNA1-1, 1-2, 2-1, and 2-2 that amplify reception signals be connected between the switch or the diplexer circuit and each receiving terminal. Also, it is preferable that the band-pass filter circuits BPF4-3-1, 4-3-2, 4-4-1, and 4-4-2 be disposed at least one of a front stage and a rear stage with respect to the low-noise amplifier circuits LNA, between the switch circuit or the diplexer circuit and each receiving terminal. These band-pass filter circuits prevent unnecessary signals including signals of each communication system from being input to the low-noise amplifier circuit and each receiving terminal.

If a diplexer circuit is disposed on a reception path, unnecessary signals can be prevented from being input to a low-noise amplifier circuit LNA without a filter circuit at a front stage of the low-noise amplifier circuit. Thus, a filter circuit may be disposed only at a rear stage of a low-noise amplifier circuit LNA. Preferably, the filter circuit is a band-pass filter circuit.

Figure 19:
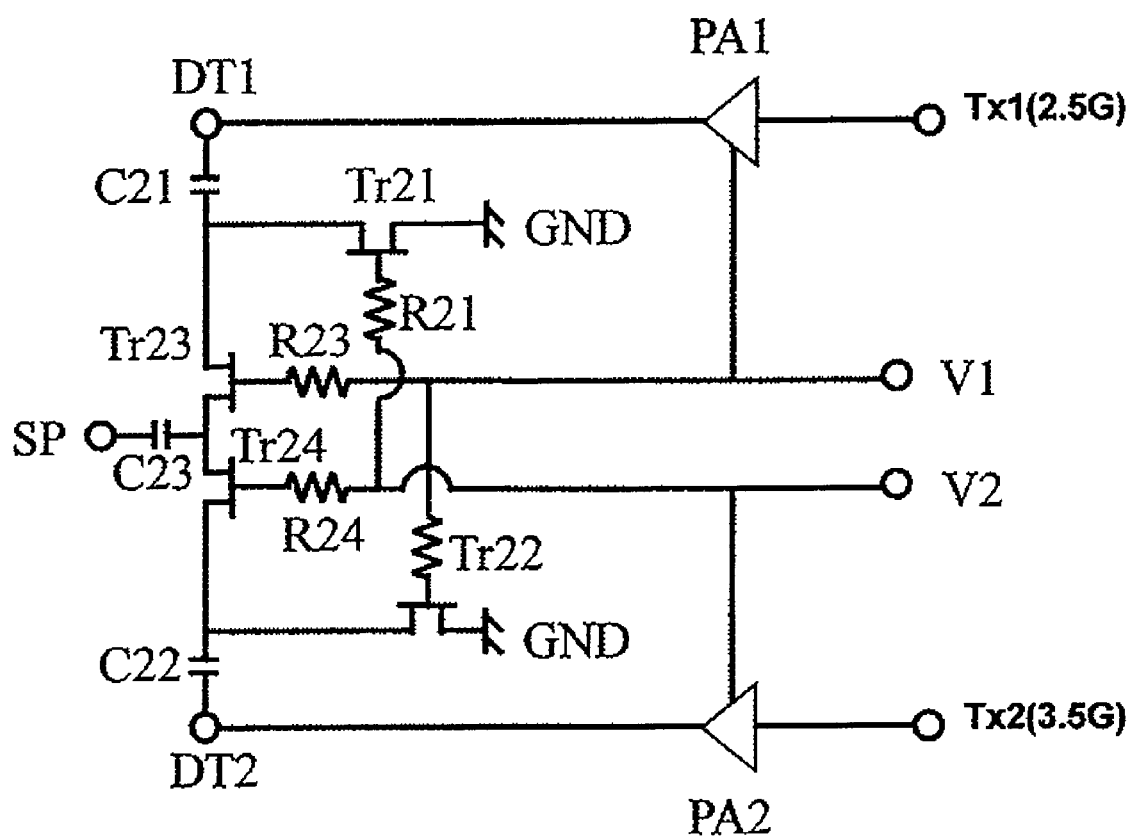
FIG. 19 is a diagram illustrating a state in which a power supply terminal is shared by a switch member and a high frequency amplifier circuit.

With the switch SW4, as illustrated in FIG. 19, control terminals of high frequency amplifier circuits HPA1 and HPA2 disposed on transmission paths and terminals connected with a gate electrode of the switch SW4 may be common.

Also in this embodiment, filter circuits disposed on reception paths in the laminated body do not overlap each other as seen in the lamination direction, and shields of vias are disposed between reception paths and between the transmission path and the reception paths.

(5) Fifth Embodiment

Figure 20:
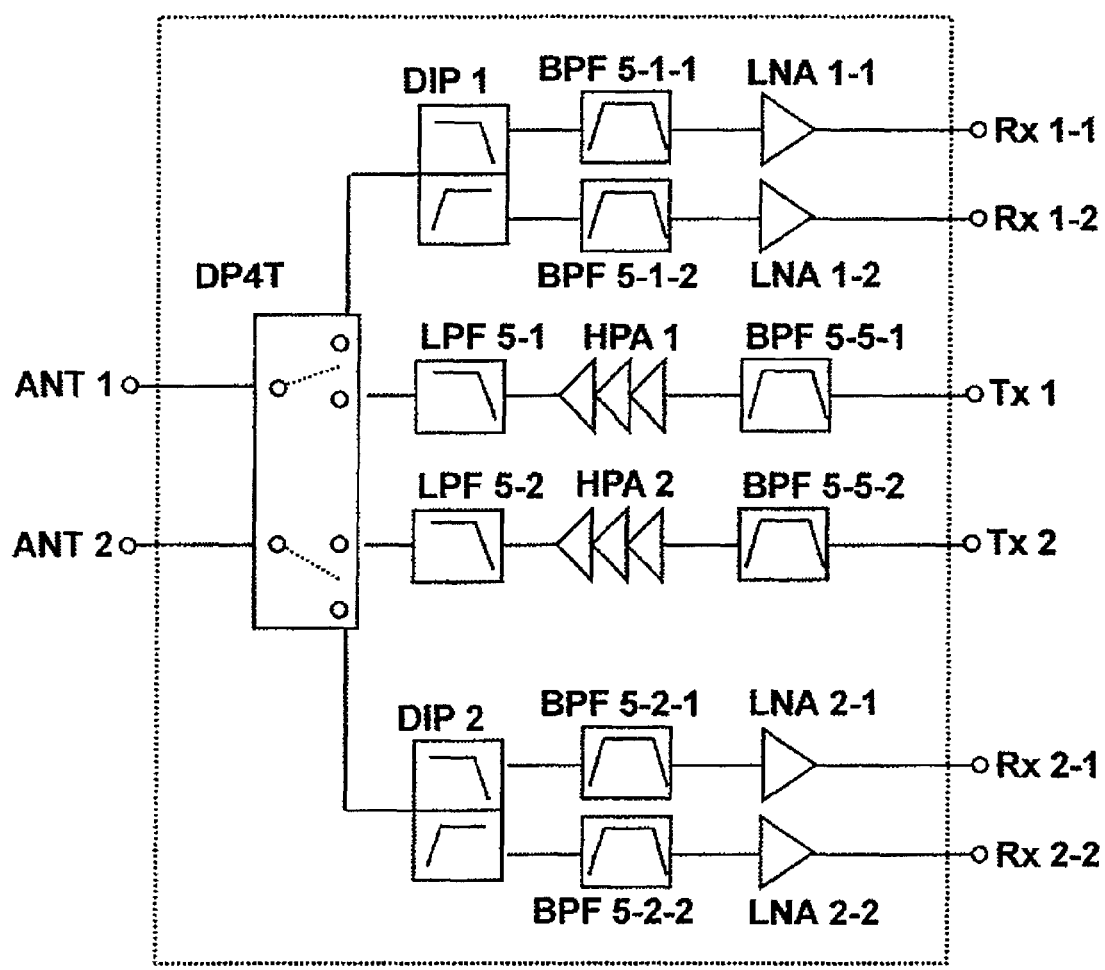
FIG. 20 is a block diagram of another high frequency circuit.

FIG. 20 is another block diagram of a dual-band high frequency circuit. This high frequency circuit is a double-pole quadruple-throw switching circuit DP4T. The switching circuit DP4T includes two transmitting terminals Tx1 and Tx2, one of which is connected with a transmitting terminal Tx1 for a first communication system and the other of which is connected with a transmitting terminal Tx2 for a second communication system.

Each circuit between a diplexer circuit DIP1 and first receiving terminals Rx1-1 and Rx1-2 and each circuit between a diplexer circuit DIP2 and first receiving terminals Rx2-1 and Rx2-2 are similar to the circuits of the block diagram shown in FIG. 17, and descriptions of the configuration and advantages will be omitted. However, the embodiment is not restrictive. As needed, each filter circuit may be added or removed, and a different type of filter circuit may also be used.

Between the switching circuit DP4T and the transmitting terminal Tx1 for the first communication system, a low-pass filter circuit LPF5-1, a high frequency amplifier circuit HPA1 that amplifies a transmission signal, and a band-pass filter circuit BPF5-5-1 are connected in this order from the switching circuit DP4T.

Also, between the switching circuit DP4T and the transmitting terminal Tx2 for the second communication system, a low-pass filter circuit LPF5-2, a high frequency amplifier circuit HPA2 that amplifies a transmission signal, and a band-pass filter circuit BPF5-5-2 are connected in this order from the switching circuit DP4T.

The high frequency circuit of the fifth embodiment may have a smaller number of diplexer circuits than those in the high frequency circuit of the third embodiment. For this reason, circuit elements in a laminated body can be flexibly designed and transmission paths and reception paths may be separated from each other in the laminated body. In particular, isolation of transmission paths can be advantageously ensured.

Figure 21:
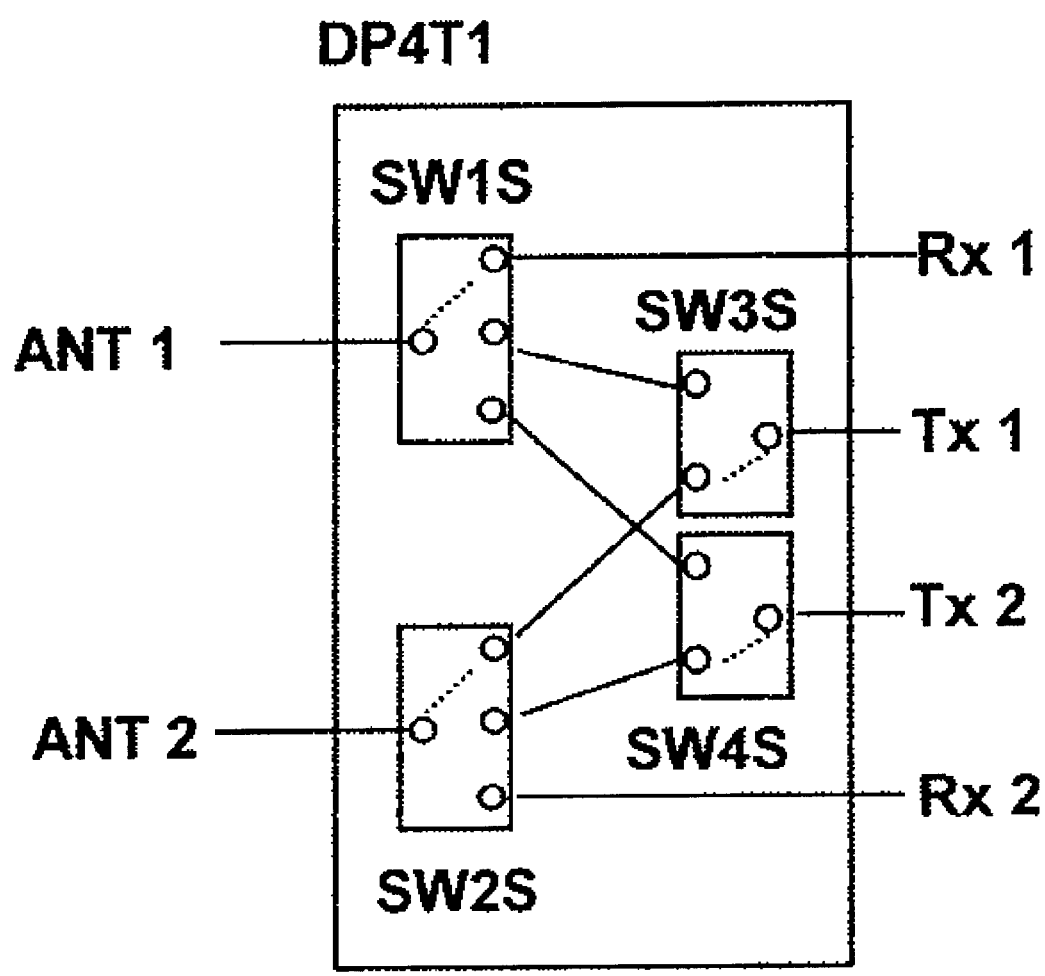
FIG. 21 is a block diagram of a switching circuit used in the high frequency circuit shown in FIG. 20.

FIG. 21 illustrates an example of a switching circuit DP4T1 including four switches. In the switching circuit DP4T1, a first antenna terminal ANT1 is connected with a single pole terminal of a single-pole triple-throw switch SW1s, and one of triple-throw terminals of the first single-pole triple-throw high frequency switch SW1s is connected with the first receiving terminal Rx1. A second antenna terminal ANT2 is connected with a single pole terminal of a single-pole triple-throw switch SW2s, and one of triple-throw terminals of the second single-pole triple-throw switch SW2s is connected with the second receiving terminal Rx2.

Also, each of double-throw terminals of a single-pole double-throw high frequency switch SW3s is connected with each of the triple-throw terminals of each of the first and the second single-pole triple-throw high frequency switches SW1s and SW2s. Similarly, each of double-throws terminals of a single-pole double-throw high frequency switch SW4s is connected with the remaining one of the triple-throw terminals of each of the first and the second single-pole triple-throw switches SW1s and SW2s.

By switching of the switches SW1s, SW2s, SW3s, and SW4s, the first and the second receiving terminals can be simultaneously connected to the first and the second antenna terminals ANT1 and ANT2. Also, any one of the transmitting terminals Tx1 and Tx2 is selectively connectable to either of the first and the second antenna terminals ANT1 and ANT2.

Figure 22:
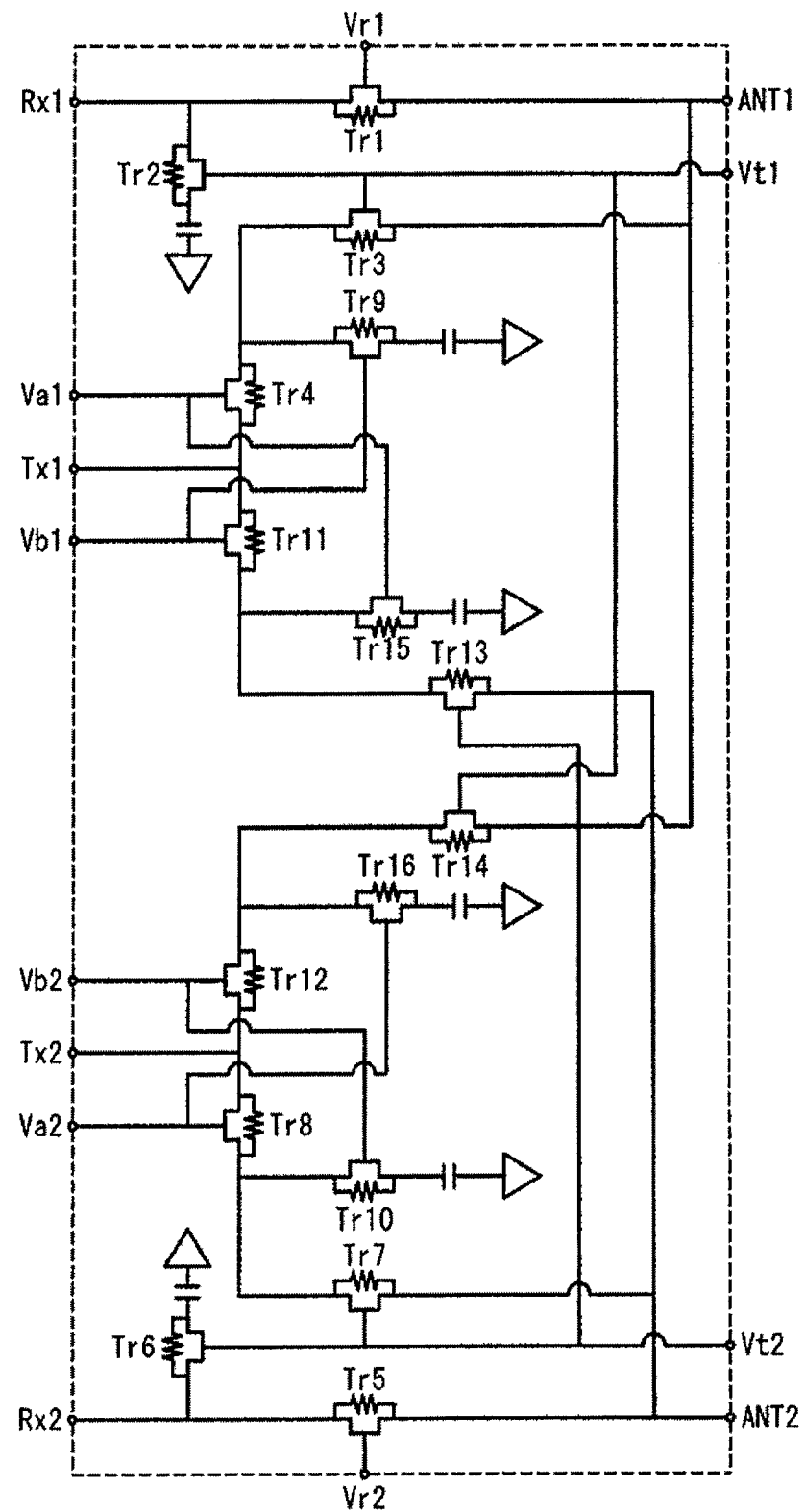
FIG. 22 is an example of the switching circuit shown in FIG. 21.

FIG. 22 is a diagram illustrating a form of an equivalent circuit of a switching circuit that can be used for the high frequency circuit shown in FIG. 21.

The switching circuit of the embodiment uses a first to a 16th FET element, and FET elements may be removed or added as needed in accordance with required isolation characteristics and return loss characteristics.

One of a drain electrode and a source electrode of the first FET element Tr1 is connected with a first antenna terminal ANT1, and the other is connected with a first receiving terminal Rx1. Also, a gate electrode of the first FET element Tr1 is connected with a power supply line of a control terminal Vr1. In a disconnected state, signal leakage from a transmission path can be restrained.

The third FET element Tr3 and the fourth FET element Tr4 are disposed on a signal path from the first antenna terminal ANT1 to the first transmitting terminal Tx1. One of the drain electrode and the source electrode of the third FET element Tr3 is connected with the first antenna terminal ANT1, and the other is connected with the fourth FET element Tr4. One of the drain electrode and the source electrode of the fourth FET element Tr4 is connected with the third FET element Tr3, and the other is connected with the first transmitting terminal Tx1. The gate electrode of the third FET element Tr3 is connected with the power supply line of the control terminal Vt1, and the gate electrode of the fourth FET element Tr4 is connected with the power supply line of the control terminal Va1.

The 13th FET element Tr13 and the 11th FET element Tr11 are disposed on a signal path from the second antenna terminal ANT2 to the first transmitting terminal Tx1. One of the drain electrode and the source electrode of the 13th FET element Tr13 is connected with the second antenna terminal ANT2, and the other is connected with the 11th FET element Tr11. One of the drain electrode and the source electrode of the 11th FET element Tr11 is connected with the 13th FET element Tr13, and the other is connected with the first transmitting terminal Tx1. The gate electrode of the 13th FET element Tr13 is connected with the power supply line of the control terminal Vt2, and the gate electrode of the 11th FET element Tr11 is connected with the power supply line of the control terminal Vb1.

In the third and the fourth FET elements, and the 11th and the 15th FET elements, not necessarily both the elements are required, but it is preferable to dispose both of them since signal leakage can be restrained.

One of the drain electrode and the source electrode of the ninth FET element Tr9 is connected with a node between the third FET element Tr3 and the fourth FET element Tr4, and the other is grounded. A capacitor may be disposed on a signal path between the ninth FET element Tr9 and ground. Also, the gate electrode of the ninth FET element Tr9 is connected to the power supply line of the control terminal Vb1, the line being shared by the 11th FET element Tr11.

One of a drain electrode and a source electrode of the 15th FET element Tr15 is connected with a node between the 13th FET element Tr13 and the 11th FET element Tr11, and the other is grounded. The capacitor may be disposed on the signal path between the 15th FET element Tr15 and ground. Also, the gate electrode of the 15th FET element Tr15 is connected to the power supply line of the control terminal Va1, the line being shared by the fourth FET element Tr4.

The ninth FET element Tr9 forms a shunt circuit, so that when the transmitting terminal Tx1 is connected with one antenna terminal, signal leakage to the other can be restrained.

One of a drain electrode and a source electrode of the fifth FET element Tr5 is connected with the second antenna terminal ANT2, and the other is connected with the second receiving terminal Rx2. Also, the gate electrode of the fifth FET element Tr5 is connected with a power supply line of a control terminal Vr2. In a disconnected state, signal leakage from a transmission path can be restrained.

The seventh FET element Tr7 and the eighth FET element Tr8 are disposed on a signal path from the second antenna terminal ANT2 to a second transmitting terminal Tx2. One of a drain electrode and a source electrode of the seventh FET element Tr7 is connected with a node between the second antenna terminal ANT2 and the 13th FET element Tr13, and the other is connected with the eighth FET element Tr8. One of a drain electrode and a source electrode of the eighth FET element Tr8 is connected with the seventh FET element Tr7, and the other is connected with the second transmitting terminal Tx. The gate electrode of the seventh FET element Tr7 is connected with the power supply line of the control terminal Vt2, the line being shared by the sixth and the 13th FET elements Tr6 and Tr13. The gate electrode of the eighth FET element Tr8 is connected with the power supply line of the control terminal Va2.

The 14th FET element Tr14 and the 12th FET element Tr12 are disposed on a signal path from the first antenna terminal ANT1 to a second transmitting terminal Tx2. One of a drain electrode and a source electrode of the 14th FET element Tr14 is connected with a node between the first antenna terminal ANT1 and the third FET element Tr3, and the other is connected with the 12th FET element Tr12. One of a drain electrode and a source electrode of the 12th FET element Tr12 is connected with the 14th FET element Tr14, and the other is connected with the second transmitting terminal Tx2. The gate electrode of the 14th FET element Tr14 is connected with the power supply line of the control terminal Vt1 and the gate electrode of the 12th FET element Tr12 is connected with the power supply line of the control terminal Vb2.

One of a drain electrode and a source electrode of the 16th FET element Tr16 is connected with a node between the 14th FET element and the 12th FET element Tr12, and the other is grounded. The capacitor may be disposed on the signal path between the 16th FET element Tr16 and ground. Also, the gate electrode of the 16th FET element Tr16 is connected to the power supply line of the control terminal Va2, the line being shared by the eighth FET element Tr8.

One of a drain electrode and a source electrode of the tenth FET element Tr10 is connected with a node between the seventh FET element Tr7 and the eighth FET element Tr8, and the other is grounded. The capacitor may be disposed on the signal path between the tenth FET element Tr10 and ground. Also, the gate electrode of the tenth FET element Tr10 is connected to the power supply line of the control terminal Vb2, the line being shared by the 12th FET element Tr12.

Also, one of the drain electrode and the source electrode of the second FET element Tr2 is connected with a node between the first FET element Tr1 and the first receiving terminal Rx1, and the other is grounded. The gate electrode of the second FET element Tr2 may be connected with the power supply line of the control terminal Vt1, the line being shared by the third and the 14th FET element Tr14. The capacitor may be disposed between the second FET element Tr2 and ground.

Similarly, one of the drain electrode and the source electrode of the sixth FET element Tr6 is connected with a node between the fifth FET element Tr5 and the second receiving terminal Rx2, and the other is grounded. The gate electrode of the sixth FET element Tr6 may be connected with the power supply line of the control terminal Vt2, the line being shared by the seventh and the 13th FET element Tr13. The capacitor may be disposed between the sixth FET element Tr6 and ground.

Since the second, the third, and the 14th FET elements Tr2, Tr3 and Tr14 share a power supply line, and the sixth, the seventh and the 13th FET elements Tr6, Tr7, and Tr13 also share a power supply line, the same connected/disconnected state of each set of FET elements can be achieved. Thus, for example, when signals flow on a path from the first or second transmitting terminal Tx1 or Tx2 to the first antenna terminal ANT1, that is, the third or the 14th FET element Tr14 is in a connected state, since the second FET element Tr2 is in a connected state, a shunt circuit is formed between the first receiving terminal Rx1 and the first FET element Tr1. Thereby, leakage signals that leak via the first transistor element Tr1 to the first antenna terminal can be restrained, and isolation between the transmission path and the reception path can be improved.

Also, when signals flow on the path from the first or second transmitting terminal Tx1 or Tx2 to the second antenna terminal ANT2, since the sixth FET element Tr6 is switched on, a shunt circuit is formed between the second receiving terminal Rx2 and the fifth FET element Tr5, and thereby signal leakage to the second receiving terminal Rx2 can be restrained, and isolation between the transmission path and the reception path can be improved.

It should be noted that even a configuration without the third, the seventh, the 13th, and the 14th FET elements Tr3, Tr7, Tr13, and Tr14 may be adopted for the switching circuit used in the high frequency circuit component of the embodiment, but using the switching circuit including these FET elements, the isolation between a transmission path and reception paths can be easily ensured.

Also, even a configuration without shunt circuits partly composed of the ninth, the tenth, the 15th, the 16th FET elements Tr9, Tr10, Tr15, and Tr16 may be adopted for the switching circuit used in the high frequency circuit component of the embodiment, but using the switching circuit including these shunt circuits, the isolation between a transmission path and reception paths can be easily ensured.

In the switching circuit in FIG. 22, if the second and the sixth FET elements Tr2 and Tr6 are used, it is preferable that at least one of the second and sixth FET elements Tr2 and Tr6 be lower than the fourth, eighth, 11th, and 12th FET elements Tr4, Tr8, Tr11, and Tr12 in dielectric withstanding voltage. It is more preferable that both the second and the sixth FET elements Tr2 and Tr6 be lower than the fourth, eighth, 11th, and 12th FET elements Tr4, Tr8, Tr11, and Tr12 in dielectric withstanding voltage.

Also, it is preferable that at least one of the third, seventh, 13th, and 14th FET elements Tr3, Tr7, Tr13, and Tr14 be lower than the fourth, eighth, 11th, and 12th FET elements Tr4, Tr8, Tr11, and Tr12 in dielectric withstanding voltage. It is more preferable that all of the third, seventh, 13th, and 14th FET elements Tr3, Tr7, Tr13, and Tr14 be lower than the fourth, eighth, 11th, and 12th FET elements Tr4, Tr8, Tr11, and Tr12 in dielectric withstanding voltage.

For example, in order to connect each antenna terminal, the transmitting terminal, each receiving terminal with each other, voltage of each control terminal may be controlled as in the following table. Mode Tx1-1 indicates the state in which the first transmitting terminal Tx1 is connected with the first antenna terminal ANT1. Mode Tx1-2 indicates the state in which the first transmitting terminal Tx1 is connected with the second antenna terminal ANT2. Mode Tx2-1 indicates the state in which the second transmitting terminal Tx2 is connected with the first antenna terminal ANT1. Mode Tx2-2 indicates the state in which the second transmitting terminal Tx2 is connected with the second antenna terminal ANT2. Mode Rx indicates the state in which the first antenna terminal is connected with the first receiving terminal and the second antenna terminal is connected with the second receiving terminal.

TABLE 3

| Mode | Vt1 | Vt2 | Vr1 | Vr2 | Va1 | Va2 | Vb1 | Vb2 | Vatt | Vb | VbL1 | VbL2 | Vcc1 | Vcc2 | VcL | Vd |
|---|---|---|---|---|---|---|---|---|---|---|---|---|---|---|---|---|
| Tx1-1 | 3.0 | 3.0 | 0.0 | 0.0 | 3.0 | 0.0 | 0.0 | 0.0 | 0.0 | 3.0 | 0.0 | 0.0 | 3.5 | 3.5 | 3.0 | 0.0 |
| Tx1-2 | 3.0 | 3.0 | 0.0 | 0.0 | 0.0 | 0.0 | 3.0 | 0.0 | 0.0 | 3.0 | 0.0 | 0.0 | 3.5 | 3.5 | 3.0 | 0.0 |
| Tx2-1 | 3.0 | 3.0 | 0.0 | 0.0 | 0.0 | 0.0 | 0.0 | 3.0 | 0.0 | 3.0 | 0.0 | 0.0 | 3.5 | 3.5 | 3.0 | 0.0 |
| Tx2-2 | 3.0 | 3.0 | 0.0 | 0.0 | 0.0 | 3.0 | 0.0 | 0.0 | 0.0 | 3.0 | 0.0 | 0.0 | 3.5 | 3.5 | 3.0 | 0.0 |
| Rx | 0.0 | 0.0 | 3.0 | 3.0 | 0.0 | 0.0 | 0.0 | 0.0 | 0.0 | 0.0 | 3.0 | 3.0 | 3.5 | 3.5 | 3.0 | 0.0 |

Also, sharing a power supply terminal can reduce the number of power supply terminals and power supply lines, thereby facilitating the simplification and downsizing of a circuit component.

It should be noted that when the first receiving terminal Rx1 is connected with the first antenna terminal ANT1, if the switching to connect the second receiving terminal Rx2 with the second antenna terminal ANT2 is performed, the control terminals Vr1 and Vr2 may be common.

Figure 23:
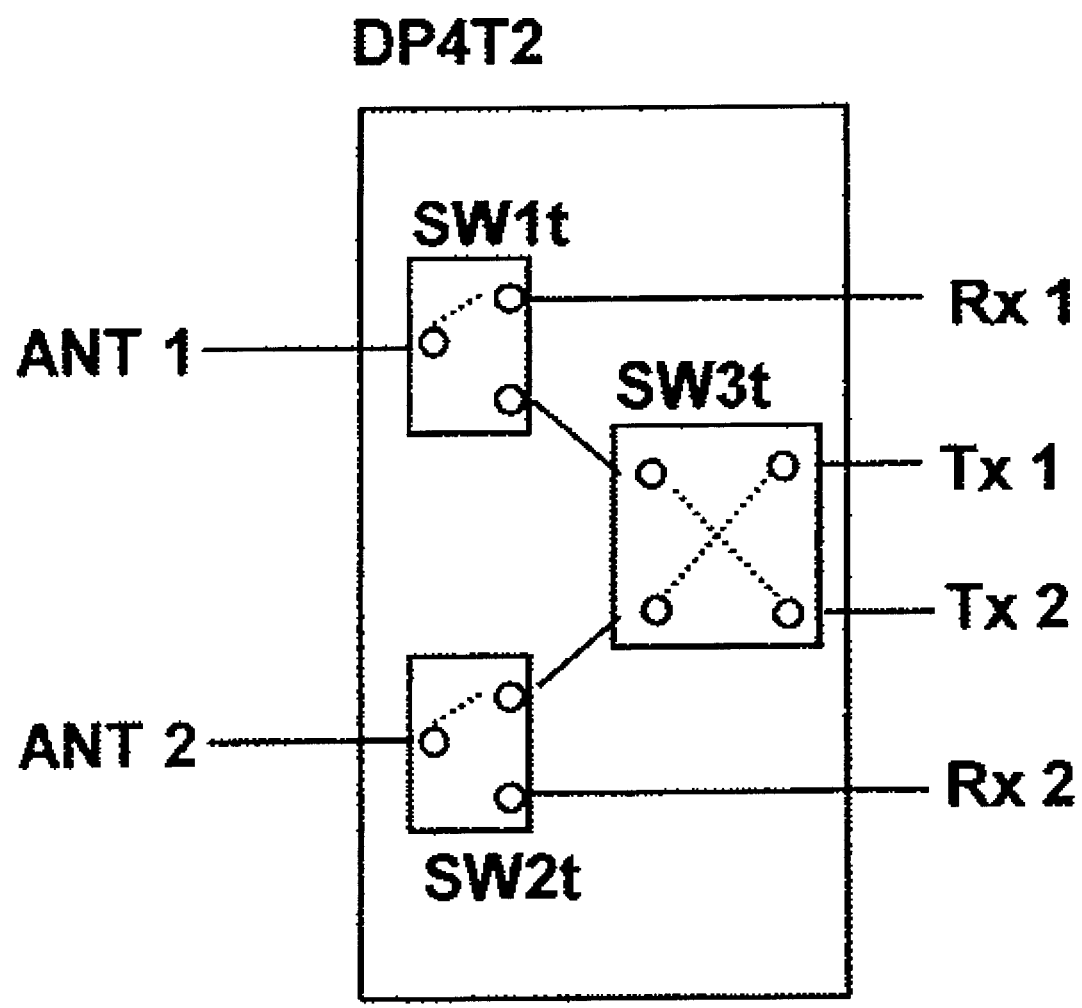
FIG. 23 is a block diagram of another switching circuit used in the high frequency circuit shown in FIG. 20.

FIG. 23 is another circuit configuration of a double-pole quadruple-throw switching circuit DP4T used in the high frequency circuit in FIG. 20. In the double-pole quadruple-throw switch circuit DP4T2, a first antenna terminal is connected with a single pole terminal of a single-pole double-throw switch SW1t, and one of double-throw terminals of the single-pole double-throw switch SW1t is connected with the first receiving terminal Rx1. A second antenna terminal is connected with a single pole terminal of a single-pole double-throw switch SW2t, and one of double-throw terminals of the single-pole double-throw switch SW2t is connected with the second receiving terminal Rx2. Also, one of double pole terminals of a double-pole double-throw switch SW3t is connected with the other of the double-throw terminals in each of the two single-pole double-throw switches SW1t and SW2t.

By switching of the switches SW1t, SW2t, and SW3t, the first and the second receiving terminals can be simultaneously connected to the first and the second antenna terminals ANT1 and ANT2. The transmitting terminals Tx1 and Tx2 are connectable to either of the first and the second antenna terminals ANT1 and ANT2.

Figure 24:
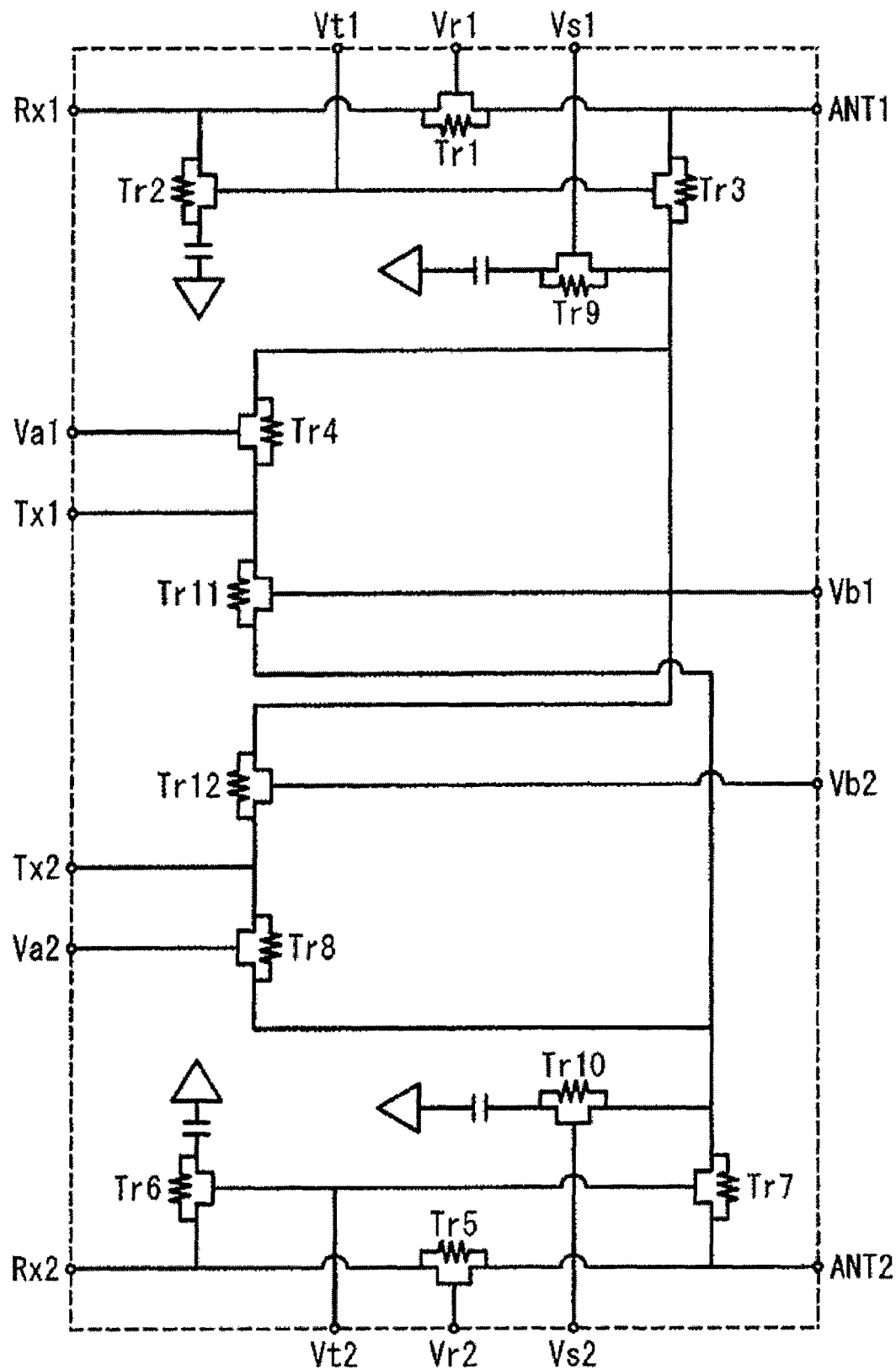
FIG. 24 is an example of the switching circuit shown in FIG. 23.

FIG. 24 is a diagram illustrating a form of an equivalent circuit of a switching circuit that can be used in the high frequency circuit shown in FIG. 23.

First to 12th FET elements are used in the switching circuit.

One of a drain electrode and a source electrode of the first FET element Tr1 is connected with a first antenna terminal ANT1, and the other is connected with a first receiving terminal Rx1. Also, a gate electrode of the first FET element Tr1 is connected with a power supply line of a control terminal Vr1.

The third FET element Tr3 and the fourth FET element Tr4 are disposed on a signal path from the first antenna terminal ANT1 to the first transmitting terminal Tx1. One of a drain electrode and a source electrode of the third FET element Tr3 is connected with the first antenna terminal ANT1, and the other is connected with the fourth FET element Tr4. One of a drain electrode and a source electrode of the fourth FET element Tr4 is connected with the third FET element Tr3, and the other is connected with the first transmitting terminal Tx1. The gate electrode of the third FET element Tr3 is connected with the power supply line of the control terminal Vt1, and the gate electrode of the fourth FET element Tr4 is connected with the power supply line of the control terminal Va1.

One of a drain electrode and a source electrode of the 11th FET element Tr11 is connected with the first transmitting terminal Tx1, and the other is connected with a node between the seventh and eighth FET elements Tr8 described later. Also, the gate electrode of the 11th FET element Tr11 is connected with a power supply line of a control terminal Vb1.

One of a drain electrode and a source electrode of the ninth FET element Tr9 is connected with a node between the third FET element Tr3 and the fourth FET element Tr4, and the other is grounded. A capacitor may be disposed between the ninth FET element Tr9 and ground. Also, the gate electrode of the ninth FET element Tr9 is connected to the power supply line of the control terminal Vs1.

One of a drain electrode and a source electrode of the fifth FET element Tr5 is connected with the second antenna terminal ANT2, and the other is connected with the second receiving terminal Rx2. Also, the gate electrode of the fifth FET element Tr5 is connected with the power supply line of the control terminal Vr2.

The seventh FET element Tr7 and the eighth FET element Tr8 are disposed on a signal path from the second antenna terminal ANT2 to a second transmitting terminal Tx2. One of a drain electrode and a source electrode of the seventh FET element Tr7 is connected with second antenna terminal ANT2, and the other is connected with the eighth FET element Tr8. One of a drain electrode and a source electrode of the eighth FET element Tr8 is connected with the seventh FET element Tr7, and the other is connected with the second transmitting terminal Tx2. The gate electrode of the seventh FET element Tr7 is connected with the power supply line of the control terminal Vt2, and the gate electrode of the eighth FET element Tr8 is connected with the power supply line of the control terminal Va2.

One of a drain electrode and a source electrode of the 12th FET element Tr12 is connected with the second transmitting terminal Tx2, and the other is connected with a node between the fourth FET element Tr4 and the node with which the ninth FET element Tr9 is connected. Also, the gate electrode of the 12th FET element Tr12 is connected with a power supply line of a control terminal Vb2.

One of a drain electrode and a source electrode of the tenth FET element Tr10 is connected with a node between the seventh FET and the node with which the 11th FET element Tr11 is connected, and the other is grounded. A capacitor may be disposed between the tenth FET element Tr10 and ground. Also, the gate electrode of the tenth FET element Tr10 is connected with a power supply line of a control terminal Vs2.

Also, one of a drain electrode and a source electrode of the second FET element Tr2 is connected with a node between the first FET element Tr1 and the first receiving terminal Rx1, and the other is grounded. The gate electrode of the second FET element Tr2 may be connected to the power supply line of the control terminal Vt1, the line being shared by the third FET element Tr3. A capacitor may be disposed between the second FET element Tr2 and ground.

Similarly, one of the drain electrode and the source electrode of the sixth FET element Tr6 is connected to a node between the fifth FET element Tr5 and the second receiving terminal Rx2, the other is grounded. The gate electrode of the sixth FET element Tr6 is connected to the power supply line of the control terminal Vt2, the line being shared by the seventh FET element Tr7. A capacitor may be disposed between the sixth FET element Tr6 and ground.

Since the second and the third FET elements Tr2 and Tr3 share a power supply line, and the sixth and the seventh FET elements Tr6 and Tr7 also share a power supply line, the same connected/disconnected state of each set of FET elements can be achieved. Thus, for example, when signals flow on a path from the first or second transmitting terminal Tx1 or Tx2 to the first antenna terminal ANT1, that is, the third FET element Tr3 is in a connected state, since the second FET element Tr2 is in a connected state, a shunt circuit is formed between the first receiving terminal Rx1 and the first FET element Tr1. Thereby, leakage signals that leak via the first FET element Tr1 to the first receiving terminal Rx1 can be restrained, and isolation between the transmission path and the reception path can be improved.

Also, when signals flow on the path from the first or second transmitting terminal Tx1 or Tx2 to the second antenna terminal ANT2, since the sixth FET element Tr6 is switched on, a shunt circuit is formed between the second receiving terminal Rx2 and the fifth FET element Tr5, and thereby signal leakage to the second receiving terminal Rx2 can be restrained, and isolation between the transmission path and the reception path can be improved.

It should be noted that when the first receiving terminal Rx1 is connected with the first antenna terminal ANT1, if the switching to connect the second receiving terminal Rx2 with the second antenna terminal ANT2 is performed, the control terminals Vr1 and Vr2 may be common.

It should be noted that even a configuration without the third and seventh FET elements Tr3 and Tr7 may be adopted for the switching circuit used in the high frequency circuit component of the embodiment, but using the switching circuit including the third FET element Tr3 and the seventh FET element Tr7, the isolation between a transmission path and a reception path can be easily ensured.

Also, even a configuration without shunt circuits partly composed of the ninth and the tenth FET elements Tr9 and Tr10 may be adopted for the switching circuit used in the high frequency circuit component of the embodiment, but using the switching circuit including the ninth FET element Tr9 and the tenth FET element Tr10, the isolation between a transmission path and a reception path can be easily ensured.

Also in the switching circuit in FIG. 24, it is preferable that at least one of the second and sixth FET elements Tr2 and Tr6 be lower than the fourth, eighth, 11th, and 12th FET elements Tr4, Tr8, Tr11, and Tr12 in dielectric withstanding voltage. It is more preferable that both the second and the sixth FET elements Tr2 and Tr6 be lower than the fourth, eighth, 11th, and 12th FET elements Tr4, Tr8, Tr11, and Tr12 in dielectric withstanding voltage.

Also, it is preferable that at least one of the third and seventh FET elements Tr3 and Tr7 be lower than the fourth, eighth, 11th, and 12th FET elements Tr4, Tr8, Tr11, and Tr12 in dielectric withstanding voltage. It is more preferable that both the third and seventh FET elements Tr3 and Tr7 be lower than the fourth, eighth, 11th, and 12th FET elements Tr4, Tr8, Tr11, and Tr12 in dielectric withstanding voltage.

For example, in order to connect each antenna terminal, the transmitting terminal, each receiving terminal with each other, voltage of each control terminal may be controlled as in the following table. A description of each Mode is the same as that in Table 4.

TABLE 4

| Mode | Vt1 | Vt2 | Vs1 | Vs2 | Vr1 | Vr2 | Va1 | Va2 | Vb1 | Vb2 | Vatt | Vb | VbL1 | VbL2 | Vcc1 | Vcc2 | VcL | Vd |
|---|---|---|---|---|---|---|---|---|---|---|---|---|---|---|---|---|---|---|
| Tx1-1 | 3.0 | 3.0 | 0.0 | 3.0 | 0.0 | 0.0 | 3.0 | 0.0 | 0.0 | 0.0 | 0.0 | 3.0 | 0.0 | 0.0 | 3.5 | 3.5 | 3.0 | 0.0 |
| Tx1-2 | 3.0 | 3.0 | 3.0 | 0.0 | 0.0 | 0.0 | 0.0 | 3.0 | 0.0 | 0.0 | 0.0 | 3.0 | 0.0 | 0.0 | 3.5 | 3.5 | 3.0 | 0.0 |
| Tx2-1 | 3.0 | 3.0 | 0.0 | 3.0 | 0.0 | 0.0 | 0.0 | 0.0 | 0.0 | 3.0 | 0.0 | 3.0 | 0.0 | 0.0 | 3.5 | 3.5 | 3.0 | 0.0 |
| Tx2-2 | 3.0 | 3.0 | 3.0 | 0.0 | 0.0 | 0.0 | 0.0 | 3.0 | 0.0 | 0.0 | 0.0 | 3.0 | 0.0 | 0.0 | 3.5 | 3.5 | 3.0 | 0.0 |
| Rx | 0.0 | 0.0 | 3.0 | 3.0 | 3.0 | 3.0 | 0.0 | 0.0 | 0.0 | 0.0 | 0.0 | 0.0 | 3.0 | 3.0 | 3.5 | 3.5 | 3.0 | 0.0 |

REFERENCE SIGNS LIST

SW: switch
DP3T, DP4T: switching circuit
BPF: band-pass filter circuit
LPF: low-pass filter circuit
HPA: high frequency amplifier circuit
LNA: low-noise amplifier circuit
DIP: diplexer circuit
BAL: BALUN (balanced/unbalanced converting circuit)
Rx1: first receiving terminal
Rx2: second receiving terminal
Tx: transmitting terminal
Va, Vb, Vt, Vr, Vs: control terminal
FIL1 to 6: regions in a laminated body in which filter circuits are formed
BAL1 to 3: regions in a laminated body in which balanced/unbalanced converting circuits are formed

The invention claimed is:

1. A high frequency circuit component comprising a high frequency circuit, wherein
the high frequency circuit includes a switching circuit, a first and a second antenna terminal, a transmitting terminal and a first and a second receiving terminal for a first communication system, a first filter circuit disposed on a reception path connecting the switching circuit to the first receiving terminal, and a second filter circuit disposed on a reception path connecting the switching circuit to the second receiving terminal,
the switching circuit allows the transmitting terminal to be selectively connectable to either of the first and second antenna terminals, allows the first receiving terminal to switch connection and disconnection to and from the first antenna terminal, and allows the second receiving terminal to switch connection and disconnection to and from the second antenna terminal,
the high frequency circuit component includes a laminated body of a plurality of layers on which electrode patterns are formed, and
in the laminated body, a plurality of regions are electromagnetically partitioned by a shielding structure, wherein at least a part of electrode patterns of the first filter circuit is formed in a first region of among the plurality of regions and at least a part of the second filter circuit is formed in a second region among the plurality of regions as seen in a lamination direction of the laminated body.

2. The high frequency circuit component according to claim 1, wherein
the switching circuit includes a plurality of transistor circuits including:
a first transistor circuit that switches connection and disconnection between the first antenna terminal and the first receiving terminal;
a fifth transistor circuit that switches connection and disconnection between the second antenna terminal and the second receiving terminal;
a second transistor circuit that switches connection and disconnection between ground and a node between the first receiving terminal and the first transistor circuit; and
a sixth transistor circuit that switches connection and disconnection between ground and a node between the second receiving terminal and the fifth transistor circuit,
when the first antenna terminal is connected with the transmitting terminal, the sixth transistor circuit connects ground to the node between the second receiving terminal and the fifth transistor circuit, and
when the second antenna terminal is connected with the transmitting terminal, the second transistor circuit connects ground to the node between the first receiving terminal and the first transistor circuit.

3. The high frequency circuit component according to claim 2, wherein
the switching circuit is obtained by using each transistor element being disposed on an integrated semiconductor substrate.

4. The high frequency circuit component according to claim 3, wherein
a power supply line connected with each transistor element formed on the semiconductor substrate is drawn around closer to a peripheral side of the semiconductor substrate than at least one of the electrodes connected with the first and second antenna terminals, the electrodes connected with the first and second receiving terminals, and the electrode connected with the transmitting terminal.

5. The high frequency circuit component according to claim 4, wherein on the semiconductor substrate, a power supply line connected with a power supply terminal is formed along at least a side of the substrate.

6. The high frequency circuit component according to claim 3, wherein
the semiconductor substrate is rectangular; electrodes connected with the first and second antenna terminals, electrodes connected with the first and second receiving terminals, and an electrode connected with a transmitting terminal are formed on the semiconductor substrate, and
the electrodes connected with the first and second antenna terminals are disposed at adjacent corners, and the electrodes connected with the first and the second receiving terminals are disposed at the other two corners.

7. The high frequency circuit component according to claim 3, wherein
an electrode connected with the transmitting terminal is disposed at a middle point between the electrodes connected with the first and second receiving terminals, and ground electrodes are formed between the electrode connected with the transmitting terminal and the electrode connected with the first receiving terminal and between the electrode connected with the transmitting terminal and the electrode connected with the second receiving terminal.

8. The high frequency circuit component according to claim 2, wherein
one of a source and a drain of each of the second and the sixth transistor circuits is grounded, the other of the source and the drain is connected with a node on a signal path, and a resistance is connected between the source and the drain.

9. The high frequency circuit component according to claim 1, wherein
the switching circuit includes a plurality of transistor circuits including:
a first transistor circuit that switches connection and disconnection between the first antenna terminal and the first receiving terminal;
a fourth transistor circuit that switches connection and disconnection between the first antenna terminal and the transmitting terminal;
a fifth transistor circuit that switches connection and disconnection between the second antenna terminal and the second receiving terminal;
an eighth transistor circuit that switches connection and disconnection between the second antenna terminal and the transmitting terminal;
a second transistor circuit that switches connection and disconnection between ground and a node between the first receiving terminal and the first transistor circuit; and
a sixth transistor circuit that switches connection and disconnection between ground and a node between the second receiving terminal and the fifth transistor circuit,
when the first antenna terminal is connected with the transmitting terminal, the sixth transistor circuit connects ground to the node between the second receiving terminal and the fifth transistor circuit, and
when the second antenna terminal is connected with the transmitting terminal, the second transistor circuit connects ground to the node between the first receiving terminal and the first transistor circuit.

10. The high frequency circuit component according to claim 9, wherein
the high frequency circuit comprises: a third transistor circuit that switches connection and disconnection between the first antenna terminal and the fourth transistor circuit; and a seventh transistor circuit that switches connection and disconnection between the second antenna terminal and the eighth transistor circuit, wherein the second and third transistor circuits are connected with a same power supply terminal, and wherein the sixth and seventh transistor circuits are connected with a same power supply terminal.

11. The high frequency circuit component according to claim 10, comprising:
a ninth transistor circuit that switches connection and disconnection between ground and a node between the third transistor circuit and the fourth transistor circuit; and a tenth transistor circuit that switches connection and disconnection between ground and a node between the seventh transistor circuit and the eighth transistor circuit, wherein the fourth transistor circuit and the tenth transistor circuit are connected with a same power supply terminal, and the eighth transistor circuit and the ninth transistor circuit are connected with a same power supply terminal.

12. The high frequency circuit component according to claim 10, wherein
at least one of transistor elements used in the third and the seventh transistor circuits is lower in dielectric withstanding voltage than transistor elements used in the fourth and the eighth transistor circuits.

13. The high frequency circuit component according to claim 9, wherein
at least one of transistor elements used in the second and the sixth transistor circuits is lower in dielectric withstanding voltage than transistor elements used in the first, fifth, fourth and eighth transistor circuits.

14. The high frequency circuit component according to claim 1, wherein
the high frequency circuit further includes:
a third filter circuit disposed at a rear stage with respect to the first filter circuit; and
a fourth filter circuit disposed at a rear stage with respect to the second filter circuit, and
in the laminated body, at least a part of an electrode pattern of each of the third and fourth filter circuits is formed, and the electrode patterns of the third and fourth filter circuits are formed in different regions as seen in the lamination direction of the laminated body.

15. The high frequency circuit component according to claim 14, wherein
the electrode patterns of the first and third filter circuits are separated from the electrode patterns of the second and fourth filter circuits.

16. The high frequency circuit component according to claim 14, wherein
the regions in which the electrode patterns of the first to fourth filter circuits are formed are sandwiched in the lamination direction between first and second ground electrodes formed on different layers in the laminated body.

17. The high frequency circuit component according claim 1, wherein
the switching circuit includes:
a first switch that allows the first antenna terminal to be selectively connectable to either of the transmitting terminal and the first receiving terminal;
a second switch that allows the second antenna terminal to be selectively connectable to either of the transmitting terminal and the second receiving terminal; and a third switch that allows the transmitting terminal to be selectively connectable to either of the first and the second antenna terminals, and the first to the third switches are set at the mounting surface of the laminated body in order of the first switch, the third switch, and the second switch as seen in a predetermined direction with substantially the same distances between terminals for connecting the first switch to the third switch, and the second switch to the third switch.

18. The high frequency circuit component according to claim 17, wherein the first to third switches are single-pole double-throw switches, the first antenna terminal is connected with a single pole terminal of the first single-pole double-throw switch, one of double-throw terminals of the first single-pole double-throw switch is connected with the first receiving terminal for the first communication system, a single pole terminal of the second single-pole double-throw switch is connected with the second antenna terminal, one of double-throw terminals of the second single-pole double-throw switch is connected with the second receiving terminal for the first communication system, a single pole terminal of the third single-pole double-throw switch is connected with the transmitting terminal for the first communication system, and the other of each of the double-throw terminals of the first and second single-pole double-throw switches is connected with double-throw terminals of the third single-pole double-throw switch.

19. The high frequency circuit component according to claim 1, wherein the high frequency circuit component comprises a transmitting terminal for a second communication system, and the transmitting terminals for the first and second communication systems are connected with the switching circuit via a fourth switch.

20. The high frequency circuit component according to claim 19, wherein high frequency amplifier circuits are each disposed between the fourth switch and the transmitting terminal for the first communication system and between the fourth switch and the transmitting terminal for the second communication system, and at least one of the high frequency amplifier circuits and the fourth switch are connected with a same power supply terminal.

21. The high frequency circuit component according to claim 1, wherein the switching circuit includes a plurality of transistor circuits of:

a first transistor circuit that switches connection and disconnection between the first antenna terminal and the first receiving terminal;

a third and a fourth transistor circuit that switch connection and disconnection between the first antenna terminal and the transmitting terminal;

a fifth transistor circuit that switches connection and disconnection between the second antenna terminal and the second receiving terminal;

a seventh and an eighth transistor circuit that switch connection and disconnection between the second antenna terminal and the transmitting terminal;

a ninth transistor circuit that switches connection and disconnection between ground and a node between the third transistor circuit and the fourth transistor circuit; and a tenth transistor circuit that switches connection and disconnection between ground and a node between the seventh transistor circuit and the eighth transistor circuit, the fourth transistor circuit and the tenth transistor circuit are connected with a same power supply terminal, and the eighth transistor circuit and the ninth transistor circuit are connected with a same power supply terminal.

22. The high frequency circuit component according to claim 1, wherein the high frequency circuit component comprises a first and a second receiving terminal for a second communication system and a transmitting terminal for the second communication system, the first receiving terminal for the first communication system and the first receiving terminal for the second communication system are connected with the switching circuit via a fifth switching circuit or a first diplexer circuit, and the second receiving terminal for the first communication system and the second receiving terminal for the second communication system are connected with the switching circuit via a sixth switching circuit or a second diplexer circuit.

23. A communication apparatus that uses the high frequency circuit component according to claim 1.

24. The high frequency circuit component according to claim 1, wherein only the electrode patterns of the first filter circuit are formed in the first region among the plurality of regions.

25. A high frequency circuit component comprising a high frequency circuit, wherein the high frequency circuit includes a switching circuit, a first and a second antenna terminal, a transmitting terminal and a first and a second receiving terminal for a first communication system, a first filter circuit disposed on a reception path connecting the switching circuit to the first receiving terminal, a second filter circuit disposed on a reception path connecting the switching circuit to the second receiving terminal, and a sixth filter circuit disposed on a transmission path connecting the switching circuit to the transmitting terminal, the switching circuit allows the transmitting terminal to be selectively connectable to either of the first and second antenna terminals, allows the first receiving terminal to switch connection and disconnection to and from the first antenna terminal, and allows the second receiving terminal to switch connection and disconnection to and from the second antenna terminal, the high frequency circuit component includes a laminated body of a plurality of layers on which electrode patterns are formed, and in the laminated body, a plurality of regions are electromagnetically partitioned by a shielding structure, wherein at least a part of electrode patterns of the first filter circuit is formed in a first region of among the plurality of regions, at least a part of the second filter circuit is formed in a second region among the plurality of regions, and at least a part of the sixth filter circuit is formed in a sixth region among the plurality of regions as seen in a lamination direction of the laminated body.

26. The high frequency circuit component according to claim 25, wherein the high frequency circuit further includes:
a third filter circuit disposed at a rear stage with respect to the first filter circuit;
a fourth filter circuit disposed at a rear stage with respect to the second filter circuit; and
a fifth filter circuit disposed at a front stage with respect to the sixth filter circuit, and
in the laminated body, at least a part of electrode patterns of the third, fourth, and fifth filter circuits is formed, and the filter circuits are formed in different regions as seen in the lamination direction of the laminated body.

27. The high frequency circuit component according to claim 26, wherein
the electrode patterns of the first and third filter circuits are separated from the electrode patterns of the sixth and fifth filter circuits, and at least a part of the electrode patterns of the sixth and fifth filter circuits is separated from at least a part of the electrode patterns of the second and fourth filter circuits.

28. The high frequency circuit component according to claim 27, wherein
the regions in which the electrode patterns of the first to sixth filter circuits are formed are sandwiched in the lamination direction between first and second ground electrodes formed on different layers in the laminated body.

29. The high frequency circuit component according to claim 28, wherein
a shield composed of a plurality of vias is formed in at least one gap between the regions in which the electrode patterns of the filter circuits are formed.

30. The high frequency circuit component according to claim 26, wherein
the laminated body includes vias for heat dissipation, and at least a part of the electrode patterns of the first and third filter circuits is separated from at least a part of the electrode patterns of the second and fourth filter circuits by the vias for heat dissipation.

31. The high frequency circuit component according to claim 25, wherein
the switching circuit is disposed on the mounting surface so as to overlap at least a part of the electrode pattern of the sixth filter circuit in the laminated body.

32. A communication apparatus that uses the high frequency circuit component according to claim 25.

* * * * *